United States Patent
Morrison

(10) Patent No.: US 12,000,902 B2
(45) Date of Patent: Jun. 4, 2024

(54) MULTISPECTRAL IMPEDANCE DETERMINATION UNDER DYNAMIC LOAD CONDITIONS

(71) Applicant: Dynexus Technology, Inc., Loveland, CO (US)

(72) Inventor: John Morrison, Butte, MT (US)

(73) Assignee: Dynexus Technology, Inc., Loveland, CO (US)

( * ) Notice: Subject to any disclaimer, the term of this patent is extended or adjusted under 35 U.S.C. 154(b) by 4 days.

(21) Appl. No.: 17/608,205

(22) PCT Filed: May 1, 2020

(86) PCT No.: PCT/US2020/031073
§ 371 (c)(1),
(2) Date: Nov. 2, 2021

(87) PCT Pub. No.: WO2020/223651
PCT Pub. Date: Nov. 5, 2020

(65) Prior Publication Data
US 2022/0206076 A1    Jun. 30, 2022

Related U.S. Application Data

(60) Provisional application No. 62/842,141, filed on May 2, 2019.

(51) Int. Cl.
*G01R 31/385*    (2019.01)
*G01R 31/36*    (2020.01)
(Continued)

(52) U.S. Cl.
CPC ....... *G01R 31/389* (2019.01); *G01R 31/3648* (2013.01); *G01R 31/386* (2019.01); *G01R 31/396* (2019.01)

(58) Field of Classification Search
CPC .. G01R 31/389; G01R 31/385; G01R 31/396; G01R 31/3648; G01R 31/386;
(Continued)

(56) References Cited

U.S. PATENT DOCUMENTS

| | | |
|---|---|---|
| 4,498,044 A | 2/1985 | Horn |
| 4,697,134 A | 9/1987 | Burkum et al. |

(Continued)

FOREIGN PATENT DOCUMENTS

| | | |
|---|---|---|
| EP | 2447728 B1 | 6/2013 |
| JP | 2000-009817 A | 1/2000 |

(Continued)

OTHER PUBLICATIONS

U.S. Department of Energy. Battery Calendar Life Estimator Manual: Modeling and Simulation. U.S. Department of Energy Vehicle Technologies Program, Revision 1, Oct. 2012, INL-EXT-08-15136, 84 pages.

(Continued)

*Primary Examiner* — Alexander Satanovsky
*Assistant Examiner* — Trung Q Nguyen
(74) *Attorney, Agent, or Firm* — Craig R. Miles; CR MILES P.C.

(57) ABSTRACT

Impedance testing devices, circuits, systems, and related methods are disclosed. A Device Under Test (DUT) is excited with a multispectral excitation signal for an excitation time period while the DUT is under a load condition from a load operably coupled to the DUT. A response of the DUT is sampled over a sample time period. The sample time period is configured such that it includes an in-band interval during the excitation time period and one or more out-of-band intervals outside of the in-band interval. A response of the DUT to the load condition during the in-band interval is estimated by analyzing samples of the response from the one (Continued)

or more out-of-band intervals. Adjusted samples are computed by subtracting the estimated load response during the in-band interval from the samples from the in-band interval. An impedance of the DUT is estimated by analyzing the adjusted samples.

19 Claims, 34 Drawing Sheets

(51) Int. Cl.
    *G01R 31/389* (2019.01)
    *G01R 31/396* (2019.01)

(58) Field of Classification Search
    CPC ... G01R 31/367; G01R 31/382; H02J 7/0047;
                                     H02J 7/005; H02J 7/0048
    USPC .................................................. 324/425–434
    See application file for complete search history.

(56) References Cited

U.S. PATENT DOCUMENTS

| | | | |
|---|---|---|---|
| 5,061,890 A | 10/1991 | Longini | |
| 5,261,007 A | 11/1993 | Hirsch | |
| 5,281,920 A | 1/1994 | Wurst | |
| 5,349,535 A | 9/1994 | Gupta | |
| 5,406,496 A | 4/1995 | Quinn | |
| 5,457,377 A | 10/1995 | Jonsson | |
| 5,512,832 A | 4/1996 | Russel et al. | |
| 5,747,456 A | 5/1998 | Chorev et al. | |
| 5,773,978 A | 6/1998 | Becker | |
| 5,821,757 A | 10/1998 | Alvarez et al. | |
| 5,946,482 A | 8/1999 | Barford et al. | |
| 5,969,625 A | 10/1999 | Russo | |
| 6,002,238 A | 12/1999 | Champlin | |
| 6,072,299 A | 6/2000 | Kurle et al. | |
| 6,160,382 A | 12/2000 | Yoon et al. | |
| 6,208,147 B1 | 3/2001 | Yoon et al. | |
| 6,222,369 B1 | 4/2001 | Champlin | |
| 6,249,186 B1 | 6/2001 | Ebihara et al. | |
| 6,262,563 B1 | 7/2001 | Champlin | |
| 6,307,378 B1 | 10/2001 | Kozlowski | |
| 6,313,607 B1 | 11/2001 | Champlin | |
| 6,330,933 B1 | 12/2001 | Boeckman et al. | |
| 6,340,889 B1 | 1/2002 | Sakurai | |
| 6,359,419 B1 | 3/2002 | Verbrugge et al. | |
| 6,417,669 B1 | 7/2002 | Champlin | |
| 6,472,847 B2 | 10/2002 | Lundberg | |
| 6,481,289 B2 | 11/2002 | Dixon et al. | |
| 6,519,539 B1 | 2/2003 | Freeman et al. | |
| 6,532,425 B1 | 3/2003 | Boost et al. | |
| 6,542,077 B2 | 4/2003 | Joao | |
| 6,556,001 B1 | 4/2003 | Wiegand et al. | |
| 6,639,385 B2 | 10/2003 | Verbrugge et al. | |
| 6,646,419 B1 | 11/2003 | Uing | |
| 6,653,817 B2 | 11/2003 | Tate, Jr. et al. | |
| 6,691,095 B2 | 2/2004 | Singh et al. | |
| 6,693,439 B1 | 2/2004 | Liu et al. | |
| 6,778,913 B2 | 8/2004 | Tinnemeyer | |
| 6,816,797 B2 | 11/2004 | Freeman et al. | |
| 6,832,171 B2 | 12/2004 | Barsoukov et al. | |
| 6,839,597 B2 | 1/2005 | Hattori et al. | |
| 6,876,174 B1 | 4/2005 | Samittier Marti et al. | |
| 6,922,058 B2 | 6/2005 | Potempa | |
| 7,019,542 B2 | 3/2006 | Tinnemeyer | |
| 7,051,008 B2 | 5/2006 | Singh et al. | |
| 7,065,474 B2 | 6/2006 | Petchenev et al. | |
| 7,072,871 B1 | 7/2006 | Tinnemeyer | |
| 7,113,853 B2 | 9/2006 | Hecklinger | |
| 7,259,572 B2 | 8/2007 | Houldsworth et al. | |
| 7,349,816 B2 | 3/2008 | Quint et al. | |
| 7,395,163 B1 | 7/2008 | Morrison et al. | |
| 7,567,057 B2 | 7/2009 | Elder et al. | |
| 7,598,700 B2 | 10/2009 | Elder et al. | |
| 7,616,003 B2 | 11/2009 | Satoh et al. | |
| 7,675,293 B2 | 3/2010 | Christophersen et al. | |
| 7,688,036 B2 | 3/2010 | Yarger et al. | |
| 7,688,074 B2 | 3/2010 | Cox et al. | |
| 7,698,078 B2 | 4/2010 | Kelty et al. | |
| 7,898,263 B2 | 3/2011 | Ishida et al. | |
| 7,928,735 B2 | 4/2011 | Huang et al. | |
| 8,035,396 B2 | 10/2011 | Kim | |
| 8,150,643 B1 | 4/2012 | Morrison et al. | |
| 8,193,771 B2 | 6/2012 | Coccio | |
| 8,332,342 B1 | 12/2012 | Saha et al. | |
| 8,352,204 B2 | 1/2013 | Morrison et al. | |
| 8,368,357 B2 | 2/2013 | Ghantous et al. | |
| 8,410,783 B2 | 4/2013 | Staton | |
| 8,415,926 B2 | 4/2013 | Bhardwaj et al. | |
| 8,427,112 B2 | 4/2013 | Ghantous et al. | |
| 8,447,544 B2 | 5/2013 | Hsu et al. | |
| 8,467,984 B2 | 6/2013 | Gering | |
| 8,487,628 B2 | 7/2013 | Sciarretta et al. | |
| 8,513,921 B2 | 8/2013 | Berkowitz et al. | |
| 8,521,497 B2 | 8/2013 | Gering | |
| 8,532,945 B2 | 9/2013 | Sciarretta et al. | |
| 8,548,762 B2 | 10/2013 | Prada et al. | |
| 8,582,675 B1 | 11/2013 | Harris | |
| 8,598,849 B2 | 12/2013 | Bhardwaj et al. | |
| 8,638,070 B2 | 1/2014 | Maluf et al. | |
| 8,648,602 B2 | 2/2014 | van Lammeren | |
| 8,680,868 B2 | 3/2014 | van Lammeren et al. | |
| 8,710,847 B2 | 4/2014 | Marvin et al. | |
| 8,725,456 B1 | 5/2014 | Saha et al. | |
| 8,738,310 B2 | 5/2014 | Swanton | |
| 8,738,311 B2 | 5/2014 | Wu | |
| 8,762,109 B2 | 6/2014 | Christophersen et al. | |
| 8,773,145 B2 | 7/2014 | Phlippoteau et al. | |
| 8,791,669 B2 | 7/2014 | Ghantous et al. | |
| 8,831,897 B2 | 9/2014 | McHardy | |
| 8,838,401 B2 | 9/2014 | Kelly | |
| 8,849,598 B2 | 9/2014 | Mingant et al. | |
| 8,868,363 B2 | 10/2014 | Morrison et al. | |
| 8,878,549 B2 | 11/2014 | Nakanishi et al. | |
| 8,889,309 B2 | 11/2014 | Manabe et al. | |
| 8,901,886 B2 | 12/2014 | Berkowitz et al. | |
| 8,907,631 B1 | 12/2014 | Gurries et al. | |
| 8,907,675 B2 | 12/2014 | Phlippoteau et al. | |
| 8,952,823 B2 | 2/2015 | Xie et al. | |
| 8,970,178 B2 | 3/2015 | Berkowitz et al. | |
| 8,975,874 B2 | 3/2015 | Berkowitz et al. | |
| 9,030,173 B2 | 5/2015 | McHardy et al. | |
| 9,035,621 B2 | 5/2015 | Berkowitz et al. | |
| 9,035,623 B1 | 5/2015 | Berkowitz et al. | |
| 9,063,018 B1 | 6/2015 | Ghantous et al. | |
| 9,121,910 B2 | 9/2015 | Maluf et al. | |
| 9,142,994 B2 | 9/2015 | Berkowitz et al. | |
| 9,207,285 B1 | 12/2015 | Swanton et al. | |
| 9,244,130 B2 | 1/2016 | Morrison et al. | |
| 9,252,465 B2 | 2/2016 | Hariharan | |
| 9,312,577 B2 | 4/2016 | Jamison | |
| 9,373,972 B2 | 6/2016 | Ghantous et al. | |
| 9,385,555 B2 | 7/2016 | Ghantous et al. | |
| 9,461,492 B1 | 10/2016 | Berkowitz et al. | |
| 9,465,077 B2 | 10/2016 | Love et al. | |
| 9,519,031 B2 | 12/2016 | Jamison | |
| 9,669,723 B2 | 6/2017 | Sugeno et al. | |
| 9,851,414 B2 | 12/2017 | Morrison et al. | |
| 10,189,354 B2 | 1/2019 | Brochhaus | |
| 10,345,384 B2 | 7/2019 | Christophersen et al. | |
| 10,379,168 B2 | 8/2019 | Christophersen et al. | |
| 2001/0035756 A1 | 11/2001 | Kozlowski | |
| 2002/0065621 A1 | 5/2002 | Jungerman | |
| 2003/0184307 A1 | 10/2003 | Kozlowski et al. | |
| 2003/0206021 A1 | 11/2003 | Laletin et al. | |
| 2004/0095249 A1 | 5/2004 | Zaccaria | |
| 2004/0162683 A1 | 8/2004 | Verbrugge et al. | |
| 2005/0086070 A1 | 4/2005 | Engelman | |
| 2005/0127908 A1 | 6/2005 | Schlicker et al. | |
| 2005/0182584 A1 | 8/2005 | Plusquellic | |
| 2006/0111854 A1 | 5/2006 | Plett | |
| 2006/0111870 A1 | 5/2006 | Plett | |
| 2006/0170397 A1 | 8/2006 | Srinivasan et al. | |

(56) References Cited

U.S. PATENT DOCUMENTS

| | | |
|---|---|---|
| 2006/0186890 A1 | 8/2006 | Iwane et al. |
| 2006/0284617 A1 | 12/2006 | Kozlowski et al. |
| 2006/0284618 A1 | 12/2006 | Cho et al. |
| 2007/0172708 A1 | 7/2007 | Takebe et al. |
| 2007/0182371 A1 | 8/2007 | Boebel |
| 2007/0182576 A1 | 8/2007 | Proska et al. |
| 2007/0257681 A1 | 11/2007 | Christophersen et al. |
| 2008/0303528 A1 | 12/2008 | Kim |
| 2009/0076752 A1 | 3/2009 | Wang et al. |
| 2009/0278037 A1 | 11/2009 | Grothe, Jr. |
| 2010/0010762 A1 | 1/2010 | Seki |
| 2010/0121588 A1 | 5/2010 | Elder et al. |
| 2010/0201320 A1 | 8/2010 | Coe et al. |
| 2010/0207772 A1 | 8/2010 | Yamamoto |
| 2010/0274510 A1 | 10/2010 | Morrison et al. |
| 2010/0332165 A1 | 12/2010 | Morrison et al. |
| 2011/0018543 A1 | 1/2011 | Bos et al. |
| 2011/0077879 A1 | 3/2011 | Paryani |
| 2011/0077880 A1 | 3/2011 | Gering |
| 2011/0082621 A1 | 4/2011 | Berkobin et al. |
| 2011/0169452 A1 | 7/2011 | Cooper et al. |
| 2011/0270559 A1 | 11/2011 | Christophersen et al. |
| 2011/0301931 A1 | 12/2011 | Gering |
| 2012/0019253 A1 | 1/2012 | Ziegler et al. |
| 2012/0032688 A1 | 2/2012 | Christophersen et al. |
| 2012/0038452 A1 | 2/2012 | Phlippoteau et al. |
| 2012/0078552 A1 | 3/2012 | Mingant et al. |
| 2012/0105070 A1 | 5/2012 | van Lammeren et al. |
| 2012/0188086 A1 | 7/2012 | Xie et al. |
| 2012/0217985 A1 | 8/2012 | Amanuma |
| 2012/0262186 A1 | 10/2012 | Morrison et al. |
| 2012/0316815 A1 | 12/2012 | Morigaki |
| 2013/0002267 A1 | 1/2013 | Kothandaraman et al. |
| 2013/0069660 A1 | 3/2013 | Bernard et al. |
| 2013/0135110 A1 | 5/2013 | Xie et al. |
| 2013/0141109 A1 | 6/2013 | Love et al. |
| 2013/0229156 A1 | 9/2013 | Brandon et al. |
| 2013/0245973 A1 | 9/2013 | Ross, Jr. et al. |
| 2013/0267943 A1 | 10/2013 | Hancock |
| 2014/0125284 A1 | 5/2014 | Qahouq |
| 2014/0188414 A1 | 7/2014 | Jeong et al. |
| 2014/0358462 A1 | 12/2014 | Christophersen et al. |
| 2014/0372054 A1 | 12/2014 | Wang et al. |
| 2014/0372055 A1 | 12/2014 | Wang et al. |
| 2015/0002105 A1 | 1/2015 | Kelly |
| 2015/0165921 A1 | 6/2015 | Paryani |
| 2015/0168500 A1 | 6/2015 | Jamison |
| 2015/0197159 A1 | 7/2015 | Lee |
| 2015/0280290 A1 | 10/2015 | Saha et al. |
| 2016/0157014 A1 | 6/2016 | Van Schyndel et al. |
| 2016/0157015 A1 | 6/2016 | Van Schyndel |
| 2016/0274060 A1 | 9/2016 | Denenberg et al. |
| 2017/0254859 A1 | 9/2017 | Christophersen et al. |
| 2018/0143257 A1 | 5/2018 | Garcia et al. |
| 2019/0214937 A1 | 7/2019 | Schmidt |
| 2020/0300920 A1* | 9/2020 | Christophersen ..... H01M 10/48 |

FOREIGN PATENT DOCUMENTS

| | | |
|---|---|---|
| JP | 2003-090869 A | 3/2003 |
| JP | 2003-223918 A | 8/2003 |
| JP | 2007-085772 A | 4/2007 |
| JP | 2011-174925 A | 9/2011 |
| JP | 2012-078287 A | 4/2012 |
| JP | 2013-517755 A | 5/2013 |
| JP | 014-106119 A | 6/2014 |
| JP | 2015-078992 A | 4/2015 |
| WO | 2004/106946 A2 | 12/2004 |
| WO | 2010/144834 A2 | 12/2010 |
| WO | 2010/144857 A2 | 12/2010 |
| WO | 2011/041094 A1 | 4/2011 |
| WO | 2011/140123 A1 | 11/2011 |
| WO | 2011/140131 A1 | 11/2011 |
| WO | WO 2012/025706 A1 | 3/2012 |
| WO | 2013/085996 A1 | 6/2013 |
| WO | 2014/070831 A1 | 5/2014 |
| WO | 2015/029647 A1 | 3/2015 |
| WO | 2016/012922 A1 | 1/2016 |
| WO | WO 2017/003917 A1 | 1/2017 |
| WO | 2020/223630 | 11/2020 |
| WO | 2020/223651 | 11/2020 |

OTHER PUBLICATIONS

Aglzim et al. Characterization of the Resistance of a Fuel Cell on Load by Electrochemical Impedance Spectroscopy. Proceedings from the EUROCON Conference, IEEE 2007, pp. 1489-1492.

Albrecht. Battery Complex Impedance Identification with Random Signal Techniques. MS Thesis, Montana Tech of the University of Montana, May 2005, 99 pages.

Ashtiani. Battery Hazard Modes and Risk Mitigation Analysis. USABC Version 0.0, Aug. 2007, 10 pages.

Bald. Rapid Impedance Measurements for 50-V Battery Modules. Montana Tech MS Thesis, 2012, 115 pages.

U.S. Department of Energy. Battery Test Manual For 12 Volt Start/Stop Vehicles, U.S. Department of Energy Vehicle Technologies Program, INL/EXT-12-26503, Revision 1, May 2015, 67 pages.

U.S. Department of Energy. Battery Test Manual for 48 Volt Mild Hybrid Electric Vehicles, U.S. Department of Energy Vehicle Technologies Program, INL/EXT-15-36567, Revision 0, Mar. 2017, 70 pages.

U.S. Department of Energy. Battery Test Manual for Plug-In Hybrid Electric Vehicles, U.S. Department of Energy Vehicle Technologies Program, INL/EXT-14-32849, Revision 3, Sep. 2014, 83 pages.

Belt et al. Calendar and PHEV cycle life aging of high-energy, lithium-ion cells containing blended spinel and layered-oxide cathodes. Journal of Power Sources, Dec. 2011, 196(23):10213-10221.

Bloom et al. An Investigation of the Impedance Rise and Power Fade in High-Power Li-Ion Cells. 19th International Electric Vehicle Symposium (EVS-19), Oct. 2002, 14 pages.

Chan. Swept Sine Chirps for Measuring Impulse Response. Application Note, Stanford Research Systems Inc., 2010, https://thinksrs.com/downloads/pdfs/applicationnotes/SR1_SweptSine.pdf.

Chen et al. Sinusoidal-Ripple-Current Charging Strategy and Optimal Charging Frequency Study for Li-Ion Batteries. IEEE Transactions on Industrial Electronics, Jan. 2013, 60(1):88-97.

Cho et al. Battery Impedance Analysis Considering DC Component in Sinusoidal Ripple-Current Charging. IEEE Transactions on Industrial Electronics, Mar. 2016, 63(3):1561-1573.

Christophersen et al. Battery Technology Life Verification Testing and Analysis. Idaho National Laboratory INL/CON-07-12282, Dec. 2007, 12 pages.

Christophersen et al. Performance Evaluation of Gen3 Advanced Technology Development Cells. 214th ECS Meeting, Abstract #549, The Electrochemical Society, 2008, 1 page.

Christophersen et al. Pulse resistance effects due to charging or discharging of high-power lithium-ion cells: A path dependence study. Journal of Power Sources, Nov. 2007,173(2):998-1005.

Christophersen et al. Advanced Technology Development Program for Lithium-Ion Batteries: Gen 2 Performance Evaluation Final Report. INL/EXT-05-00913, Jul. 2006, 140 pages.

Christophersen et al. Crosstalk Compensation for a Rapid, Higher-Resolution Impedance Spectrum Measurement. Aerospace Conference, 2012 IEEE, Mar. 2012, 16 pages.

Christophersen et al. Effects of Reference Performance Testing during Aging Using Commercial Lithium-ion Cells. J. Electrochem Soc., May 2006, 153(7):A1406-A1416.

Christophersen et al. Electrochemical Impedance Spectroscopy Testing on the Advanced Technology Development Program Lithium-ion Cells. Sep. 2002, IEEE Trans. Veh. Technol., 56(3):1851-1855.

Christophersen et al. Long-Term Validation of Rapid Impedance Spectrum Measurements as a Battery State-of-Health Assessment Technique. SAE Int. J. Alt. Power, May 2013, 6(1):146-155.

Christophersen et al. Lumped Parameter Modeling as a Predictive Tool for a Battery Status Monitor. Oct. 2003, Proceedings from IEEE Vehicular Technology Conference, 6 pages.

(56) References Cited

OTHER PUBLICATIONS

Christophersen et al. Rapid Impedance Spectrum Measurements for State-of-Health Assessment of Energy Storage Devices. SAE Int. J. Passeng. Cars—Electron. Electr. Syst., Apr. 2012, 5(1), 11 pages.
Christophersen et al. Impedance Noise Identification for State-of-Health Prognostics. 43rd Power Sources Conference, Jul. 2008, 4 pages.
Christopherson. Battery Test Manual for Electric Vehicles. Idaho National Laboratory, U.S. Department of Energy Vehicle Technologies Program, INL/ EXT-15-34184, Revision 3, Jun. 2015, 67 pages.
Delaille et al. Study of the 'coup de fouet' of lead-acid cells as a function of their state-of-charge and state-of-health. Journal of Power Sources, Aug. 2006,158(2):1019-1028.
Din et al. A Scalable Active Battery Management System With Embedded Real-Time Electrochemical Impedance Spectroscopy. IEEE Transactions on Power Electronics, Jul. 2017, 32(7):5688-5698.
Din et al. Online Spectroscopic Diagnostics Implemented in an Efficient Battery Management System. 16th Workshop on Control and Modeling for Power Electronics, 2015, 7 pages.
Doan et al. Intelligent Charger with Online Battery Diagnosis Function. 9th International Conference on Power Electronics-ECCE Asia, Jun. 2015, pp. 1644-1649.
Doughty et al. FreedomCAR Electrical Energy Storage System Abuse Test Manual for Electric and Hybrid Electric Vehicle Applications. SAND2005-3123, Aug. 2006, 46 pages.
Egloff et al. A Critical Analysis of an Instrumentation Current Sources. 59th International Instrumentation Symposium, May 2013, 12 pages.
Fasmin et al. Review—Nonlinear Electrochemical Impedance Spectroscopy. Journal of the Electrochemical Society, May 2017, 164(7):H443-H455.
Fenton et al. BSM Development Documentation Senior Project Final Report for the Idaho National Laboratory. May 2005, Montana Tech of the University of Montana, 21 pages.
Ford, Jr. Validation of Push Pull Current. Proceedings of the Annual Montana Tech Electrical and General Engineering Symposium, Jan. 2016, 25 pages.
Garcia et al. On-line State-of-Health and Remaining-Useful-Life Assessment of Batteries using Rapid Impedance Spectrum Measurements. 45th Power Sources Conference Proceedings, Jun. 2012, 7.3, pp. 115-118.
Haskins et al. Battery Technology Life Verification Test Manual. Idaho National Laboratory, Feb. 2005, INEEL/EXT-04-01986, 133 pages.
Hirschorn et al. On Selection of the Perturbation Amplitude Required to Avoid Nonlinear Effects in Impedance Measurements. Israel Journal of Chemistry, 2008, vol. 48, pp. 133-142.
Hoffmann et al. Development and Test of a Real Time Battery Impedance Estimation System. IEEE Aerospace 2006 Conference, Mar. 2006, IEEE 0-7803-9546-8/06, 8 pages.
Huet. A review of impedance measurements for determination of the state-of-charge or state-of-health of secondary batteries. Journal of Power Sources, Jan. 1998, 70(1):59-69.
Adany et al. Switching algorithms for extending battery life in Electric Vehicles. Journal of Power Sources, Jun. 2013, 231:50-59.
Ahmed et al. Enabling fast charging—A battery technology gap assessment. Journal of Power Sources, Nov. 2017, 367:250-262.
Baert et al. Determination of the State-of-Health of VRLA Batteries by Means of Noise Measurements. Intelec 2001, Nov. 2001, Conference Publication No. 484, pp. 301-306.
Bald et al. Hardware Architecture for Rapid Impedance Measurements of 50V Battery Modules. San Diego: The International Society of Automation, 58th International Instrumentation Symposium, INL/CON-12-24516, Jun. 2012, 18 pages.
Banaei et al. Online Detection of terminal voltage in Li-ion Batteries via Battery Impulse Response. IEEE, Oct. 2009, pp. 194-198.

Barsukov et al. Challenges and Solutions in Battery Fuel Gauging. Power Management Workbook, 2004, 10 pages, Texas Instruments Inc.
Beelen et al. A comparison and accuracy analysis of impedance-based temperature estimation methods for Li-ion batteries. Applied Energy, Aug. 2016, 175:128-140.
Berecibar et al. Critical review of state of health estimation methods of Li-ion batteries for real applications. Renewable and Sustainable Energy Reviews, Apr. 2016, 56:572-587.
Blanke et al. Impedance measurements on lead-acid batteries for state-of-charge, state-of-health and cranking capability prognosis in electric and hybrid electric vehicles. Journal of Power Sources, Jun. 2005, 144:418-425.
Blidberg. Correlation between different impedance measurement methods for battery cells. KTH Chemical Science and Engineering, 2012, 42 pages, Stockholm, Sweden.
Bohlen et al. Impedance Based Battery Diagnosis for Automotive Applications. 35th Annual IEEE Power Electronics Specialists Conference, Apr. 2004, 4:2192-2797.
Bose et al. Battery state of health estimation through coup de fouet: field experience. INTELEC, Twenty-Second International Telecommunications Energy Conference (Cat. No.00CH37131), 2000, pp. 597-601.
Bose et al. Lessons Learned in Using OHMIC Techniques for Battery Monitoring. IEEE, 2001, pp. 99-104
Brauer et al. Residential Energy Storage from Repurposed Electric Vehicle Batteries: Market Overview and Development of a Service-Centered Business Model. IEEE 18th Conference on Business Informatics, Aug. 2016, pp. 143-152.
Breugelmans et al. Odd random phase multisine electrochemical impedance spectroscopy to quantify a non-stationary behaviour: Theory and validation by calculating an instantaneous impedance value. Electrochimica Acta, Aug. 2012, 76:375-382.
Burnham et al. Enabling fast charging—Infrastructure and economic considerations. Journal of Power Sources, Nov. 2017, 367:237-249.
Cabrera-Castillo et al. Calculation of the state of safety (SOS) for lithium ion batteries. Journal of Power Sources, Aug. 2016, 324:509-520.
Carkhuff et al. Impedance-Based Battery Management System for Safety Monitoring of Lithium-Ion Batteries. IEEE Transactions on Industrial Electronics, Aug. 2018, 65(8):6497-6504.
Chan. Swept Sine Chirps for Measuring Impulse Response. Stanford Research Systems Inc., https://thinksrs.com/downloads/pdfs/applicationnotes/SR1_SweptSine.pdf, 2010, 6 pages.
Cheng et al. Battery-Management System (BMS) and SOC Development for Electrical Vehicles. IEEE Transactions on Vehicular Technology, Jan. 2011, 60(1):76-88.
Christensen et al. Using on-board Electrochemical Impedance Spectroscopy in Battery Management Systems. World Electric Vehicle Journal, Nov. 2013, 6:0793-0799.
Cordioli et al. Development of a Methodology Based on Odd Random Phase Electrochemical Impedance Spectroscopy to Evaluate Corrosion Protection of Coatings. Proceedings of the 4th International Conference on Self-Healing Materials, Jun. 2013, pp. 152-155.
Cox et al. Battery State of Health Monitoring, Combining Conductance Technology with other Measurement Parameters for Real-Time Battery Performance Analysis. INTELEC, International Telecommunications Energy Conference (Proceedings), Feb. 2000, 19-2, pp. 342-347.
Crow et al. Integrated Prognostic Health Monitoring of Battery Health in Ground Robots. Penn State Applied Research Laboratory, 32nd Association for Unmanned Vehicle Systems International Meeting, Jun. 2005, 16 pages.
Damlund. Analysis and Interpretation of AC-measurements on Batteries used to assess State-of-Health and Capacity-condition. IEEE, 1995, pp. 828-833.
Diard et al. Constant load vs constant current EIS study of electrochemical battery discharge. Electrochimica Acta, 1997, 42(23-24):3417-3420.
Diard et al. EIS study of electrochemical battery discharge on constant load. Journal of Power Sources, Jan. 1998, 70(1):78-84.

(56) References Cited

OTHER PUBLICATIONS

Diard et al. Impedance measurements of polymer electrolyte membrane fuel cells running on constant load. Journal of Power Sources, Aug. 1998, 74(2):244-245.
Dung et al. ILP-Based Algorithm for Lithium-Ion Battery Charging Profile. IEEE, 2010, pp. 2286-2291.
Farmann et al. Critical review of on-board capacity estimation techniques for lithium-ion batteries in electric and hybrid electric vehicles. Journal of Power Sources, May 2015, 281:114-130.
Goebel et al. Prognostics in Battery Health Management. IEEE Instrumentation & Measurement Magazine, Sep. 2008, 11(4):33-40.
Gopalakrishnan et al. Electrochemical impedance spectroscopy characterization and parameterization of lithium nickel manganese cobalt oxide pouch cells: dependency analysis of temperature and state of charge. Ionics 25(1), Jan. 2019 (published online Jun. 2018, Springer, Germany), 14 pages.
Gould et al. New Battery Model and State-of-Health Determination Through Subspace Parameter Estimation and State-Observer Techniques. IEEE Transactions on Vehicular Technology, Oct. 2009, 58(8):3905-3916.
Guha et al. Remaining Useful Life Estimation of Lithium-Ion Batteries based on the Internal Resistance Growth Model. Indian Control Conference (ICC), Jan. 2017, pp. 33-38.
Hariprakash et al. Monitoring sealed automotive lead-acid batteries by sparse-impedance spectroscopy. Proc. Indian Acad. Sci. (Chem. Sci.), Oct. 2003, 115(5):465-472.
Hariprakash et al. On-line monitoring of lead-acid batteries by galvanostatic non-destructive technique. Journal of Power Sources, Oct. 2004, 137(1):128-133.
Harting et al. State-of-Health Diagnosis of Lithium-Ion Batteries Using Nonlinear Frequency Response Analysis. Journal of the Electrochemical Society, Jan. 2019, 166(2):A277-A285.
Hill et al. Steady State Frequency Response Utilizing an Enhanced Chirp Test Signal. 2019 IEEE Aerospace Conference, Mar. 2019, pp. 1-8.
Hlavac et al. VRLA Battery Monitoring Using Conductance Technology. IEEE, 12-3 (1995) pp. 284-291.
Howey et al. On-line measurement of battery impedance using motor controller excitation. IEEE Transactions on Vehicular Technology, Jul. 2014, 63(6):2557-2566.
Huang et al. An Online Battery Impedance Measurement Method Using DC-DC Power Converter Control. IEEE Transactions on Industrial Electronics, Nov. 2014, 61(11):5987-5995.
Karden et al. A method for measurement of interpretation of impedance spectra for industrial batteries. Journal of Power Sources, Jan. 2000, 85(1):72-78.
Kolmel et al. Quality-oriented production planning of battery assembly systems for electric mobility. Procedia CIRP 23, Dec. 2014, pp. 149-154.
Kozlowski A Novel Online Measurement Technique for AC Impedance of Batteries and Other Electrochemical Systems. The Sixteenth Annual Battery Conference on Applications and Advances (Proceedings), Jan. 2001, pp. 257-262.
Kozlowski. Electrochemical Cell Prognostics using Online Impedance Measurements and Model-Based Data Fusion Techniques. Aerospace Conference, 2003 Proceedings, vol. 7-3257, Mar. 2003, 14 pages.
Lamb et al. Determination of Battery Stability With Advanced Diagnostics. SAND2017-6959, Unlimited Release, Jul. 2017, 56 pages.
Lamb et al. Determination of Battery Stability With Advanced Diagnostics. (Report No. DOT HS 812 249), Washington, DC: National Highway Traffic Safety Administration, Mar. 2016, 42 pages.
Le et al. Lithium-ion Battery State of Health Estimation Using Ah-V Characterization. Annual Conference of the Prognostics and Health Management Society, 2011, 3(1), 7 pages.
Li et al. Understanding the molecular mechanism of pulse current charging for stable lithium-metal batteries. Science Advances, Jul. 2017, 3(7), 10 pages.
Love et al. State-of-Health Monitoring of 18650 4S Packs With a Single-Point Impedance Diagnostic. Journal of Power Sources, Oct. 2014, 266:512-519.
Lu et al. A review on the key issues for lithium-ion battery management in electric vehicles. Journal of Power Sources, Mar. 2013, 226:272-288.
Mingant et al. Towards onboard Li-ion battery state-of-health diagnosis by a virtual sensor. World Electric Vehicle Journal, May 2012, 5(2):405-411.
Novak. Developing an advanced, predictive battery health monitoring solution with a low-cost microcontroller solution. Texas Instruments, White Paper, Sep. 2012, 6 pages.
Noworolski et al. Reducing and Utilizing Electrical Noises for Battery Monitoring Purposes. IEEE 32-4 (Sep. 2004), pp. 511-614.
Okoshi et al. Battery condition monitoring (BCM) technologies about lead-acid batteries. Journal of Power Sources, Aug. 2006, 158(2):874-878.
Pastor-Fernandez et al. A Comparison between EIS and IC-DV as Li-ion Diagnostic Techniques to Identify and Quantify the Effects of Degradation Modes within BMS. Journal of Power Sources, Aug. 2017, 360:301-318.
Pastor-Fernandez et al. A Study of Cell-to-Cell Interactions and Degradation in Parallel Strings: Implications for the Battery Management System. Journal of Power Sources, Oct. 2016, 329:574-585.
Perez e t al. Guidelines for the characterization of the internal impedance of lithium-ion batteries in PHM algorithms. International Journal of Prognostics and Health Management, Apr. 2018, ISSN 2153-2648, 11 pages.
Piret et al. Tracking of electrochemical impedance of batteries. Journal of Power Sources, Apr. 2016, 312:60-69.
Pop et al. State-of-the-art of battery state-of-charge determination. Measurement Science and Technology, Dec. 2005, 16(4) R93-R110.
Qnovo. Fundamentals of Qnovo Adaptive Charging in Lithium Ion Batteries. http://qnovo.com/wp-content/uploads/2015/12/Onovo_TechWhitePaper_v2.4.pdf, Dec. 2015, 13 pages.
Rahmoun et al. Determination of the Impedance of Lithium-Ion Batteries using Methods of Digital Signal Processing. Energy Procedia, Dec. 2014, 46:204-213.
Raijmakers et al. Crosstalk Interferences on Impedance Measurements in Battery Packs. IFAC-PapersOnline, Jun. 2016, 49(11):042-047.
Saha et al. Comparison of Prognostic Algorithms for Estimating Remaining Useful Life of Batteries. Transactions of the Institute of Measurement and Control, Jun. 2009, 31(3), 10 pages.
Saha et al. Prognostics Methods for Battery Health Monitoring Using a Bayesian Framework. IEEE Transactions on Instrumentation and Measurement, Feb. 2009, 58(2):291-296.
Salehen et al. Development of battery management systems (BMS) for electric vehicles (EVs) in Malaysia. MATEC Web of Conferences, Jan. 2017, 90(11):01001, 8 pages.
Sazhin et al. Enhancing Li-Ion Battery Safety by Early Detection of Nascent Internal Shorts. Journal of the Electrochemical Society, Jan. 2017, 164(1):A6281-A6287.
Schweiger et al. Comparison of Several Methods for Determining the Internal Resistance of Lithium Ion Cells. Sensors, Jun. 2010, 10(6):5604-5625.
Singh et al. Fuzzy logic modeling of EIS measurements on lithium-ion batteries. Electrochimica Acta, Jan. 2006, 51(8):1673-1679.
Socher et al. Improving the functional safety of automotive batteries using in-situ impedance spectroscopy. Transportation Research Procedia, Dec. 2016, 14:3661-3666.
Srivastav et al. State-of-charge indication in Li-ion batteries by simulated impedance spectroscopy. J Appl Electrochem, Feb. 2017, 47(2):229-236.
Sternad et al. Condition monitoring of Lithium-Ion Batteries for electric and hybrid electric vehicles. Elektrotechnik & Informationstechnik, May 2009, 126(5):186-193.
Stroe et al. Diagnosis of Lithium-Ion Batteries State-of-Health based on Electrochemical Impedance Spectroscopy Technique. Proceedings of the 2014 Energy Conversion Congress and Exposition (ECCE) IEEE Press, Sep. 2014, pp. 1576-4582.

(56) References Cited

OTHER PUBLICATIONS

Jespersen et al. Capacity Measurements of Li-Ion Batteries using AC Impedance Spectroscopy. EVS24 International Battery, Hybrid and Fuel Cell Electric Vehicle Symposium, May 2009, in: 2009 World Electric Vehicle Journal, 3(1):0127-0133.
Jiang et al. Electrochemical impedance spectra for lithium-ion battery ageing considering the rate of discharge ability. Energy Procedia, May 2017, 105:844-849.
Kiel et al. Extensive Validation of a Nonintrusive Continuous Battery Monitoring Device. Battcon 2008, in: Proc. BattCon Conference May 2008, pp. 18-1-18-10.
Mingant et al. Novel state-of-health diagnostic method for Li-ion battery in service. Applied Energy, Elsevier, Dec. 2016, 183:390-398.
Perez et al. Guidelines for the Characterization of the Internal Impedance of Lithium-Ion Batteries in PHM Algorithms. International Journal of Prognostics and Health Management, Apr. 2018, 9, 11 pages.
Remy et al. Qualification and Life Testing of Li-ion VES16 Batteries. E3S Web of Conferences 16, Jan. 2017, 8 pages.
Seo et al. Detection of internal short circuit in Li-ion battery by estimating its resistance. Proceedings of the 4th IIAE International Conference on Intelligent Systems and Image Processing, Jan. 2016, 6 pages.
Taberna et al. Electrochemical Characteristics and Impedance Spectroscopy Studies of Carbon-Carbon Supercapacitors. Journal of the Electrochemical Society, Jan. 2003, 150(3):A292-A300.
Tachibana et al. Development of in situ a.c. impedance measurement system under constant-current conditions and its application to galvanostatic discharge of electrolytic manganese dioxide in alkaline solution. Journal of Power Sources, Jul. 1998, 74(1):29-33.
Tang et al. Temperature Dependent Performance and in Situ AC Impedance of High-Temperature PEM Fuel Cells Using the Nafion-112 Membrane. Journal of the Electrochemical Society, Sep. 2006, 153(11):A2036- A2043.
Varnosfaderani et al. A Comparison of Online Electrochemical Spectroscopy Impedance Estimation of Batteries. IEEE Access, Feb. 2018, vol. 6, pp. 23668-23677.
Verizon. Verizon NEBSTM Compliance: Qualification Requirements for Lithium Ion (Li-ion) Cells Batteries and Battery Strings. Verizon Technical Purchasing Requirements VZ.TPR.9810, Sep. 2015, Issue 1, 29 pages.
Waligo et al. A Comparison of the Different Broadband Impedance Measurement Techniques for Lithium-Ion Batteries. Energy Conversion congress and Exposition (ECCE), IEEE (Sep. 2016), 7 pages.
Waters. Monitoring the state of health of VRLA batteries through ohmic measurements. Proceedings of Power and Energy Systems in Converging Markets, Oct. 1997, 6 pages.
Weng et al. On-board state of health monitoring of lithium-ion batteries using incremental capacity analysis with support vector regression. Journal of Power Sources, Aug. 2013, 235:36-44.
Wu et al. A Review on Fault Mechanisms and Diagnosis Approach for Li-Ion Batteries. Journal of Nanomaterials, Oct. 2015, vol. 2015, Article ID 631263, 10 pages.
Xing et al. Battery Management Systems in Electric and Hybrid Vehicles. Energies, Oct. 2011, 4(11):1840-1857.
Xing et al. Prognostics and Health Monitoring for Lithium-ion Battery. Proceedings of the IEEE International Conference on Intelligence and Security Informatics, Jul. 2011, pp. 242-247.
Yamada et al. The intelligent automotive battery, 'CYBOX'. Journal of Power Sources, Dec. 2008, 185(2):1478-1483.
Yoo et al. An Electrochemical Impedance Measurement Technique Employing Fourier Transform. Analytical Chemistry, May 2000, 72(9):2035-2041.
Zechang et al. Battery Management Systems in the China-made 'Start' series FCHVs. IEEE Vehicle Power and Propulsion Conference (VPPC) (Sep. 2008) 6 pages.
Zenati et al. Estimation of the SOC and the SOH of li-ion batteries, by combining impedance measurements with the fuzzy logic inference. Proceedings of the 36th Annual Conference of IEEE Industrial Electronics, Nov. 2010, pp. 1767-1772.
Zhai et al. The Application of the EIS in Li-ion Batteries Measurement. Journal of Physics: Conference Series, Oct. 2006, 48(1):1157-1161.
Zhang et al. Cycling degradation of an automotive LiFePO4 lithium-ion battery. Journal of Power Sources, Feb. 2011, 196(3):1513-1520.
Zhang et al. Prediction of Lithium-Ion Battery's Remaining Useful Life Based on Relevance Vector Machine. SAE Int. J. All. Power, May 2016, 5(1):30-40.
Zhang et al. Remote Vehicle State of Health Monitoring and Its Application to Vehicle No-Start Prediction, 2009 IEEE Autotestcon, Oct. 2009, pp. 88-93.
Zhu et al. PSpice Simulation via AC Impedance for PEFC at Operational Loads. http://folk.ntnu.no/skoge/prosl/proceedings/aiche-2005/topical/pdffiles/T1/papers/215e.pdf, 2005, 3 pages.
Zhu et al. In-Situ Electrical Characterization of PEM Fuel Cells at Load. American Institute of Chemical Engineers, 2007, 5 pages.
Zhu et al. In-Stu Assessment of PEM Fuel Cells via AC Impedance at Operational Loads. http://folk.ntnu.no/skoge/prost/proceedings/aiche-2004/pdffiles/papers/014g.pdf. 2004, 5 pages.
Zou et al. Combined State of Charge and State of Health estimation over lithium-ion battery cell cycle lifespan for electric vehicles. Journal of Power Sources, Jan. 2015, 273:793-803.
Morrison et al. An Advanced Calibration Procedure for Complex Impedance Spectrum Measurements of Advanced Energy Storage. 58th International Instrumentation Symposium, Jun. 2012, INL/CON-12-24519, 17 pages.
Morrison et al. Fast Summation Transformation for Battery Impedance Identification. IEEE Aerospace Conference, Mar. 2009, 9 pages.
Morrison et al. Real Time Estimation of Battery Impedance. IEEE Aerospace Conference, Mar. 2006, 13 pages.
Morrison. DC Buffering and Floating Current for a High Voltage IMB Application. INL/EXT-14-32858, Aug. 2014, 8 pages.
Morrison. Development and Implementation of a Calibration Procedure for Complex Impedance Spectrum Measurements with Applications to Embedded Battery Health Monitoring and Management Systems. University of Connecticut Master's Thesis, 2012, 119 pages.
Morrison. Signals and Systems: State Variable Description of Linear Time Invariant Systems. Montana Tech Digital Commons, Sep. 2013, Chapter 17, pp. 198-216.
Morrison. Signals and Systems: Synchronous Detection. Montana Tech Digital Commons, Sep. 2013, Chapter 20, pp. 243-246.
Motloch et al. High-Power Battery Testing Procedures and Analytical Methodologies for HEV's. 7, SAE Int. Passenger Cars Electron. Electr. Syst., vol. 111 (2002), pp. 797-802.
Nikolopoulos et al. Accurate Method of Representation of High-Voltage Measuring Systems and its Application in High-Impulse-Voltage Measurements. IEEE, Mar. 1989, 136(2):66-72.
Piller et al. Methods for state-of-charge determination and their applications. Journal of Power Sources, Jun. 2001, 96(1):113-120.
Qahouq et al. Single-Perturbation-Cycle Online Battery Impedance Spectrum Measurement Method With Closed-Loop Control of Power Converter. IEEE Transactions on Industrial Electronics, Sep. 2017, 64(9):7019-7029.
Qahouq. Online Battery Impedance Spectrum Measurement Method. IEEE Applied Power Electronics Conference and Exposition, Mar. 2016, pp. 3611-3615.
Ramos et al. Comparison of impedance measurements in a DSP using ellipse-fit and seven-parameter sine-fit algorithms. Measurement, May 2009, 42(9):1370-1379.
Ran et al. Prediction of State of Charge of Lithium-ion Rechargeable Battery with Electrochemical Impedance Spectroscopy Theory. 5th IEEE Conference on Industrial Electronics and Applications, Jul. 2010, pp. 684-688.
Ranade et al. An overview of harmonics modeling and simulation, Tutorial on Harmonics Modeling and Simulation. IEEE Power Engineering Society, 1998, Chapter 1, 7 pages.
Ranieri et al. Electronic Module for the Thermal Monitoring of a Li-ion Battery Cell through the Electrochemical Impedance Esti-

(56) References Cited

OTHER PUBLICATIONS mation. 22nd International Workshop on Thermal Investigations of ICs and Systems, Sep. 2016, pp. 294-297.
Smith et al. Model Validation Approaches for Nonlinear Feedback Systems Using Frequency Response Measurements. IEEE Proceedings of the 38th IEEE Conference on Decision and Control, Dec. 1999, vol. 2, pp. 1500-1504.
Smyth. Development of a Real Time Battery Impedance Measuring System. M.S. Thesis, Montana Tech of the University of Montana, 2008, 128 pages.
Thomas et al. Statistical methodology for predicting the life of lithium-ion cells via accelerated degradation testing. Journal of Power Sources, Sep. 2008, 184(1):312-317.
Unkelhaeuser et al. Electrochemical Storage System Abuse Test Procedure Manual. United States Advanced Battery Consortium, SAND99-0497, Jul. 1999, 33 pages.
Varnosfaderani et al. Online Impedance Spectroscopy Estimation of a dc-dc converter connected Battery using an Earth Leakage Monitoring Circuit. 19th European Conference on Power Electronics and Applications, Sep. 2017, pp. P.1-P.10.
Verbrugge et al. Adaptive state of charge algorithm for nickel metal hydride batteries including hysteresis phenomena. Journal of Power Sources, Feb. 2004, 126(1-2):236-249.
Verbrugge. Adaptive, multi-parameter battery state estimator with optimized time-weighting factors. J Appl Electrochem, May 2007, 37(5):605-616.
Wang et al. State Estimation of Lithium ion Battery Based on Electrochemical Impedance Spectroscopy with On-board Impedance Measurement System. IEEE Vehicle Power and Propulsion Conference, Oct. 2015, 5 pages.
Zhu et al. PSpice Simulation via AC Impedance for PEFC at Operational Loads. http://folk.ntnu.no/skoge/prost/proceedings/aiche-2005/topical/pdffiles/T1/papers/215c.pdf, 2005, 3 pages.
Ziemer et al. Signals and Linear System Analysis, Chapter 2, pp. 16-100, in: Principles of Communications, 5th edition, John Wiley & Sons.
Solartron Analytical. 1260 Impedance/Gain-Phase Analyzer. Operating Manual, Jan. 1996, 215 pages.
Solartron Analytical. 1287 Electrochemical Interface, User Guide, Aug. 2002, 134 pages.
Ineel. FreedomCAR Battery Test Manual for Power-Assist Hybrid Electric Vehicles. Oct. 2003, DOE/ID-11069, 130 pages.
Ineel. FreedomCAR Ultracapacitor Test Manual. DOE/ID-11173, Revision 0, Sep. 2004, 116 pages.
Idaho National Laboratory. Battery Test Manual for Plug-In Hybrid Electric Vehicles, INL/EXT-07-12536, Revision 0, Mar. 2008, 68 pages.
Idaho National Laboratory. Battery Test Manual for Plug-In Hybrid Electric Vehicles, INL/EXT-07-12536, Revision 2, Dec. 2010, 71 pages.
Katayama et al. Real-Time Electrochemical Impedance Diagnosis for Fuel Cells Using a DC-DC Converter. IEEE Transactions on Energy Conversion, Jun. 2015, 30(2):707-713.
Koch et al. Electrochemical Impedance Spectroscopy for Online Battery Monitoring—Power Electronics Control. 16th European Conference on Power Electronics and Applications, 2014, 10 pages.
Koch et al. Impedance Spectroscopy for Battery Monitoring with Switched Mode Amplifiers. 16th International Power Electronics and Motion Control Conference and Exposition, Sep. 2014, pp. 496-501.
Koch et al. On-line Electrochemical Impedance Spectroscopy Implementation for Telecommunication Power Supplies. IEEE International Telecommunications Energy Conference, 2015, 6 pages.

\* cited by examiner

MULTISPECTRAL IMPEDANCE DETERMINATION UNDER DYNAMIC LOAD CONDITIONS

This International Patent Cooperation Treaty Patent Application claims the benefit of U.S. Provisional Patent Application No. 62/842,141, filed on May 2, 2019, hereby incorporated by reference herein.

I. TECHNICAL FIELD

Embodiments of the present disclosure relate to apparatuses, systems, and methods for impedance measurement and analysis of systems, and more particularly, to impedance measurement and analysis of batteries and other energy storage cells.

II. BACKGROUND

Chemical changes to electrodes and electrolyte in a rechargeable battery may cause degradation in the battery's capacity, duration of charge retention, charging time, and other functional parameters. Degradation accumulates over the service life and use of the battery. Environmental factors (e.g., high temperature) and functional factors (e.g., improper charging and discharging) may accelerate battery degradation. Operators of systems that rely on rechargeable battery power may desire to monitor the degradation of the batteries they use. One indicator of battery degradation is an increase in broadband impedance.

Electrochemical impedance spectroscopy (EIS) has been considered a very useful and benign diagnostic tool for energy storage devices. The method is typically based on sequentially injecting sinusoidal excitation signals into a battery over a broad frequency range (either current or voltage) and capturing the response. The fundamental assumptions of linearity and stationarity are met by exciting the battery under no load (i.e., open circuit) conditions using a signal that is kept as low as possible to ensure linearity, but also high enough to prevent signal-to-noise issues in the measured response.

FIG. 1 illustrates an example impedance spectrum 110 for a lithium-ion (li-ion) cell at 60% state-of-charge (SOC). Impedance spectra may be typically represented in the form of a Nyquist curve as shown here, but a Bode representation (i.e., magnitude and phase as a function of frequency) is also valid. The data reveal changes in the bulk behavior of the electrochemical processes in both the electrode surface and diffusion layer. The plot includes a mid-frequency semicircle arc, approximately between about 409.6 Hz and about 0.8 Hz in this case, followed by a low-frequency Warburg tail. The high-frequency inductive tail (above 409.6 Hz on the left side) is generally representative of a cable configuration and may also be influenced by some inductive coupling between cells if they are in close proximity. Typical parameters extracted from an impedance measurement include the ohmic resistance and charge transfer resistance (RO and RCT, respectively). These data can be estimated directly from the spectrum (as shown) or determined from equivalent circuit models. The parameters are typically incorporated into battery life models, diagnostic assessment tools, and prognostic tools.

Although EIS has typically been confined to laboratory environments due to its complexity and cost, there has been growing interest in applying impedance measurements in-situ for various battery diagnostic purposes such as SOC and state-of-health (SOH), internal core temperature estimation, safety assessment, and stability. Since EIS is also time consuming, these in-situ techniques have generally been limited to single frequencies or a small subset of targeted frequencies to ensure the measurement is completed within a reasonable amount of time. However, a difficulty with this approach is that errors can develop over time without periodic offline recalibration.

Like conventional EIS techniques using sequential excitation signals, multispectral impedance techniques have also been used in laboratory environments. These multispectral techniques use several frequencies within a single excitation signal applied to a battery, then measures a response of the battery to that single excitation signal. However, these multispectral techniques, as they are presently being used, are not capable of determining accurate impedance data for in-situ conditions when the battery is under dynamic load conditions.

Thus, there remains a need to acquire broad spectrum impedance measurements as a diagnostic sensor at the point of need (e.g., in-situ) under both load and no-load conditions. Fulfilling such a need would enable a fast and adjustable measurement method for more robust and accurate battery assessments for performance, health, safety, etc.

III. DISCLOSURE OF THE INVENTION

Embodiments of the present disclosure include a method of measuring impedance. The method includes exciting a device under test with a multispectral excitation signal for an excitation time period while the device under test is under a load condition from a load operably coupled to the device under test. The method also includes sampling a response of the device under test over a sample time period, wherein the excitation time period is within the sample time period such that the sample time period includes an in-band interval during the excitation time period, and one or more out-of-band intervals outside of the in-band interval. The method further includes estimating a load response of the device under test to the load condition during the in-band interval by analyzing samples of the response from the one or more out-of-band intervals. The method also includes computing adjusted samples by subtracting the estimated load response during the in-band interval from the samples from the in-band interval and estimating an impedance of the device under test by analyzing the adjusted samples.

Embodiments of the present disclosure include an impedance measurement system, comprising a signal conditioner, a data acquisition system, and a computing system. The signal conditioner is configured for generating a multispectral excitation signal from a composed multispectral signal and applying the multispectral excitation signal to a device under test for an excitation time period. The data acquisition system is configured for sampling a response of the device under test to generate measurements over a sample time period while the device under test is under a load condition from a load operably coupled to the device under test. The computing system is configured for generating the composed multispectral signal. The computing system is also configured for generating one or more timing indicators to create the sample time period, wherein the excitation time period is within the sample time period such that the sample time period includes an in-band interval during the excitation time period, and one or more out-of-band intervals outside of the excitation time period. The computing system is also configured for fitting a mathematical expression to the measurements during the one or more out-of-band intervals and analyzing the mathematical expression at time points corresponding to time points of the response during the in-band interval to estimate in-band corruption correlated to a corruption of the response by the load condition. The computing system is also configured for computing adjusted samples by subtracting the estimated in-band corruption during the in-band interval from the measurements from the in-band interval and analyzing the adjusted samples to estimate an impedance of the device under test.

Embodiments of the present disclosure further include a method of measuring impedance including applying a multispectral excitation signal over an excitation time period to a device under test while the device under test is under a load condition from a load operably coupled to the device under test. The method also includes measuring an electrical signal from the device under test during a sampling window to capture a sample time record of the electrical signal. The excitation time period is within the sampling window such that the sample time record includes in-band samples during the excitation time period, and out-of-band samples outside of the excitation time period. The method also includes fitting a mathematical expression to the out-of-band samples and estimating in-band corruption correlated to a corruption of the electrical signal by the load condition by analyzing the mathematical expression at time points corresponding to the in-band samples to determine in-band corruption elements. The method also includes adjusting the in-band samples by removing the in-band corruption elements from the in-band samples to develop a measurement time record, converting the measurement time record to a frequency domain representation, and analyzing the frequency domain representation to estimate an impedance of the device under test.

IV. BRIEF DESCRIPTION OF THE DRAWINGS

V. MODE(S) FOR CARRYING OUT THE INVENTION

Figure 1:
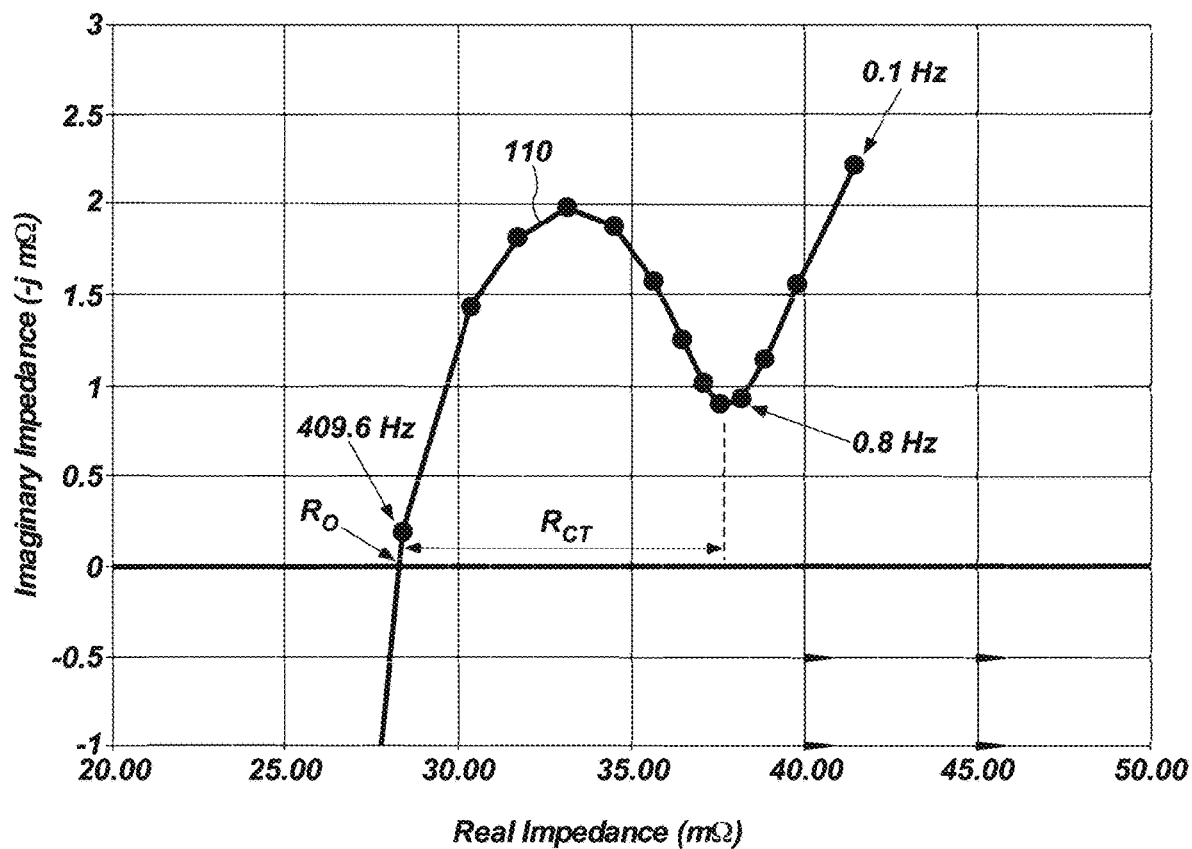
FIG. 1 illustrates an example impedance spectrum for a li-ion cell.

In the following detailed description, reference is made to the accompanying drawings, which form a part hereof, and in which is shown by way of illustration specific embodiments in which the present disclosure may be practiced. These embodiments are described in sufficient detail to enable those of ordinary skill in the art to practice the present disclosure. It should be understood, however, that the detailed description and the specific examples, while indicating examples of embodiments of the present disclosure, are given by way of illustration only and not by way of limitation. From this disclosure, various substitutions, modifications, additions rearrangements, or combinations thereof within the scope of the present disclosure may be made and will become apparent to those of ordinary skill in the art.

In accordance with common practice, the various features illustrated in the drawings may not be drawn to scale. The illustrations presented herein are not meant to be actual views of any particular apparatus (e.g., device, system, etc.) or method, but are merely idealized representations that are employed to describe various embodiments of the present disclosure. Accordingly, the dimensions of the various features may be arbitrarily expanded or reduced for clarity. In addition, some of the drawings may be simplified for clarity. Thus, the drawings may not depict all of the components of a given apparatus or all operations of a particular method.

Information and signals described herein may be represented using any of a variety of different technologies and techniques. For example, data, instructions, commands, information, signals, bits, and symbols that may be referenced throughout the description may be represented by voltages, currents, electromagnetic waves, magnetic fields or particles, optical fields or particles, or any combination thereof. Some drawings may illustrate signals as a single signal for clarity of presentation and description. It should be understood by a person of ordinary skill in the art that the signal may represent a bus of signals, wherein the bus may have a variety of bit widths and the present disclosure may be implemented on any number of data signals including a single data signal.

The various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and acts are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments of the disclosure described herein.

In addition, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be rearranged. A process may correspond to a method, a function, a procedure, a subroutine, a subprogram, etc. Furthermore, the methods disclosed herein may be implemented in hardware, software, or both. If implemented in software, the functions may be stored or transmitted as one or more computer-readable instructions (e.g., software code) on a computer-readable medium. Computer-readable media may include both computer storage media and communication media including any medium that facilitates transfer of a computer program from one place to another. Computer-readable media may include volatile and non-volatile memory, such as, for example, magnetic and optical storage devices, such as, for example, hard drives, disk drives, magnetic tapes, CDs (compact discs), DVDs (digital versatile discs or digital video discs), solid state storage devices (solid state drives), and other similar storage devices.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements. When describing circuit elements, such as, for example, resistors, capacitors, and transistors, designators for the circuit elements begin with an element type designator (e.g., R, C, M) followed by a numeric indicator.

Elements described herein may include multiple instances of the same element. These elements may be generically indicated by a numerical designator (e.g. 110) and specifically indicated by the numerical indicator followed by an alphabetic designator (e.g., 110A) or a numeric indicator preceded by a "dash" (e.g., 110-1). For ease of following the description, for the most part element number indicators begin with the number of the drawing on which the elements are introduced or most fully discussed. Thus, for example, element identifiers on a FIG. 1 will be mostly in the numerical format 1xx and elements on a FIG. 4 will be mostly in the numerical format 4xx.

Various embodiments of the present disclosure, as described more fully herein, provide a technical solution to one or more problems that arise from technology that could not reasonably be performed by a person, and various embodiments disclosed herein are rooted in computer technology in order to overcome the problems and/or challenges described below. Further, at least some embodiments disclosed herein may improve computer-related technology by allowing computer performance of a function not previously performable by a computer.

Reference throughout this specification to "one embodiment," "an embodiment," or similar language means that a particular feature, structure, or characteristic described in connection with the indicated embodiment is included in at least one embodiment of the present disclosure. Thus, the phrases "in one embodiment," "in an embodiment," and similar language throughout this specification may, but do not necessarily, all refer to the same embodiment.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances.

As used herein, the terms "energy storage cell" and "battery" refer to rechargeable electrochemical cells that convert chemical energy to a direct current electrical voltage potential across a positive terminal and a negative terminal of the energy storage cell. The terms "battery," "cell," and "battery cell" may each be used interchangeably herein with the term "energy storage cell" and can apply to, for example, cells, cell strings, modules, module strings, and packs.

As used herein, the terms "sinusoid," and "sinusoidal," refer to electrical signals (e.g., currents and voltage potentials) that oscillate at least substantially according to a sine or cosine function (e.g., having various magnitudes and phase shifts) over time. As should be readily apparent to those of ordinary skill in the art, any given sinusoidal signal may be equivalently expressed either as a sine function or a cosine function, as the sine and cosine are merely phase-shifted versions of each other. Sinusoidal signals are disclosed herein as being applied to a Device Under Test (DUT) that exhibit an impedance, such as, for example, electrical circuits, energy storage cells, and possibly shunts (e.g., resistors of known resistance values for calibration purposes). In some cases, these sinusoidal signals are referred to more specifically herein as either sine signals or cosine signals. These specific references to sine signals and cosine signals may be indicative of the phase of such signals relative to a time when a sinusoidal signal is first asserted to a conductive line (e.g., a positive or negative battery terminal, a conductive trace on a circuit board, a wire, etc.).

As used herein, the term "sum-of-sinusoids" ("SOS") refers to electrical signals that oscillate according to a sum of sinusoidal signals. An SOS signal may include sums of sine signals, sums of cosine signals, or combinations thereof. For example, a Harmonic Orthogonal Synchronous Transform (HOST) SOS signal may include a base sinusoidal signal having a base frequency summed with one or more sinusoidal signals having successive integer harmonic frequencies of the base frequency and alternating between sine signals and cosine signals (or some phase-shifted version thereof) for each successive harmonic. The orthogonal nature of the harmonic sinusoidal signals summed together in a HOST SOS may serve to reduce or eliminate excessive transients. While examples are provided herein referring to SOS signals, embodiments of the present disclosure also contemplate using other types of excitation signals, including sum of alternating sines, cosines (ASC) signals.

As used herein, a multispectral signal is a signal that can be represented by a combination of two or more sinusoidal signals at different frequencies and possibly different amplitudes for each of the different frequencies. Thus, an SOS signal is a type of multispectral excitation signal. Other non-limiting types of multispectral signals are periodic signals that are not a simple sinusoid. As non-limiting examples, square waves, triangular waves, and sawtooth waves are multispectral signals because they can be represented as a summation of periodic sinusoidal signals at various frequencies, possibly with different amplitudes for each of the included frequencies. In addition, in some embodiments of the present disclosure the multispectral signal may be configured as a single sinusoidal signal or other periodic signal.

As used herein, the terms "corruption" and "signal corruption" refer to the effects that load conditions have on a DUT response while an excitation signal used for impedance measurements is being applied to the DUT. It should be noted that this use of "corruption" is, in many ways, backwards from how a system with a DUT and load is normally considered. In loaded systems under typical operation, when viewed from the load the excitation signal may appear as a relatively small disruption to the normal power signals. However, within the context of this disclosure the view is from the perspective of an excitation and measurement system of the DUT wherein load conditions "corrupt" a measurement signal and a subsequent ability to determine impedance characteristics of the DUT. Thus, unless specified differently herein, the "corruption" should be viewed from this perspective of corruption of the DUT measurements by a load, which is corrected for by embodiments of the present disclosure.

In general, the approach of embodiments of the present disclosure is to recognize that there are substantially two forcing functions on the device under test. One forcing function is due to a load plus any parasitic effects on the device under test. The other forcing function is due to the application of the multispectral excitation signal to the device under test. Thus, one forcing function (i.e., the multispectral excitation signal) is known and the other forcing function is substantially unknown. Because these forcing functions are applied at the same time, the measured response includes responses to both forcing functions. As a result, a suitable multispectral impedance analysis can't be performed because of the "corruption" of the substantially unknown forcing function. However, embodiments of the present disclosure can estimate the unknown forcing function and subtract the estimate from the total response. This process removes the corruption so a suitable multispectral impedance analysis can be performed on the resulting response with the estimate of the substantially unknown load condition removed.

It should be noted that for simplicity and clarity, the description herein focuses on batteries. However, embodiments of the present disclosure are not so limited. Rather embodiments may include many other systems and devices that exhibit an impedance that can be measured and analyzed by sampling a response to a multispectral excitation signal.

Figure 2:
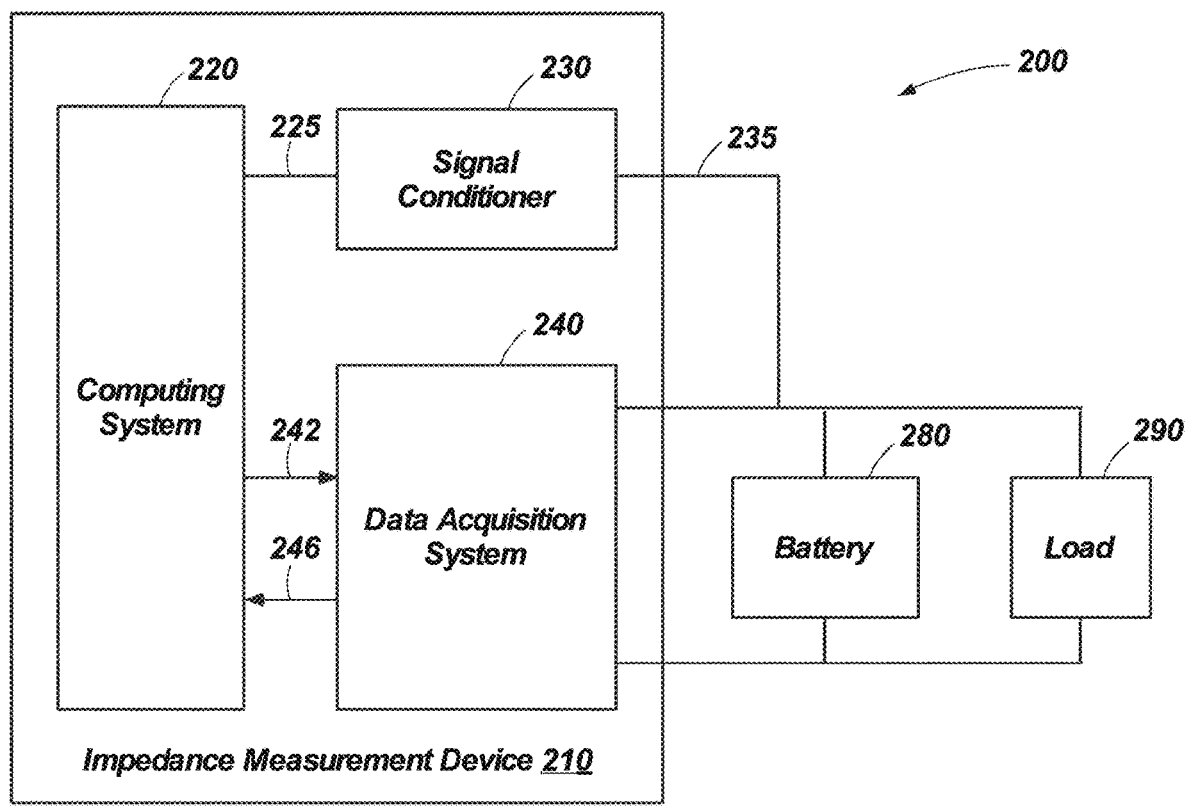
FIG. 2 is a simplified block diagram of an impedance measurement system configured to perform impedance spectrum measurements of a battery.

FIG. 2 is a simplified block diagram of an impedance measurement system 200 configured to perform real-time impedance spectrum measurements of a battery 280 according to embodiments of the present disclosure. The battery 280 (or other suitable DUT) to be tested and analyzed may be deployed in-situ and in use such that it is operably coupled to a load 290. The load 290 may impart dynamic load conditions on the battery such as, for example, dynamic charge conditions and dynamic discharge conditions.

The impedance measurement system 200 includes an impedance measurement device (IMD) 210 operably coupled to the battery 280. The IMD 210 may include a computing system 220, a data acquisition system 240, and a signal conditioner 230. The IMD 210 may be used in a variety of different environments and with different battery types such that the health of the battery may be monitored in-situ. As an example, the impedance measurement system 200 may be incorporated within an automobile or other vehicle with batteries that include one or more energy storage cells or fuel cells. Such vehicles may include electric or hybrid vehicles. It is also contemplated that embodiments of the disclosure may be employed in non-vehicular applications such as, by way of non-limiting example, in association with energy storage cells or fuel cells operably coupled to solar, wind, or tidal energy generation systems. As other non-limiting examples, embodiments may be used in power grids, consumer electronics, telecommunications, maritime applications, military applications, and other electrical devices and circuits that include a load and respond to an excitation signal. Other non-limiting examples include applications related to analysis of metal quality, weld junctures, solar panels, concrete, food quality assessments, biomedical, etc.

Embodiments of the present disclosure may be used in a variety of applications. As non-limiting examples, vehicle energy storage systems with applications to battery safety detection, stability assessment, thermal management, cell balancing, performance, state of health, diagnostics, and prognostics.

The computing system 220 may be incorporated completely, or in part, within the IMD 210. In other words, the computing system 220 may be part of the IMD 210 (as shown in FIG. 2), separate from but in communication with the IMD 210, or distributed such that some parts of the computing system 220 are incorporated within the IMD 210 while other parts of the computing system 220 are remote from the IMD 210, but in communication with the IMD 210.

In some embodiments the computing system 220 may be configured to directly generate a multispectral excitation signal 235 to stimulate the battery with an appropriate composed multispectral signal 225 during testing. In such embodiments, there may be no need for a signal conditioner 230, or the signal conditioner 230 may be a software module within the computing system 220. One possible example of such a system may be a microcontroller acting as the computing system 220, or portion of the computing system 220, wherein the microcontroller includes a digital-to-analog converter and other analog signal conditioning electronics.

In other embodiments, the signal conditioner 230 may receive a signal from the computing system and include electronic components to condition the signal by amplifying, filtering, and adjusting the signal as needed for appropriate application of the multispectral excitation signal 235 to the battery 280.

The computing system 220 may be configured to generate the composed multispectral signal 225 in a desired format, which may then be modified by the signal conditioner 230 before application as the multispectral excitation signal 235 to the battery 280. In other embodiments, portions of, or all of, the generation of the composed multispectral signal 225 may be performed by the signal conditioner 230.

In some embodiments, the composed multispectral signal 225 is generated as a digital signal, which is then converted to an analog signal either by the computing system 220 or by the signal conditioner 230 such that the multispectral excitation signal 235 applied to the battery 280 is an analog signal. Moreover, the multispectral excitation signal 235 may be applied as a potentiostatic measurement (i.e., voltage) or a galvanostatic measurement (i.e., current). In addition, the computing system may be configured to trigger the application of the multispectral excitation signal 235 at a specific time relative to the sampling times of the data acquisition system 240. As non-limiting examples, the trigger may be set for specific times (e.g., periodically), specific events (e.g., change in the measurement system parameters and change in parameters related to the device under test), anomalous behavior (e.g., unanticipated behavior that may affect safety or performance of the device under test or measurement system) and change in load characteristics (e.g., a change to a charge load condition, a discharge load condition, and a no-load condition).

Additional details on possible configurations for the computing system 220 are discussed below with reference to FIGS. 13A and 13B.

The IMD 210 may be configured to measure electrical signals at terminals of the battery 280 responsive to the multispectral excitation signal 235 being applied to the battery 280, the load 290 being applied to the battery 280, or a combination thereof. The IMD 210 may be configured to receive the battery response signal and compute the impedance of the battery 280 at the various frequencies within the multispectral excitation signal 235. In this way, the IMD 210 may be configured to determine the impedance of the battery 280 at a plurality of different frequencies substantially simultaneously.

In some embodiments, the data acquisition system 240 alone, or in cooperation with the computing system 220 may divide the measured voltage response by the measured excitation current to obtain the impedance response of the battery 280. In such embodiments, no calibration may be needed because the impedance of the battery 280 may be determined by dividing a measured voltage by a measured current. In some embodiments, the data acquisition system 240 may be configured to measure only a voltage response of the battery 280 to the multispectral excitation signal 235. In such embodiments, additional calibration operations may be used to assist in determination of the impedance of the battery 280.

Different calibration methods (e.g., single-shunt calibration, multiple shunt calibration, etc.) are contemplated, which may be used to account for real and imaginary portions of signals. In some embodiments, the calibration may include methods, such as for example, those described in U.S. Pat. No. 9,851,414, issued Dec. 26, 2017, entitled "Energy Storage Cell Impedance Measuring Apparatus, Methods and Related Systems," the disclosure of which is hereby incorporated in its entirety by this reference.

The IMD 210 may utilize data processing methods (e.g., algorithms) for generating broadband battery impedance data. Impedance data may be transmitted from the IMD 210 to a remote computer (not shown). The broadband impedance data may be formatted in any suitable format (e.g., Comma Separated Values (CSV) format). Each individual impedance spectrum dataset may include a time stamp, an information header, and the impedance data may include the frequencies, the real part of the impedance, the imaginary part of the impedance, the magnitude part of the impedance, the phase part of the impedance, and the common mode battery voltage for that spectrum. Additional data that may be transmitted to the remote computer with the impedance data include the SOS Root-Mean-Square (RMS) current and voltage. The remote computer may include a personal computer, a tablet computer, a laptop computer, a smart phone, a server, a vehicle computer (e.g., central processing unit), or other suitable computing devices.

A user, or automated remote computer, may control the IMD 210 using commands via an interface. For example, the IMD 210 may be able to be controlled via a human interface on the remote computer or the IMD 210 for the purpose of inputting control constraints to the IMD 210, performing embedded system diagnostics, calibration, or performing manual impedance spectrum acquisition.

The computing system 220 may be configured to synchronize and control the signal conditioner 230 and the data acquisition system 240. In some embodiments, the measurements may be performed according to a defined schedule, control parameters, and combinations thereof dictated by the remote computer.

With the signal conditioner 230 coupled to the battery 280, the computing system 220 sends the composed multispectral signal 225, such as, for example, an SOS signal or other suitable measurement signal to the signal conditioner 230 or directly to the battery 280. When the battery 280 is excited with the multispectral excitation signal 235 (e.g., the SOS signal) under no-load conditions, the voltage that appears at the battery terminals may be the battery voltage plus any voltage perturbations caused by the SOS current acting on the internal impedance of the battery 280. It is these perturbations that, when captured and processed, will yield the spectrum of the battery impedance for the battery 280. When under a load condition, the voltage that appears at the battery terminals may be the battery voltage change due to the load plus any voltage perturbations caused by the SOS current acting on the internal impedance of the battery 280. It is these perturbations that, when captured and processed after removing the load corruption, will yield the spectrum of the battery impedance for the battery 280.

The data acquisition system 240 may be configured with a desired resolution (e.g., 16 bit, 32 bit, etc.) and accept an external sample clock from the computing system 220 with a clock frequency that may range, as non-limiting examples, from 1 kHz to 100 kHz. The data acquisition system 240 may accept one or more timing signals 242 from the computing system 220 to start and stop acquiring data over a predetermined time period relative to the application of the multispectral excitation signal 235 to the battery 280. In addition, the timing signals 242 may be configured to cause the data acquisition system 240 to acquire data for a predetermined time period before the multispectral excitation signal 235 is applied to the battery 280 and a predetermined time period after the multispectral excitation signal 235 is removed from the battery 280. Additional details on the timing of data acquisition relative to the multispectral excitation signal 235 are provided below with reference to FIGS. 10A through 13B.

In some embodiments, an optional connection circuit (not shown) may be included before the battery 280 to isolate at least one signal line connection to the battery 280. As a result, the coupling of the multispectral excitation signal 235 to the battery 280 may be disconnected when the multispectral excitation signal 235 is not being applied to the battery 280. An example of such an optional connection circuit that uses relays coupled to between the signal conditioner 230 and the battery 280 is described in United States Patent Application Publication No. 2014/0358462, filed Jun. 4, 2014, entitled "Apparatuses and Methods for Testing Electrochemical Cells by Measuring Frequency Response." As described previously, the disclosure of this application is incorporated in its entirety by the reference above.

As a non-limiting example of a composed multispectral signal 225, the computing system 220 may be configured to generate a digital SOS signal including a sum of sinusoids having a plurality of different frequencies that are of interest for impedance measurement of the battery 280. The digital SOS signal may be sampled at least at a Nyquist rate of a highest one of the plurality of different frequencies of the digital SOS signal. The digital SOS signal may also represent at least one period of a lowest one of the plurality of different frequencies of the digital SOS signal.

An impedance computation module in the computing system 220, the data acquisition system 240, or combination thereof, may be configured to compute a determined impedance of the battery 280 using captured signal data 246. By way of non-limiting example, the captured signal data 246 may include both the voltage response and the current response of the battery 280 to the SOS signal. The computing system 220 may be configured to convert the captured signal data 246 from the time domain to a frequency domain representation and may be configured to divide the voltage response by the current response for each of the plurality of different frequencies of the SOS signal to determine impedance data for each of the plurality of different frequencies.

Also, by way of non-limiting example, the captured signal data 246 may include only the voltage response of the battery 280 to the SOS signal. The computing system 220 may be configured to use the voltage response and calibration data from previous or subsequent calibrations of the IMD 210. A known calibration response may be measured by applying the SOS signal to one or more shunts of known impedance and measuring and storing calibration data including the response of the one or more shunts to the SOS signal.

The computing system 220 may be configured to provide or store impedance data including the determined impedance of the battery 280 at each of the frequencies included in the digital SOS signal. In some embodiments, the impedance data may be displayed to a user of the computing system 220 (e.g., on an electronic display of the impedance measurement system 200 in list form, in plot form, in table form, etc.). In some embodiments, the impedance data may be processed automatically to determine whether the battery 280 should be replaced, and the user, or remote computer, may be informed of the automatic determination. In some embodiments, the impedance data may be processed automatically to determine an estimate of how much life is remaining for the battery 280 or other parameters such as stability, health, SOC, etc. Such automatic processing may be performed locally by a local computing system in the impedance measurement system 200, remotely by a remote computing system, or combinations thereof. A warning (e.g., visual, audible, or a combination thereof) may be provided when the IMD 210 detects that the battery 280 should be managed differently, replaced or serviced.

A number of different multispectral signals and data processing methods may be employed to determine the impedance of the battery 280, including rapid impedance measurement tools based on SOS analysis.

In some embodiments, the data processing method used by the IMD 210 may include a Harmonic Compensated Synchronous Detection (HCSD) method, such as for example, is described in U.S. patent application Ser. No. 14/296,321, filed Jun. 4, 2013, entitled "Apparatuses and Methods for Testing Electrochemical Cells by Measuring Frequency Response." In some embodiments, the data processing method used by the IMD 210 may include a time crosstalk compensation (TCTC) method, such as for example, is described in U.S. Pat. No. 8,762,109, issued Jun. 24, 2014, entitled "Crosstalk Compensation in Analysis of Energy Storage Devices." In some embodiments, the data processing method used by the IMD 210 may include a HOST method, such as for example, is described in U.S. patent application Ser. No. 14/789,959, filed Jul. 1, 2015, entitled "Apparatuses and Methods for Testing Electrochemical Cells by Measuring Frequency Response." In some embodiments, the data processing method used by the IMD 210 may include a Fast Summation Transformation (FST) method, disclosed in U.S. Pat. No. 8,150,643, issued Apr. 3, 2012, and entitled "Method of Detecting System Function by Measuring Frequency Response." In some embodiments, the data processing method used by the IMD 210 may include a triads based Generalized Fast Summation Transformation (GFST) method described in U.S. Pat. No. 8,352,204, issued Jan. 8, 2013, entitled "Method of Detecting System Function by Measuring Frequency Response." The disclosure of each of the foregoing applications is hereby incorporated in their entirety by these references.

Other multispectral signals and data processing methods may be employed, such as, for example, sequentially applied sinusoidal signals at different frequencies, galvanostatic measurements, and potentiostatic measurements. These techniques are typically sinusoidal, but other excitation waveforms can also be used. Still other multispectral signals and data processing methods may include using noise signals, square waves, triangle waves, wavelets, and others.

Other signal and data processing methods may be employed to obtain targeted information such as single frequency measurements at one or more designated frequencies.

Figure 3A:
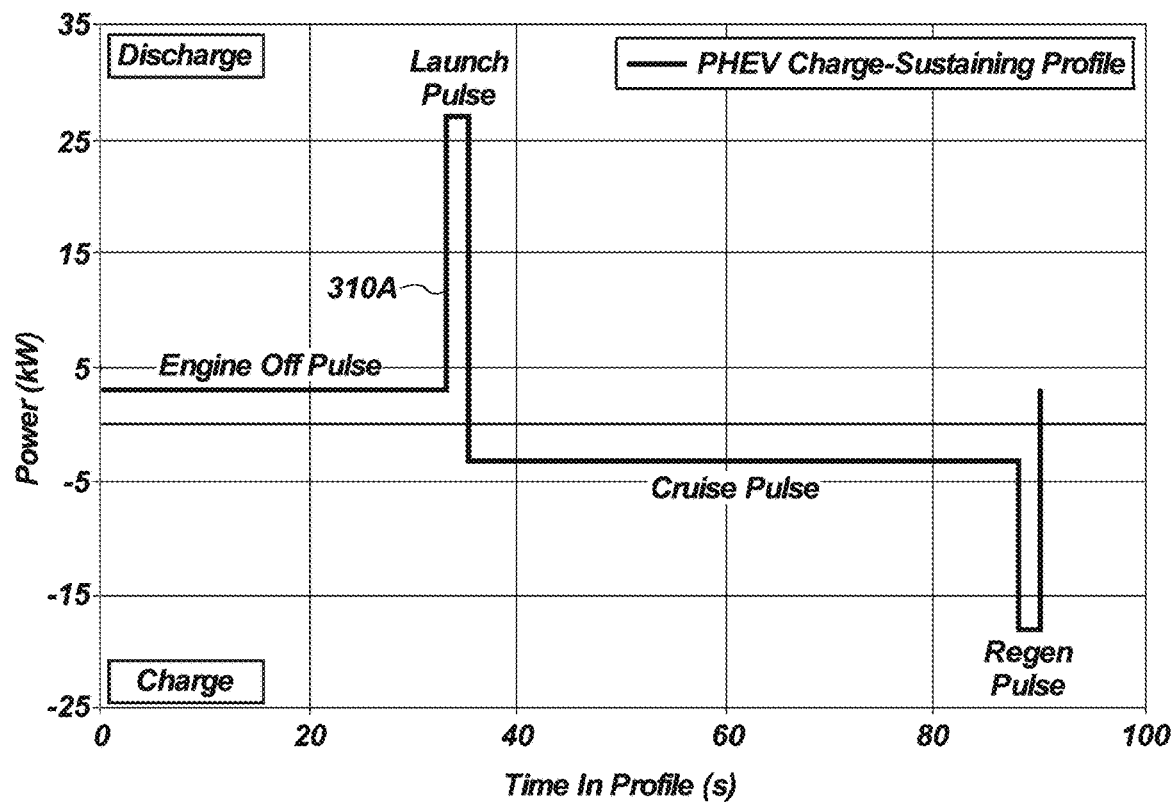
FIGS. 3A and 3B illustrate charge and discharge test profiles for Plug-In Hybrid Electric Vehicles (PHEV).
Figure 3B:
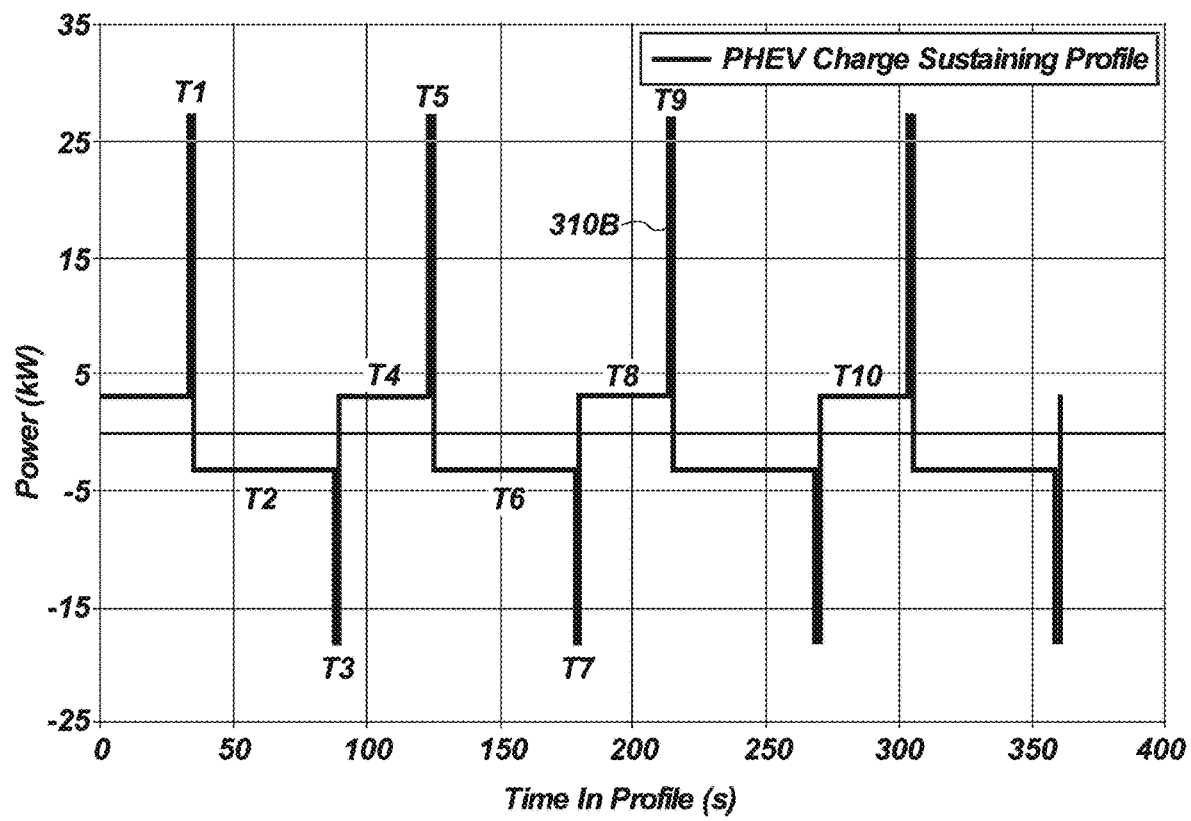

FIGS. 3A and 3B illustrate charge and discharge test profiles for Plug-In Hybrid Electric Vehicles (PHEVs) obtained from the publication, "Battery Test Manual for Plug-In Hybrid Electric Vehicles," DOE/ID-12536 (2010), the disclosure of which is hereby incorporated in its entirety by this reference. Many of the impedance spectra shown and discussed herein were gathered under test conditions using this charge-sustaining cycle-life profile defined for PHEVs. As shown in FIG. 3A, the profile 310A includes discharge and charge pulses with a shallow SOC swing. The profile 310A is intended to simulate a typical in-town driving cycle. When the engine is off (e.g., at a red light), the battery supplies power to run accessory loads such as climate control, fans, radio, etc. Once motion is required (e.g., when the light turns green), the battery supplies high power for a short duration to "launch" the vehicle forward while the engine turns on. This is followed by a low-level regenerative charge while the vehicle is in "cruise" mode and a large, short duration regenerative pulse when the brakes are applied (e.g., approaching another red light).

This cycle-life profile 310A is repeated continuously at the designated temperature and SOC condition as shown in FIG. 3B for four cycles. Also shown in FIG. 3B, an IMD with control software was equipped with triggering capability to initiate pre-determined HCSD measurements at specified conditions (in this case, measurements were triggered based on known changes in differential voltage measured across an external shunt in response to the battery voltage swings caused by the charge sustaining profile load). The triggering sequence for this study is described in Table A.

TABLE A

Triggered under-load measurements for the HCSD study

| Trigger | Pulse | Low Frequency | Test Duration |
|---|---|---|---|
| T1 | Launch (1) | 1.0 Hz | 1 s |
| T2 | Cruise (1) | 0.1 Hz | 10 s |
| T3 | Regen (1) | 1.0 Hz | 1 s |
| T4 | Engine Off (1) | 0.1 Hz | 10 s |
| T5 | Launch (2) | 1.0 Hz | 1 s |
| T6 | Cruise (2) | 0.1 Hz | 10 s |
| T7 | Regen (2) | 1.0 Hz | 1 s |
| T8 | Engine-Off (2) | 0.1 Hz | 10 s |
| T9 | Launch (3) | 1.0 Hz | 1 s |
| T10 | Engine Off (3) | 0.1 Hz | 10 s |

For the ten triggers (shown in FIG. 3B as T1-T10), the frequency range of each trigger was adjusted to fit within the duration of the given pulse. Of course, the triggers and duration of FIG. 3B are used as an example. The trigger and duration for the multispectral excitation signal is adjustable and may be modified based on various parameters, such as, for example, the type of multispectral excitation signal used, the expected load condition type, the expected load condition duration, and desired sampling rates. The ten triggers covered three sequential HCSD measurements for each discharge pulse (i.e., Engine Off and Launch), and two sequential measurements for each charge pulse (i.e., Cruise and Regen) in the cycle-life profile. This triggering sequence was repeated every 50 cycles during life testing. With only one period of the lowest frequency required, the HCSD technique can be applied for very short durations as needed. A starting frequency of 0.1 Hz results in a 10-second measurement with 15 embedded frequencies (i.e., 0.1, 0.2, . . . 819.2, 1638.4 Hz). A starting frequency of 1 Hz yields a 1-second measurement with 11 embedded frequencies (1, 2, . . . , 512, 1024 Hz). While the 1-second measurements may not yield very detailed spectra, they may be very useful for more proactive battery management system designs (e.g., rapid detection of possible failure mechanisms, etc.).

Figure 4A:
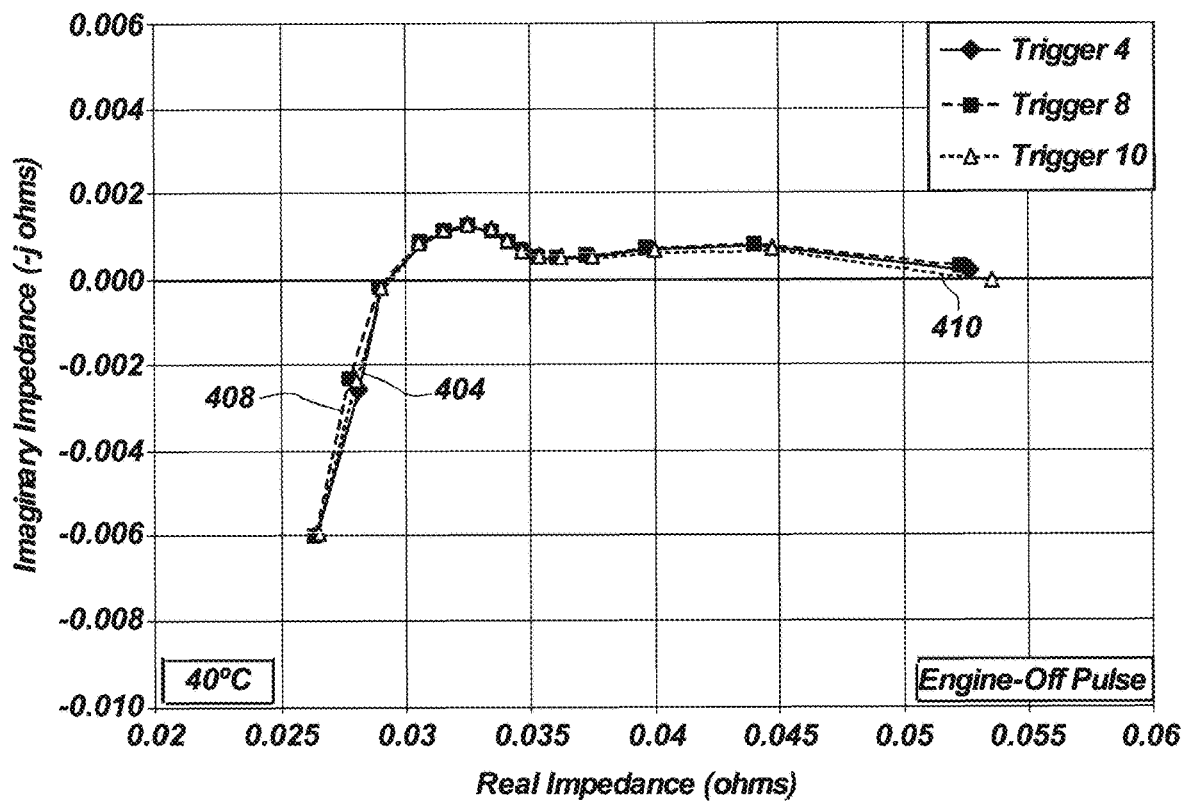
FIGS. 4A and 4B illustrate impedance spectra Nyquist curves for a battery under a light constant power discharge load and heavy constant power discharge load, respectively.
Figure 4B:
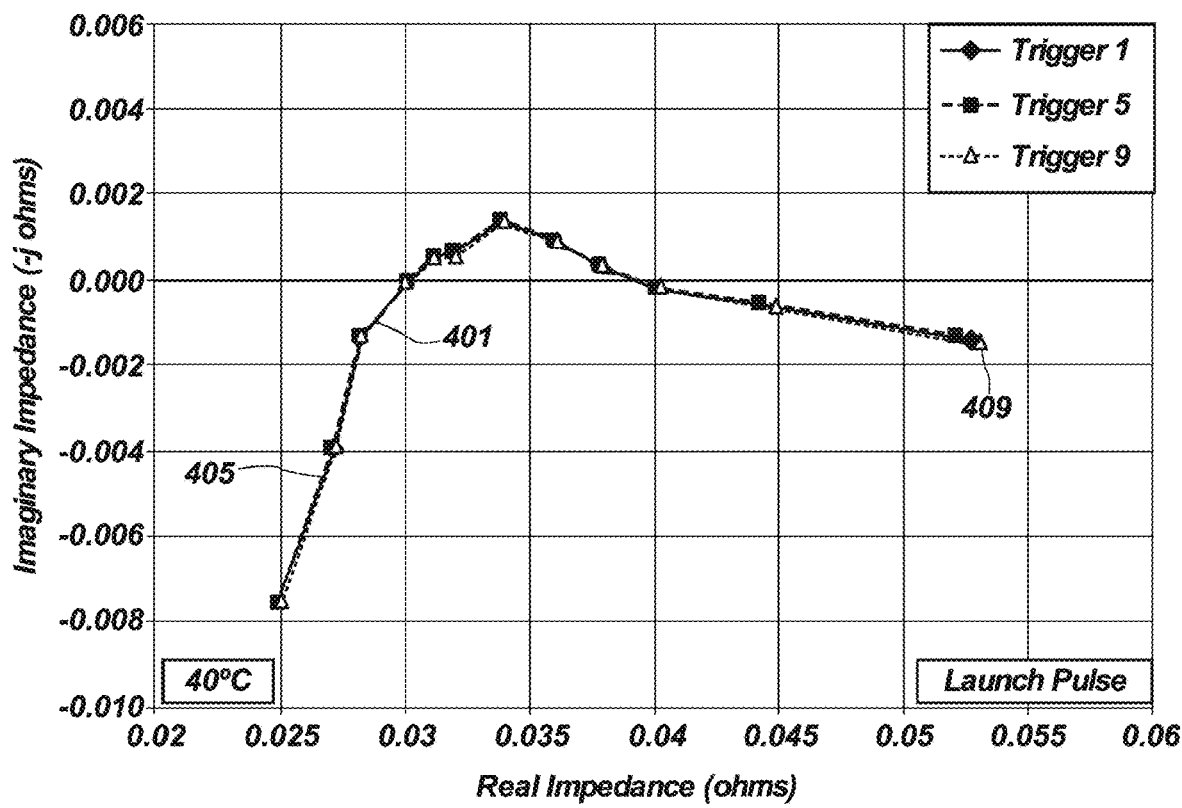

FIGS. 4A and 4B illustrate impedance spectra Nyquist curves for a battery under a light constant power discharge load and heavy constant power discharge load, respectively.

FIG. 4A illustrates impedance spectra from HCSD excitation on a constant power pulse at 40° C. for a li-ion cell for three different cycles; Trigger 4 (curve 404), Trigger 8 (curve 408), and Trigger 10 (curve 410). These light constant power discharge measurements are from the Engine Off pulses of Table A and FIGS. 3A and 3B. The HCSD excitation is based on 0.1 to 1638.4 Hz in octave harmonic steps with a 10 second SOS signal superimposed over the constant discharge load. As can be seen by the overlay of the three curves, the measurements are highly repetitive.

FIG. 4B illustrates impedance spectra from HCSD excitation on a constant power pulse at 40° C. for the li-ion cell for three different cycles; Trigger 1 (curve 401), Trigger 5 (curve 405), and Trigger 9 (curve 409). These heavy constant power discharge measurements are from the Launch pulses of Table A and FIGS. 3A and 3B. The HCSD excitation is based on 1 to 1024 Hz in octave harmonic steps with a 1 second SOS signal superimposed over the constant discharge load. As with the curves of FIG. 4A, the measurements over three cycles are highly repetitive.

When comparing FIGS. 4A and 4B to the spectrum of FIG. 1 under no-load conditions, it can be seen that ohmic and charge transfer resistances are clearly still present. However, the Warburg tail deviates from the no-load condition, which may be due to a different ion diffusion rate from to the load.

Figure 5A:
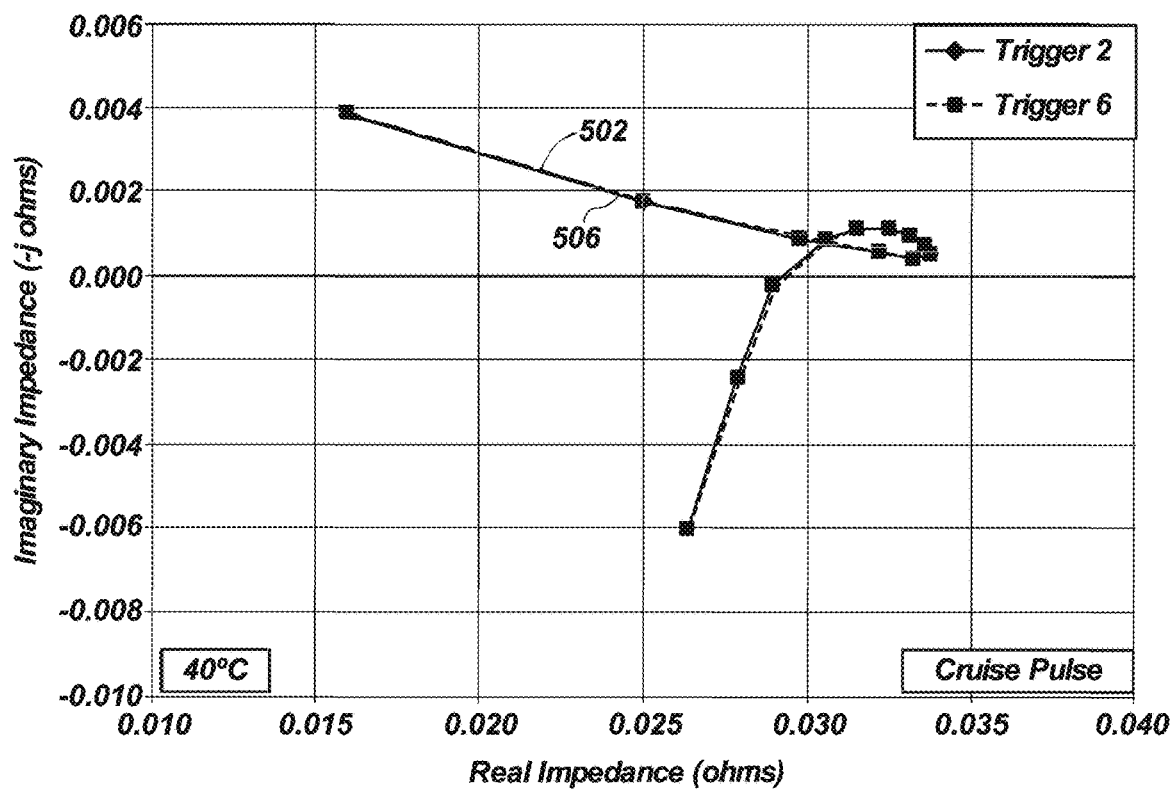
FIGS. 5A and 5B illustrate impedance spectra Nyquist curves for a battery under a light constant power charge load and heavy constant power charge load, respectively.
Figure 5B:
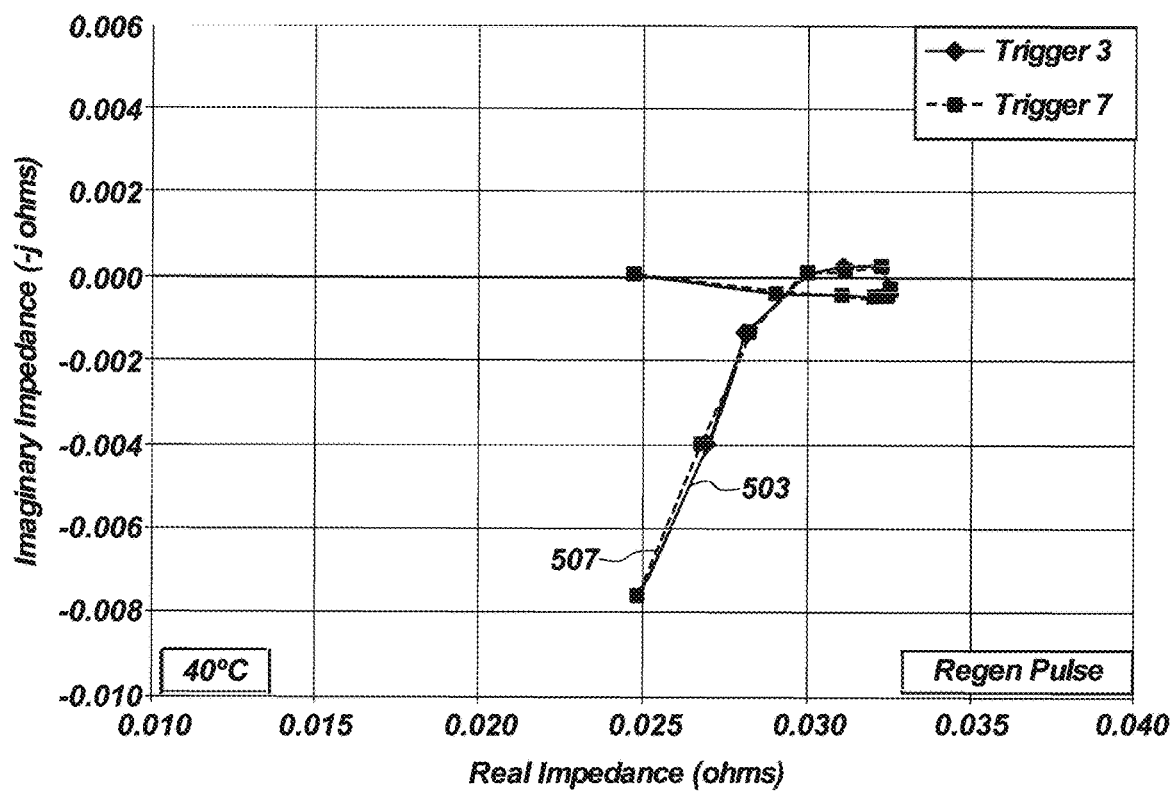

FIGS. 5A and 5B illustrate impedance spectra Nyquist curves for a battery under a light constant power charge load and heavy constant power charge load, respectively.

FIG. 5A illustrates impedance spectra from HCSD excitation on a constant power pulse at 40° C. for a li-ion cell for two different cycles; Trigger 2 (curve 502) and Trigger 6 (curve 506). These light constant power charge measurements are from the Cruise pulses of Table A and FIGS. 3A and 3B. The HCSD excitation is based on 0.1 to 1638.4 Hz in octave harmonic steps with a 10 second SOS signal superimposed over the constant charge load. As can be seen by the overlay of the two curves, the measurements are highly repetitive.

FIG. 5B illustrates impedance spectra from HCSD excitation on a constant power pulse at 40° C. for the li-ion cell for three different cycles; Trigger 3 (curve 503) and Trigger 7 (curve 507). These heavy constant power charge measurements are from the Regen pulses of Table A and FIGS. 3A and 3B. The HCSD excitation is based on 1 to 1024 Hz in octave harmonic steps with a 1 second SOS signal superimposed over the constant charge load. As with the curves of FIG. 5A, the measurements over two cycles are highly repetitive.

When comparing FIGS. 5A and 5B to the spectrum of FIG. 1 under no-load conditions, it can be seen that ohmic resistance is clearly still present. However, the Warburg tail loops and goes off in the opposite direction, which may be due to opposing currents between excitation signal and load. Thus, it can be seen that the corruption of the charge load impacts the spectra for the charge transfer resistance and Warburg tail.

Figure 6A:
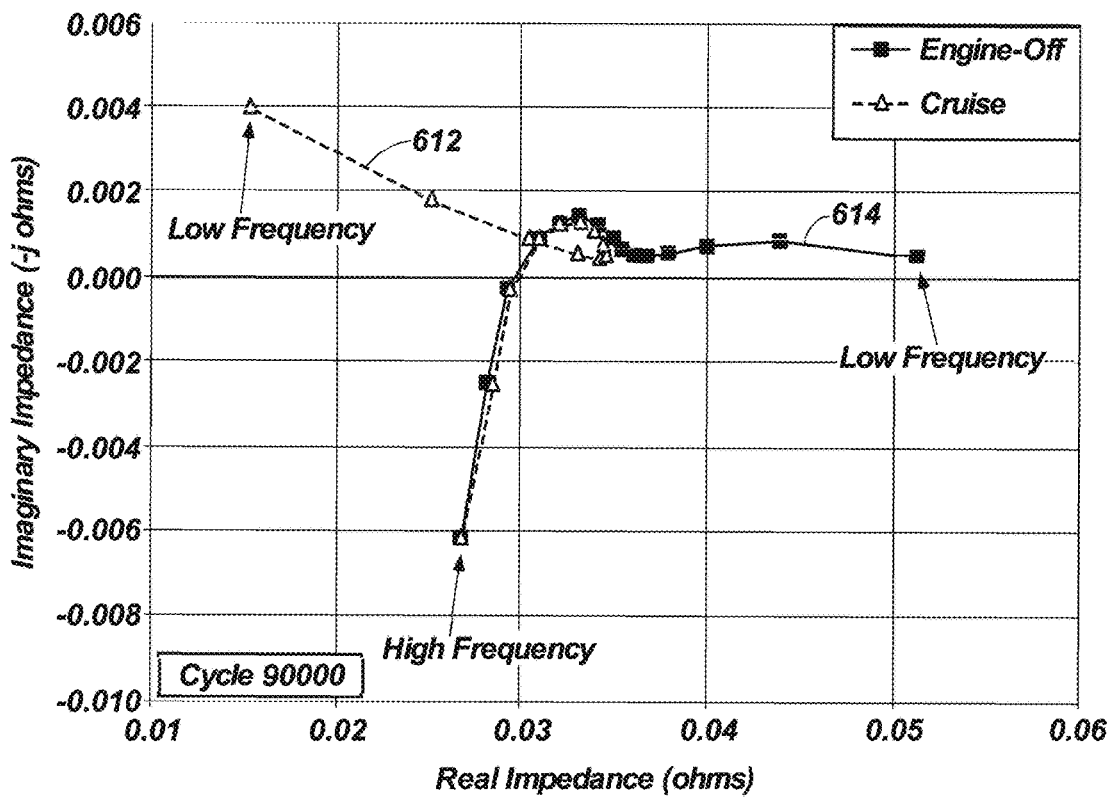
FIGS. 6A and 6B illustrate impedance spectra Nyquist curves for a battery under light constant power loads and heavy constant power loads, respectively.
Figure 6B:
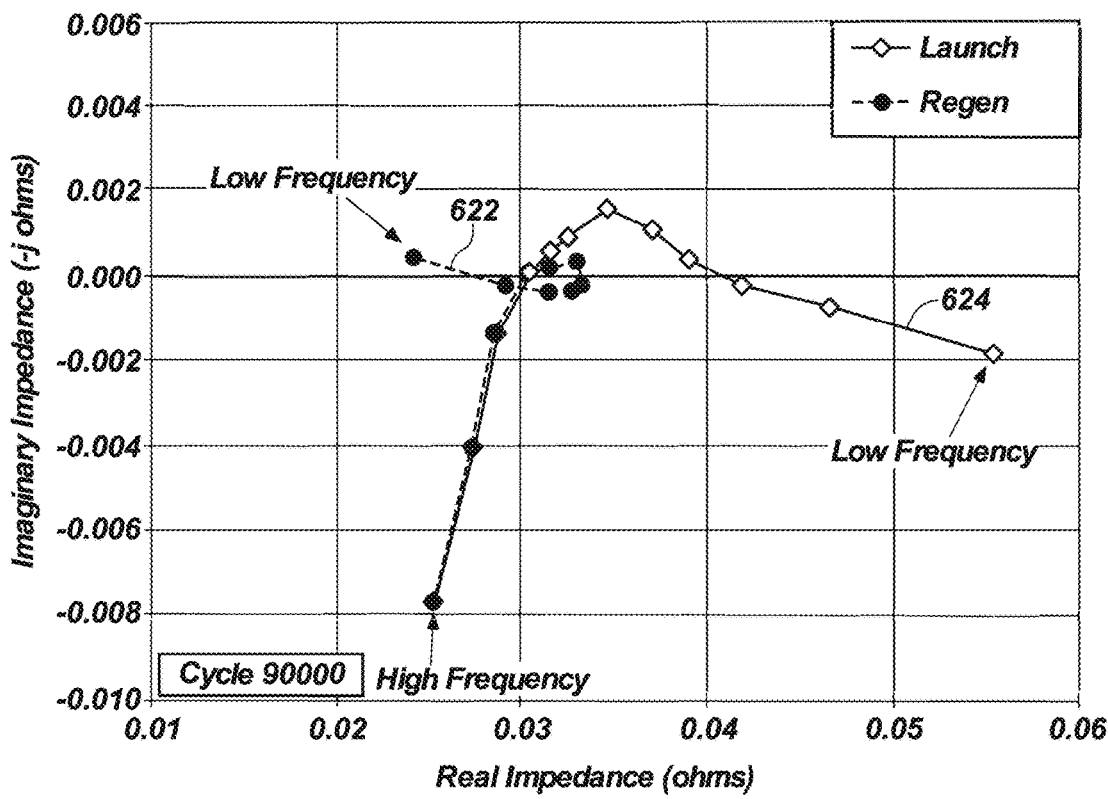

FIGS. 6A and 6B illustrate impedance spectra Nyquist curves for a battery under light constant power loads and heavy constant power loads, respectively.

FIG. 6A includes an overlay of a Nyquist curve 612 under light constant power load for a charge cycle (i.e., a Cruise pulse) and a Nyquist curve 614 under light constant power load for a discharge cycle (i.e., an Engine Off pulse).

The impedance for the discharge and charge pulses are equivalent at higher frequencies but begin to diverge as the frequency reduces. The 1 second impedance spectrum 612 (from the Cruise pulse) shows the initial formation of a mid-frequency semicircle before diverging in the opposite direction. Note that the impedance spectrum 612 for the Cruise pulse diverges as the number of periods for a given frequency within the SOS excitation signal is reduced.

FIG. 6B includes an overlay of a Nyquist curve 622 under heavy constant power load for a charge cycle (i.e., a Regen pulse) and a Nyquist curve 624 under heavy constant power load for a discharge cycle (i.e., a Launch pulse). The impedance spectra for the discharge and charge pulses are equivalent at higher frequencies but begin to diverge as the frequency reduces. The one second impedance spectrum 622 (from the Regen pulse) diverges sooner than seen in FIG. 6A since the initial frequency is an order of magnitude larger than the low power pulse.

Figure 7A:
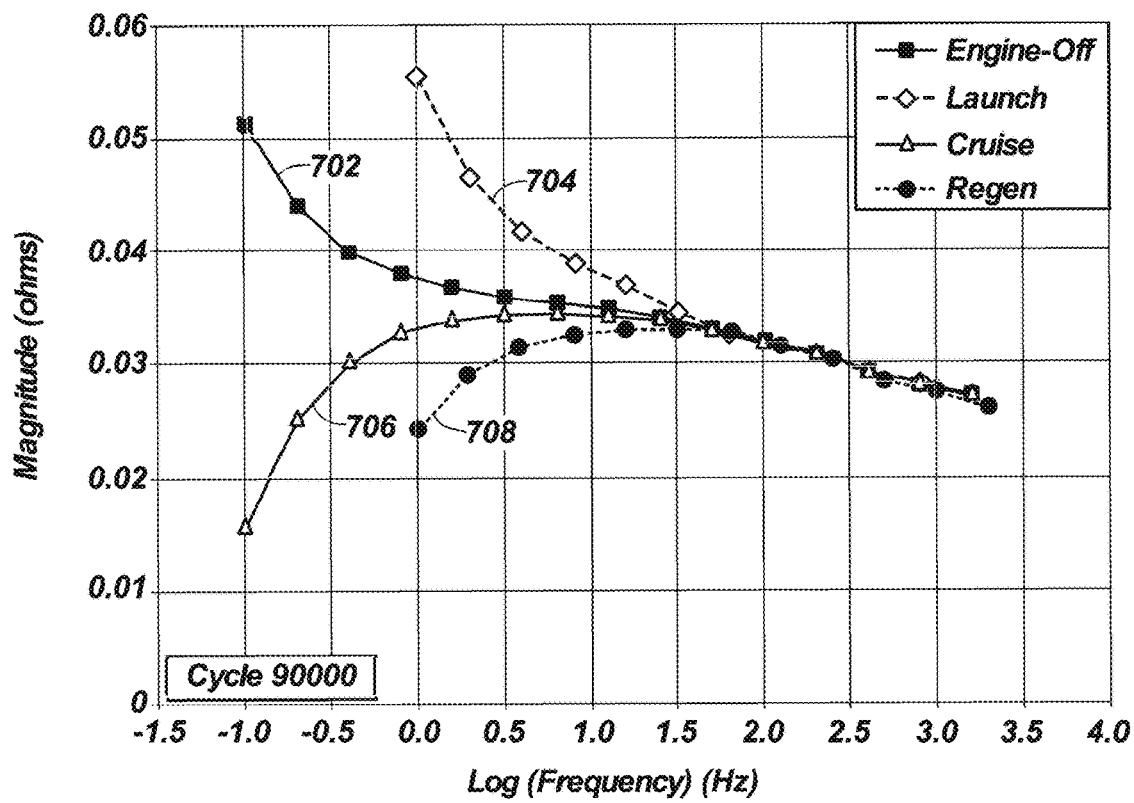
FIGS. 7A and 7B illustrate impedance spectra as Bode plots for a battery under constant power load showing magnitude and phase, respectively.
Figure 7B:
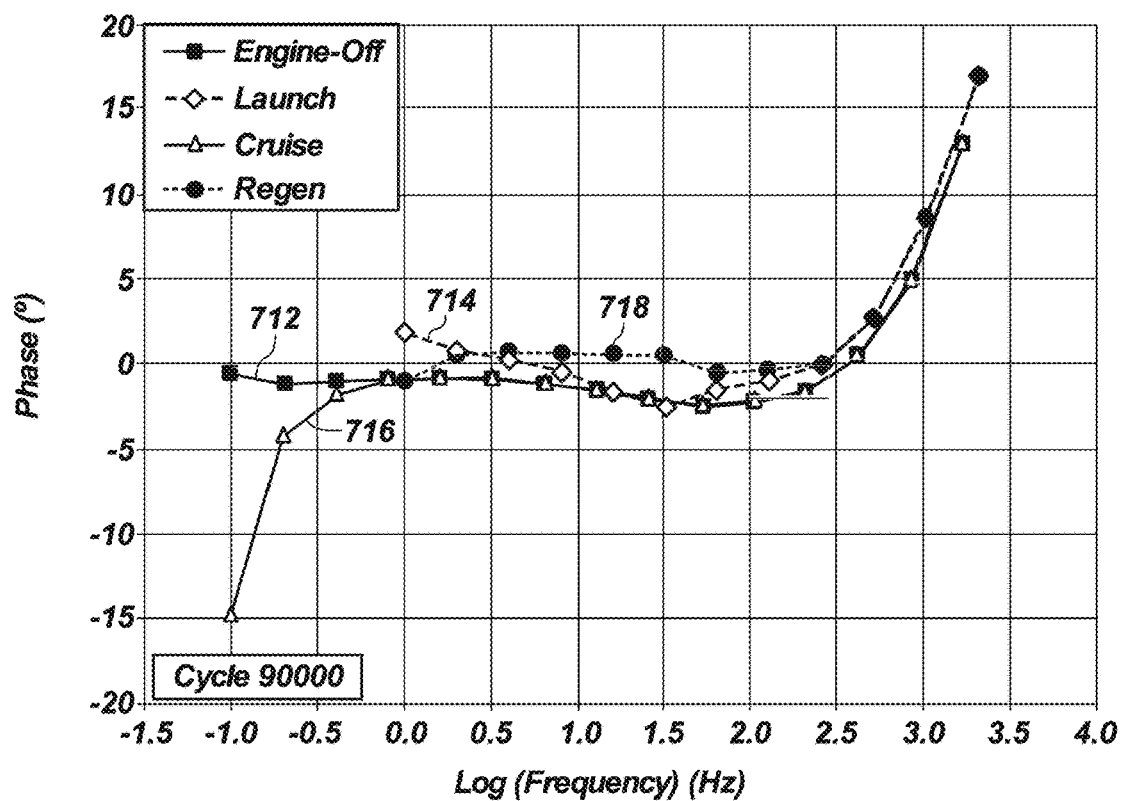

FIGS. 7A and 7B illustrate impedance spectra as Bode plots for a battery under constant power load showing magnitude and phase, respectively.

FIG. 7A show Bode magnitude plots under various constant power loads. Curve 702 is for a light constant power discharge (i.e., an Engine off pulse). Curve 704 is for a heavy constant power discharge (i.e., a Launch pulse). Curve 706 is for a light constant power charge (i.e., a Cruise pulse). Curve 708 is for a heavy constant power charge (i.e., a Regen pulse). Note that Curves 702 and 706 are 10 second measurements and Curves 704 and 708 are 1 second measurements.

The curves for the four pulses are very similar at high frequencies but start splitting apart with reducing frequency. The response of the charge pulses (i.e., Cruise and Regen) mirrors the corresponding discharge pulses (i.e., Engine-Off and Launch), which may be because the input current from the cycle-life test is in the opposite direction.

At 1 Hz (i.e., $\log(1)=0$ on the x-axis), the high power pulses (i.e., Launch 704 and Regen 708) show a very large separation in magnitude response since only one period is included in the HCSD input signal. However, the separation between the low power pulses (i.e., Engine-Off 702 and Cruise 706) at the same frequency is significantly smaller. Although 1 Hz is not an octave harmonic of the low-power pulses, the closest harmonic frequency (i.e., 0.8 Hz) had four periods within the input sum-of-sines signal.

FIG. 7B show Bode phase plots under various constant power loads. Curve 712 is for a light constant power discharge (i.e., an Engine Off pulse). Curve 714 is for a heavy constant power discharge (i.e., a Launch pulse). Curve 716 is for a light constant power charge (i.e., a Cruise pulse). Curve 718 is for a heavy constant power charge (i.e., a Regen pulse). Note that Curves 712 and 716 are 10 second measurements and Curves 714 and 718 are 1 second measurements. The curves for the phase response of all four pulses within the cycle-life profile is generally similar. Thus, it appears that one way to reduce corruption of an impedance measurement under load is to apply multiple periods of the lowest frequency. This approach, however, only works if the load duration is sufficiently long enough to support a longer excitation signal.

Figure 8A:
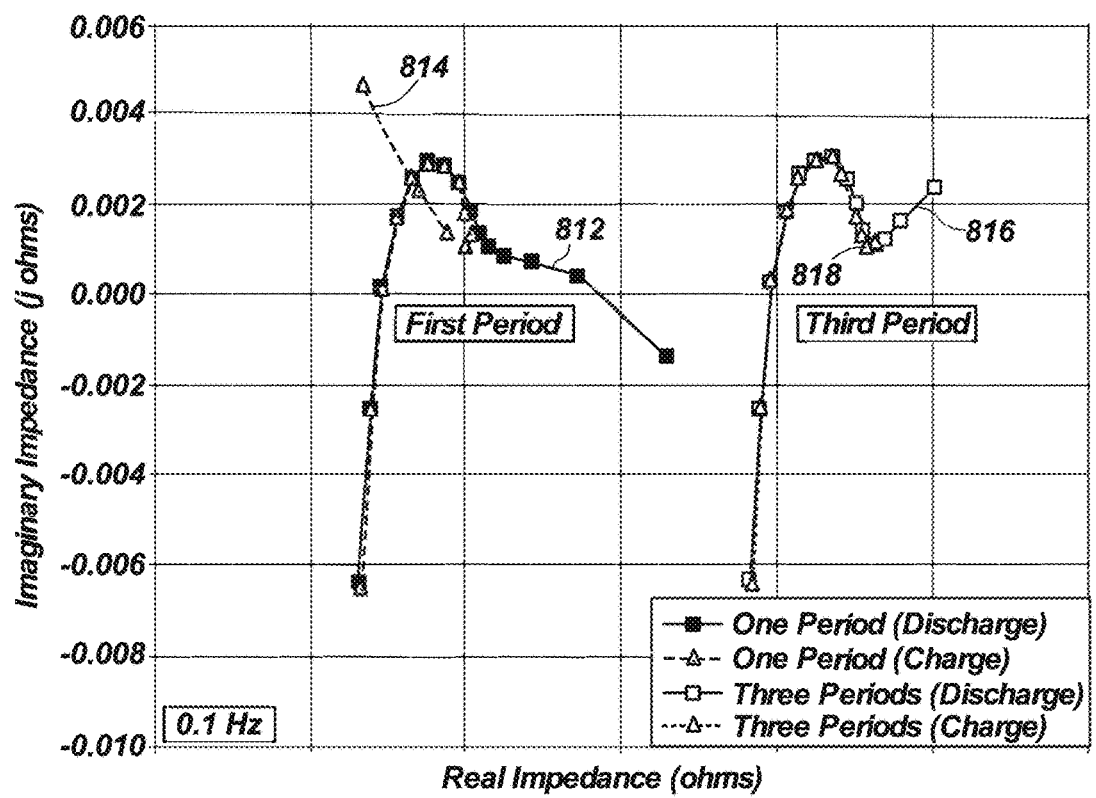
FIG. 8A illustrates discharge and charge impedance spectra Nyquist curves with multiple periods.

To demonstrate this, FIG. 8A illustrates discharge and charge impedance spectra Nyquist curves with multiple periods. The HCSD excitation signal used is between 0.1 and 1638.4 Hz for a li-ion cell. Curve 812 is for the HCSD excitation signal measured under a discharge load with one period of the lowest frequency for the HCSD excitation signal. Curve 814 is for the HCSD excitation signal measured under a charge load with one period of the lowest frequency for the HCSD excitation signal. Curve 816 is for the HCSD excitation signal measured under a discharge load with three periods of the lowest frequency for the HCSD excitation signal. Curve 818 is for the HCSD excitation signal measured under a charge load with three periods of the lowest frequency for the HCSD excitation signal. For visual clarity, the resulting spectra from the third period of the lowest frequency were artificially shifted to the right on the real axis (i.e., no labels on the horizontal axis).

The spectra based on one period of the lowest frequency behaves similarly to previously observed results (i.e., FIGS. 6A and 6B). The discharge curve 812 still shows a skewed Warburg tail and the impedance of the charge curve 814 veers towards the left at low frequencies, as expected.

When the number of periods is increased to three, however, the angle of the Warburg tail for the discharge curve 816 increases, and more closely resembles the measured results under no-load conditions (see FIG. 1). Additionally, the semicircle loop on the charge curve 818 is significantly diminished with three periods of the lowest frequency (i.e., the measured charge impedance essentially doubles back on itself at lower frequencies instead of veering towards the left).

Figure 8B:
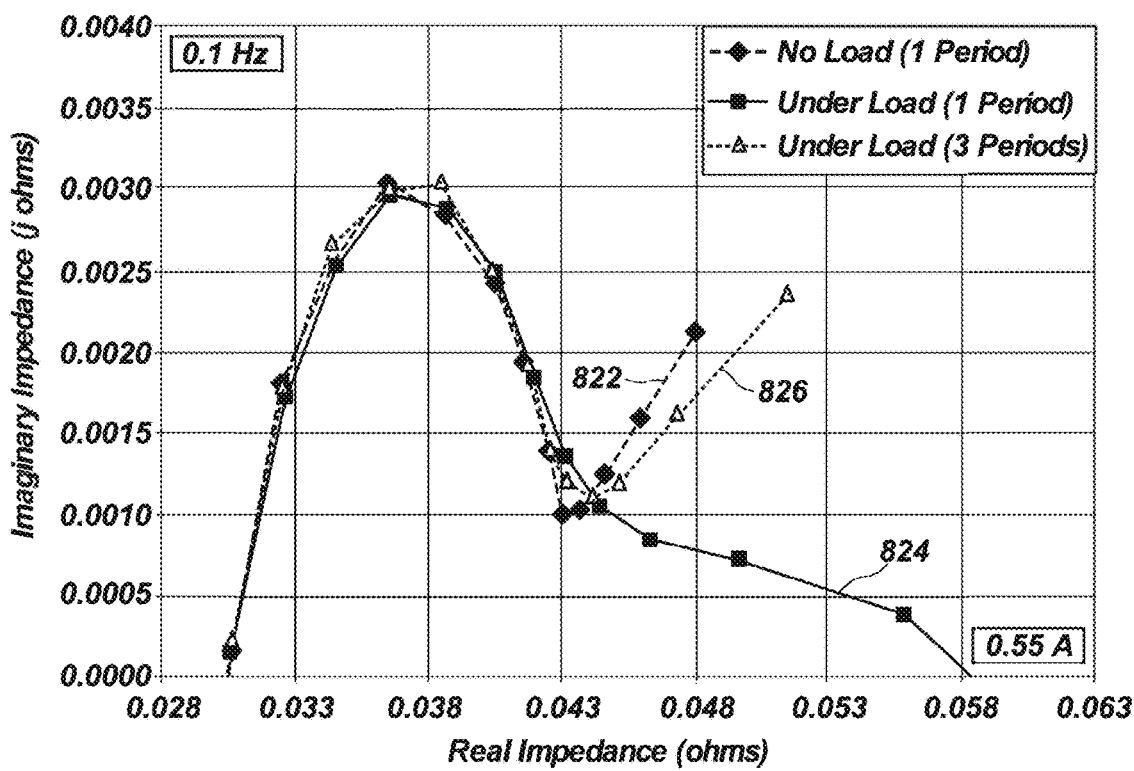
FIG. 8B illustrates discharge impedance spectra Nyquist curves with multiple periods.

FIG. 8B illustrates impedance spectra Nyquist curves under a discharge load with multiple periods. The HCSD excitation signal used is between about 0.1 to about 1638.4 Hz for a li-ion cell. Curve 822 is for the HCSD excitation signal measured under no load with one period of the lowest frequency. Curve 824 is for the HCSD excitation signal measured under a discharge load with one period of the lowest frequency. Curve 826 is for the HCSD excitation signal measured under a discharge load with three periods of the lowest frequency. The under-load HCSD spectra (curves 824 and 826) were normalized to the no-load HCSD spectrum (curve 822) for better comparisons.

The semicircle width appears relatively constant since the inflection point between the semicircle and Warburg impedance seems to occur at the same spot. The angle of the Warburg tail also increases with three periods of the lowest frequency, as expected. Thus, these data indicate the charge transfer resistance can be successfully measured under load despite the corruption introduced by the battery load.

These results demonstrate that increasing the number of periods of the lowest frequency of the excitation signal improve the measured impedance spectrum under load conditions. Although it is true that the steady-state corruption is averaged away with more periods, the under-load corruption is present for the full duration of the time record. To understand what is happening mathematically, the load response (a decaying exponential in the case of a battery response) is brought to the frequency domain with the same duration as the excitation response. Thus, for only one period of the lowest frequency, the fundamental frequency of the load response is the same as the excitation response, so the impact just adds. If two or more periods of the lowest frequency are used, the fundamental harmonic of the load corruption is reduced by the increasing number of periods. Since they are harmonic with the lowest frequency of the excitation response, they are rejected by the synchronous detection. Additionally, since Fourier components typically roll off by 1/N, their overall impact is reduced. The higher frequencies in the excitation response are either harmonic with the exponential (thus rejected), or averaged by the increasing number of periods of that frequency in the excitation response or the roll off of the 1/N impact.

It should also be noted that in some embodiments, additional periods may not be practical for in-situ applications and may not be necessary to generate results that more closely resembles the measured results under no-load conditions. Moreover, it may be possible to obtain suitable results with samples including less than a full period of the lowest frequency in the excitation signal. As a non-limiting example, Time CrossTalk Compensation (TCTC) is robust enough to use sample data over less than one period of the lowest frequency because it is an overdetermined system. Thus, if a measurement under no-load conditions is corrupted by a load at some point during the excitation signal, the rest of the measurement under no load conditions may still be useful for getting a valid no-load spectrum once the loaded portion is appropriately truncated. Research with the TCTC method has shown that portions of the response signal data could possibly be truncated (e.g., up to 40% depending on noise levels, etc.) while still successfully reconstructing the impedance spectrum. Truncating the signal may also help reduce some of the corruption effects observed due to a load (e.g., FIGS. 6A and 6B).

Figure 9A:
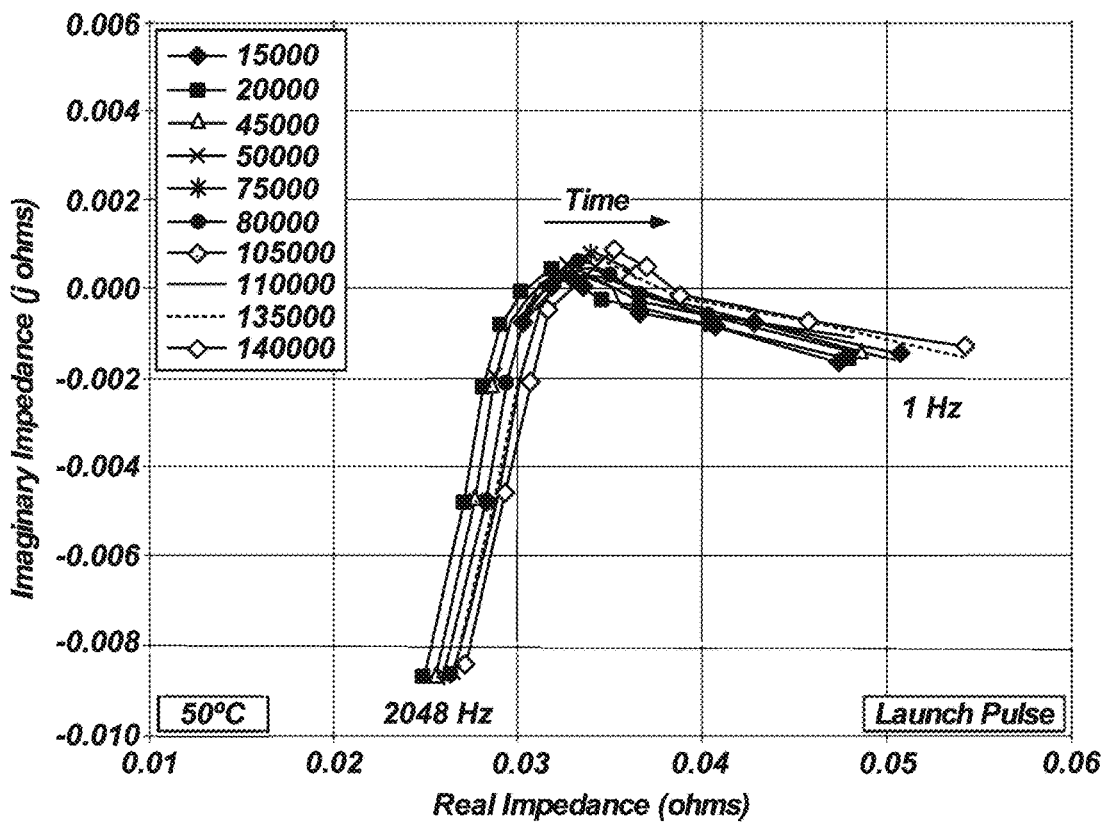
FIGS. 9A and 9B illustrate impedance spectra Nyquist curves as a function of time for a heavy constant power discharge load and a heavy constant power charge load, respectively.
Figure 9B:
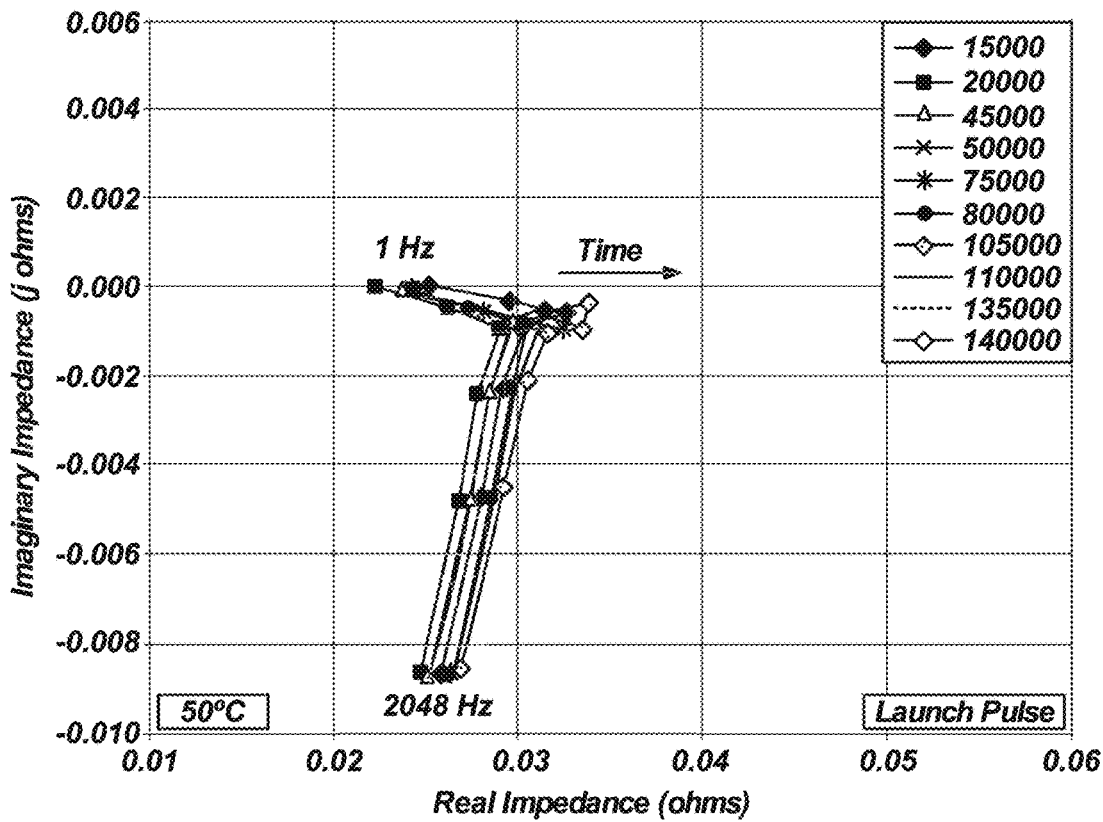

FIGS. 9A and 9B illustrate impedance spectra Nyquist curves as a function of time for a heavy constant power discharge load and a heavy constant power charge load, respectively.

In FIG. 9A the impedance spectra from various heavy discharge power pulses (i.e., Launch) over time during aging are shown for a representative cell at 50° C. For clarity, the individual curves have not been assigned element numbers, but one can see the charge transfer resistance shows definitive growth with increasing cycle count. In addition, the semicircle grows in both the real and imaginary components as a function of cell age. Similar results are observed for the light discharge power pulses (i.e., Engine Off).

In FIG. 9B the impedance spectra from various heavy charge power pulses over time during aging for a representative cell at 50° C. For clarity, the individual curves have not been assigned element numbers, but one can see the spectra for charge pulses (i.e., Regen) also show growth by an increase in the size of the mid-frequency loop. This growth appears to occur mostly after the loop begins to curve downward (i.e., the area where the discharge and charge spectra still overlap), but not much change is observed once the spectra begin to veer towards the left. Similar results are observed for the light charge power pulses (i.e., Cruise).

Figure 10A:
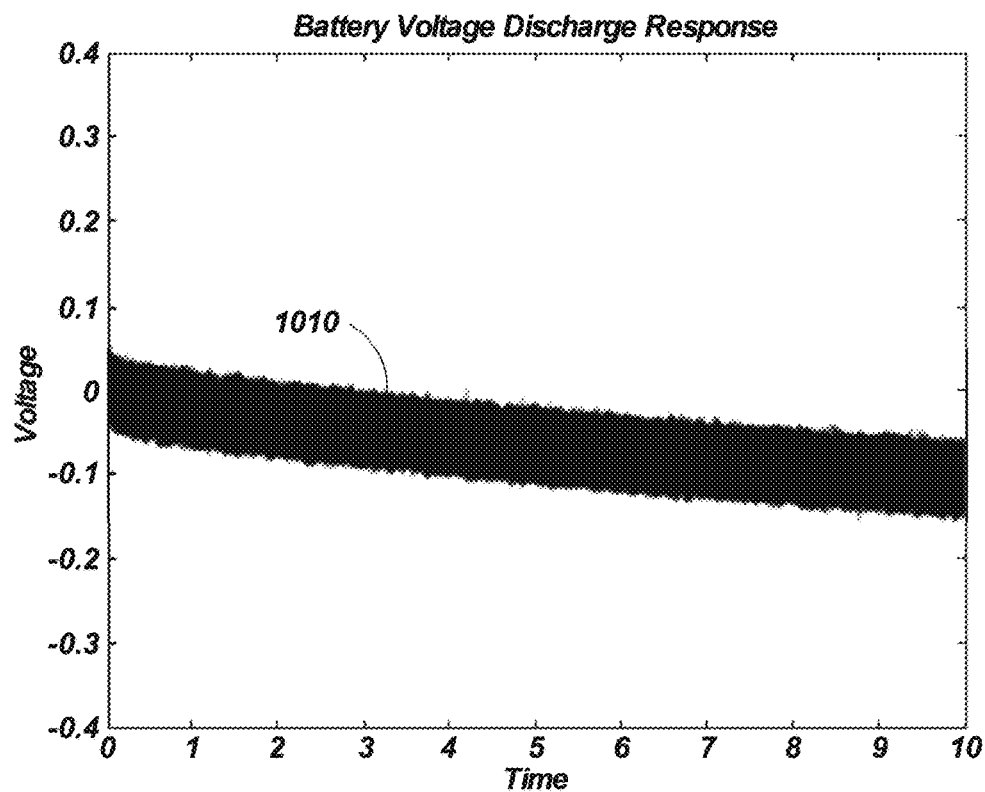
FIGS. 10A and 10B illustrate battery voltage responses during a discharge period and a charge period, respectively.
Figure 10B:
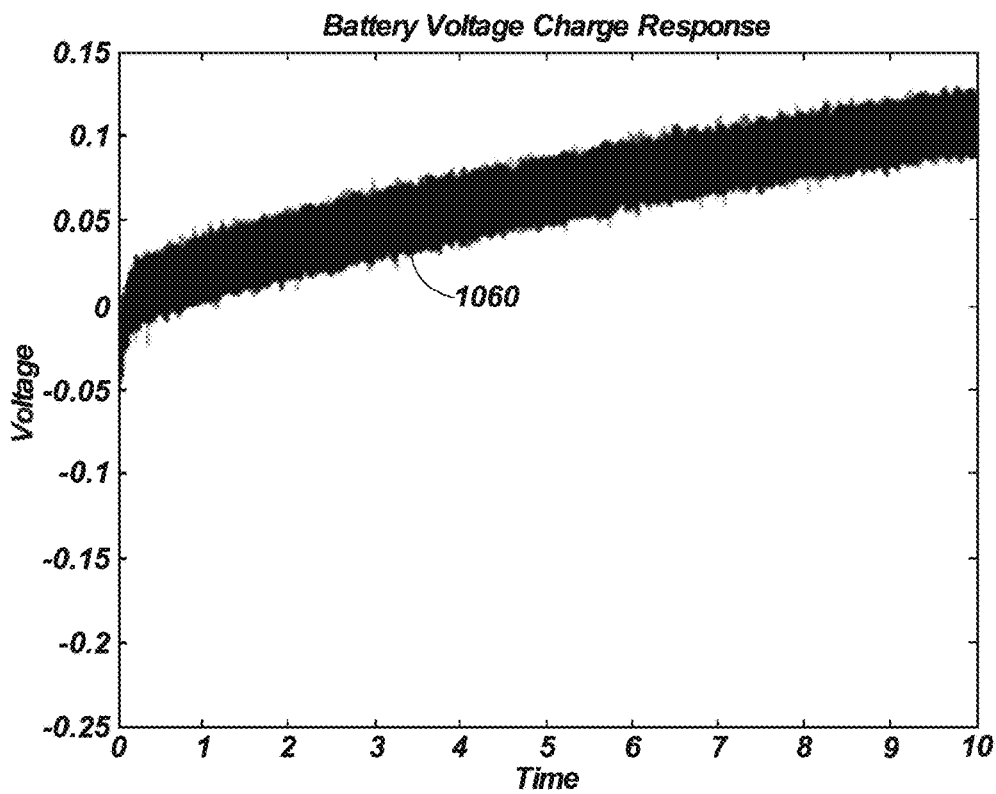

Thus, impedance spectra under load conditions can be used for diagnostic and prognostic purposes since the changes with respect to age and use are quantifiable. It has also been shown that increasing the number of periods in the excitation signal helps to reduce the observed corruption due to the load. However, in many cases, it may not be practical to increase the number of periods. For example, the Launch pulse in FIG. 3A is only 3 seconds long, which makes it difficult to implement more than 1 period of a 1 second HCSD measurement. Another approach is to use only one period of the excitation signal and mathematically remove the corruption due to the load prior to performing an impedance analysis FIGS. 10A and 10B illustrate battery voltage responses during a discharge period and a charge period, respectively (i.e., an example load 290 from FIG. 2). FIG. 10A illustrates a time record 1010 showing the response of a li-ion cell to a discharge current pulse and FIG. 10B illustrates a time record 1060 showing the response of a li-ion cell to a charge current pulse. It can be observed that the response predominantly looks like a first order exponential system. This response is similar to the step response of an RC circuit, which is typically used to model battery pulse behavior.

Figure 11A:
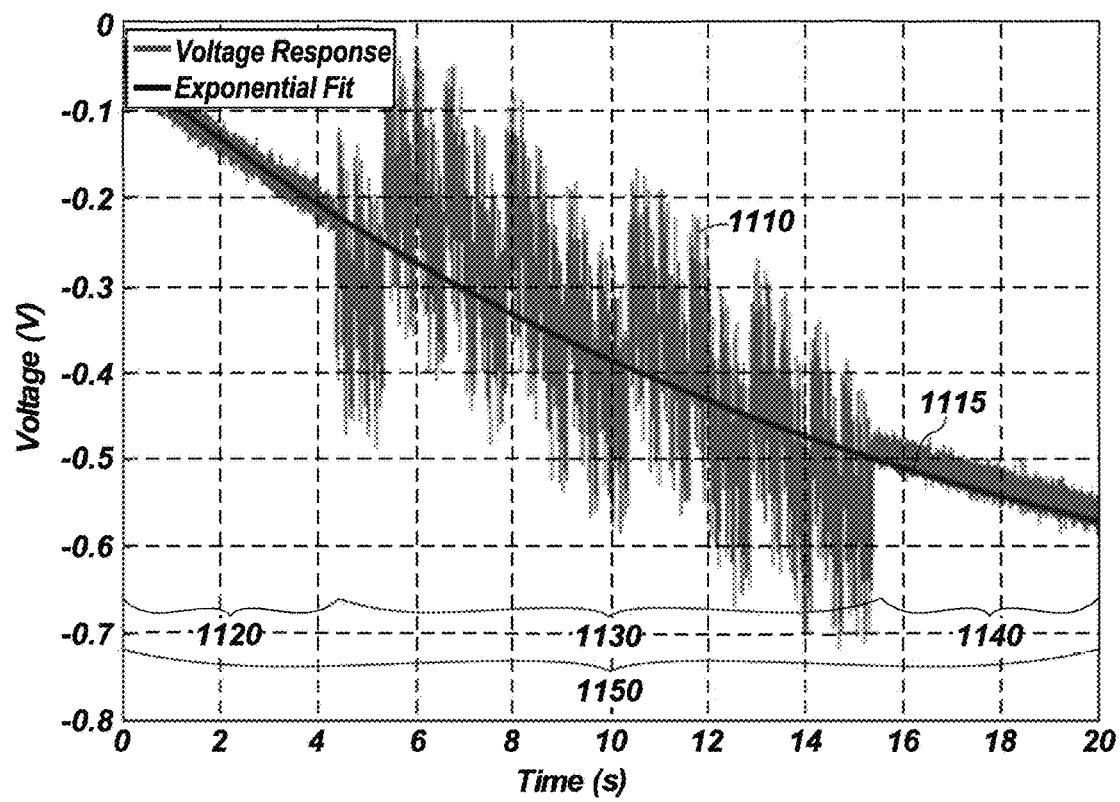
FIGS. 11A and 11B illustrate battery voltage responses with an excitation signal applied to the battery during a discharge period and a charge period, respectively.
Figure 11B:
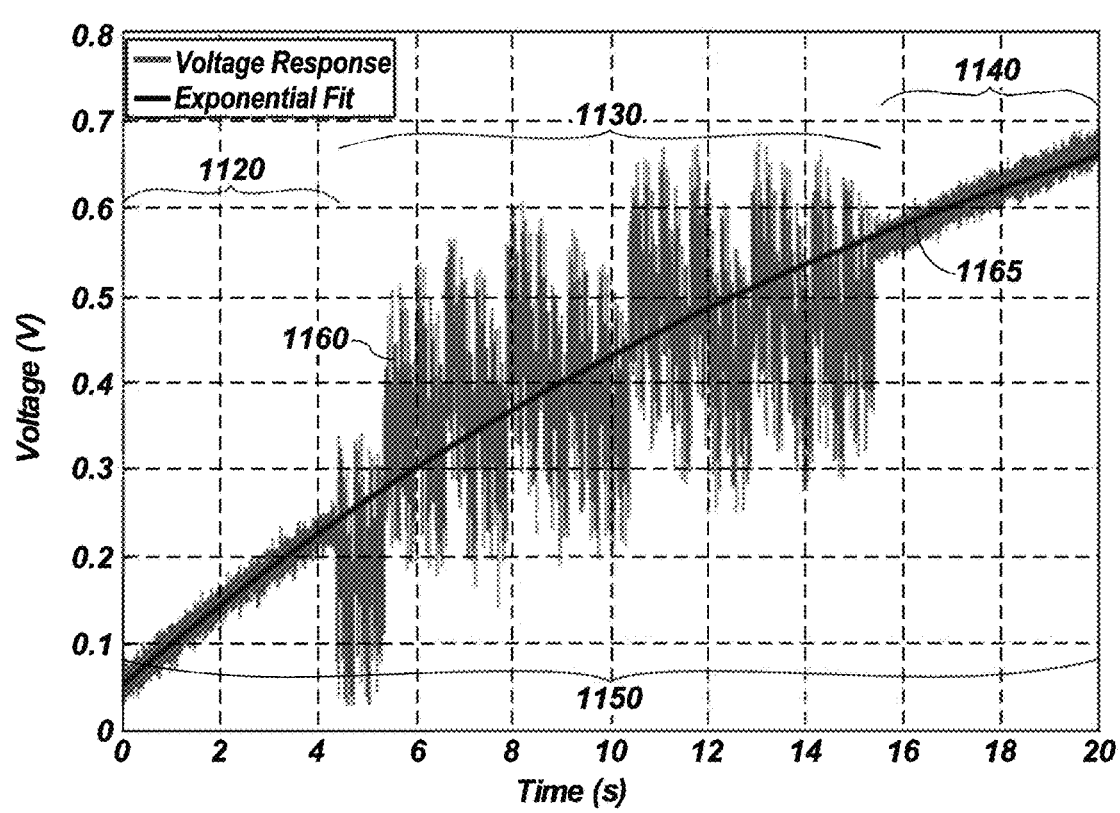

FIGS. 11A and 11B illustrate battery voltage responses with an excitation signal applied to the battery during a discharge period and a charge period, respectively.

FIG. 11A shows a measurement time record 1110 under a discharging load condition and FIG. 11B shows a measurement time record 1160 under a charging load condition. The measurement time records may also be referred to as sample time records. The curves 1110 and 1160 of FIGS. 11A and 11B are similar to the curves 1010 and 1060 of FIGS. 10A and 10B except along with a battery response to a load condition a battery response to a multispectral excitation signal can also be seen on a center portion of the measurement time records 1110 and 1160.

Each of FIGS. 11A and 11B include measurement time records (1110 and 1160) over a sample time period 1150 (also referred to herein as a sampling window 1150). Within the sampling window 1150, an in-band interval 1130 shows an excitation time period where the battery response is to both the load condition and the multispectral excitation signal. Immediately before the in-band interval 1130 is a pre-band interval 1120 showing the battery response to the load condition before the multispectral excitation signal is applied to the battery. Similarly, immediately after the in-band interval 1130 is a post-band interval 1140 showing the battery response to the load condition after the multispectral excitation signal is removed from the battery.

Thus, FIGS. 11A and 11B show the battery response to the multispectral excitation signal that is corrupted by the battery response to the load condition. Embodiments of the present disclosure remove the corruption due to the load condition to create a battery response to the multispectral excitation signal that resembles a battery response in an unloaded condition.

In other words, to create uncorrupted spectra measurements for an under-load battery, embodiments of the present disclosure remove the voltage response component due to the battery load from the total battery response, which is a combination of the response to multispectral excitation signal and the response to the load current.

As stated earlier, the battery voltage response to the load condition is very much like a charging or discharging RC circuit. The step response of such a first order system is given by the exponential expression:

$$X(t) = X_{SS} + (X_{IN} - X_{SS})e^{-\frac{t}{\tau}} \qquad (1)$$

Where: X(t) is the desired signal (voltage or current) within the RC circuit
$X_{IN}$: is the initial value of the desired signal
$X_{SS}$: is the steady state value of the desired signal
τ: is the time constant of the RC circuit in seconds
t: is the time, independent variable in the RC circuit in seconds A curve fitting technique, such as, for example, linear regression can be used for the estimate of the battery response to the load condition. Equation 1 can be used to fit both charge load conditions and discharge load conditions.

FIG. 11B is a battery under a charge load and the correction for charge load condition is considered first. The curve fit will be obtained by processing the combination of the pre-band interval measurements 1120 and the post-interval measurements 1140 form the measurement time record 1160. Equation 1 is rearranged for processing as a charge load condition yielding Equation 2 as:

$$X(t_i) = X_{SS} + (X_{IN} - X_{SS})e^{-\frac{t_i}{\tau}} \qquad (2)$$
$$(X(t_i) = X_{SS}) + (X_{IN} - X_{SS})e^{-\frac{t_i}{\tau}}$$
$$-(X_{SS} - X(t_i)) = -(X_{SS} - X_{IN})e^{-\frac{t_i}{\tau}}$$
$$(X_{SS} - X(t_i)) = -(X_{SS} - X_{IN})e^{-\frac{t_i}{\tau}}$$

Equation 2 is in a form that can be processed by linear regression. The unknown constants are: $X_{IN}$, $X_{SS}$, and the time constant τ. Equation 2 is really a system of N equations where N is the length of the measurement time record for $X(t_i)$. As a non-limiting example, an initial estimate for $X_{SS}$ may be obtained by averaging the last 10 measurement points in the post-band interval 1140 of the measurement time record 1160. A natural logarithm operation is performed on both sides of Equation 2, which is really an array of equations, and then put in matrix form to yield Equation 3 as:

$$Ln((X_{SS} - X(t_i))) = Ln\left((X_{SS} - X_{IN})e^{-\frac{t_i}{\tau}}\right) \qquad (3)$$

$$[Ln((X_{SS} - X(t_i)))]_{N\times 1} = \left[Ln(X_{SS} - X_{IN}) - \frac{t_i}{\tau}\right]_{N\times 1}$$

$$[Ln((X_{SS} - X(t_i)))]_{N\times 1} = [1, -t_i]_{N\times 2}\begin{bmatrix} Ln(X_{SS} - X_{IN}) \\ \frac{1}{\tau} \end{bmatrix}_{2\times 1}$$

$$\{[1, -t_i]'_{2\times N}[1, -t_i]_{N\times 2}\}^{-1}[1, -t_i]'_{2\times N}[Ln((X_{SS} - X(t_i)))]_{N\times 1} =$$

$$\begin{bmatrix} Ln(X_{SS} - X_{IN}) \\ \frac{1}{\tau} \end{bmatrix}_{2\times 1}$$

$$\begin{bmatrix} Ln(X_{SS} - X_{IN}) \\ \frac{1}{\tau} \end{bmatrix}_{2\times 1} =$$

$$\{[1, -t_i]'_{2\times N}[1, -t_i]_{N\times 2}\}^{-1}[1, -t_i]'_{2\times N}[Ln(X_{SS} - X(t_i))]_{N\times 1}$$

Using the results from Equation 3, Equation 1 can be assembled and compared as the mathematical expression, which is a curve 1165 fit to the pre-band samples and the post-band samples of the measurement time record 1160.

A similar derivation can be performed for the discharge load condition of FIG. 11A, where $X_{SS}$ is expected to be lower than X(t) over the given time period. Equation 4 shows the rearranged form of Equation 1 for the discharge and Equation 5 shows the corresponding matrix form used for the curve fitting.

$$(X(t_i) - X_{SS}) = (X_{IN} - X_{SS})e^{-\frac{t_i}{\tau}} \qquad (4)$$

$$\begin{bmatrix} \ln(X_{IN} - X_{SS}) \\ 1/\tau \end{bmatrix}_{2\times 1} = \qquad (5)$$

$$\{[1, -t_i]'_{2\times N}[1, -t_i]_{N\times 2}\}^{-1}[1, -t_i]'_{2\times N}[\ln(X(t_i) - X_{SS})]_{N\times 1}$$

Using the results from Equation 5, Equation 1 can be assembled and compared as the mathematical expression, which is a curve fit 1115 to the pre-band samples and the post-band samples of the measurement time record 1110.

Recall that $X_{SS}$ was estimated as the last 10 samples of the measurement time record (1110 and 1160). To obtain a better fit, the $X_{SS}$ term may include an adjustment factor.

Figure 12:
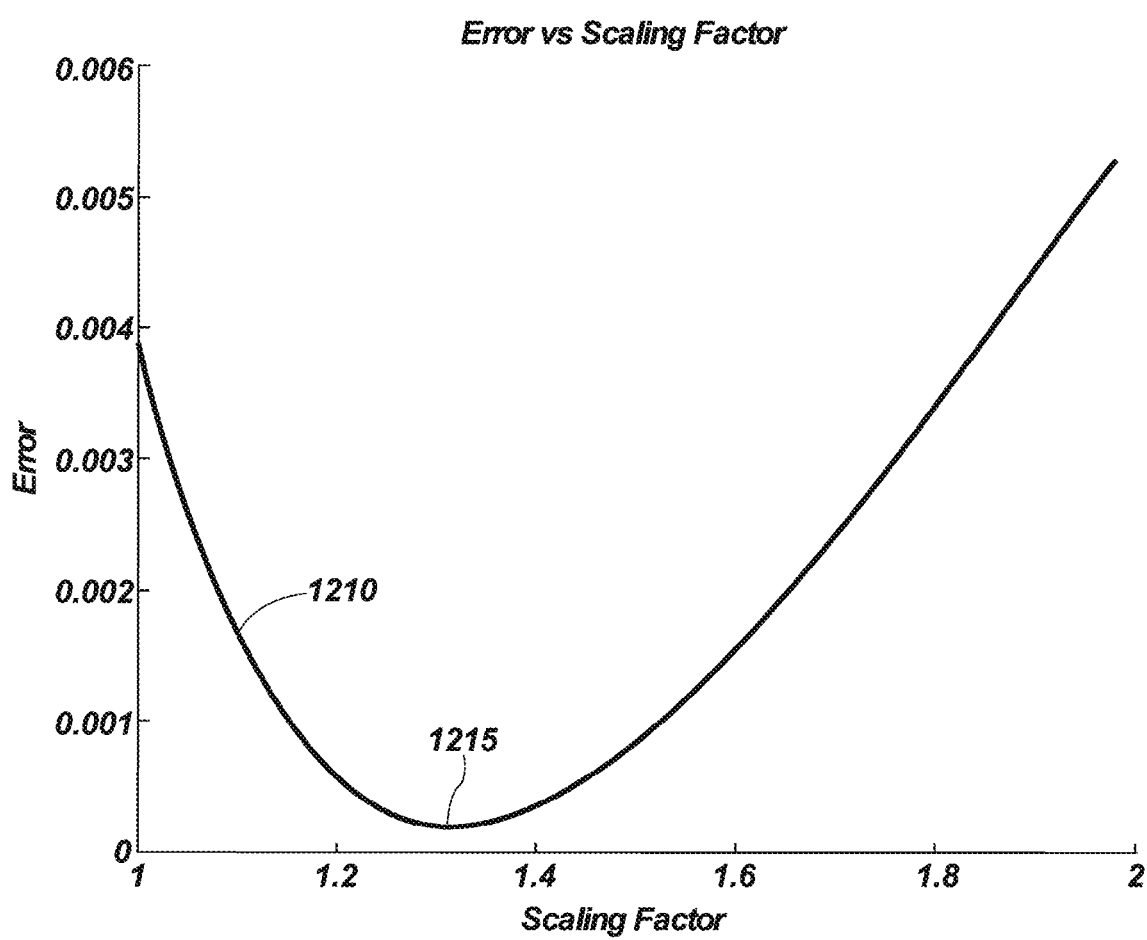
FIG. 12 illustrates an optimization curve using mean-square-error calculations on an exponential expression.

FIG. 12 illustrates an optimization curve using mean-square-error optimization on the exponential expression. The curve 1210 illustrates error in the curve fit relative to the adjustment factor. The exponential expression can be repeatedly recomputed while varying the adjustment factor and applying a mean-square-error computation to the curve fit. As can be seen, an adjustment factor of about 1.35 applied to the term $X_{SS}$ yields an optimized fit of the exponential expression to the pre-band samples and the post-band samples of the measurement time record 1110.

Returning to FIGS. 11A and 11B, a quality of the curve fit may be affected by the number of samples used, as well as position of those samples. As a result, some embodiments may be configured such that the out-of-band intervals (e.g., the pre-band interval 1120 and the post-band interval 1140) include at least as many samples as samples for the in-band interval 1130. Some embodiments may also be configured such that the number of samples in the pre-band interval 1120 and the number of samples post-band interval 1140 are substantially the same.

Some other adjustments can be made to obtain a more accurate measurement time record (1110 and 1160) and curve fit. Referring to FIG. 2 along with FIGS. 11A and 11B, the battery voltage acquired by the IMD 210 can be configured as a differential voltage whereby the battery voltage just prior to the initiation of a measurement is measured and converted to a constant analog signal that is subtracted within the signal conditioner 230 from the time varying battery voltage. This buck voltage adjustment allows the bits of resolution of the analog-to-digital process to be focused on the battery response to the multispectral excitation signal rather than the full battery voltage.

The measurement time records 1010 and 1060 of FIGS. 10A and 10B show an initial perturbation at the beginning of the charge or discharge current pulse. Removal of this perturbation can be obtained by discarding some of the measurement from the pre-band interval 1120 or shifting the sampling window 1150 past the initial perturbation such that the IMD 210 does not begin taking samples until a predetermined time after a new load pulse begins.

With respect to curve fitting, the curve fit was optimized for the $X_{SS}$ term. Other embodiments may use other variables, or a combination of variables, within the exponential expression for optimization. For example, after finding an optimized $X_{SS}$ term, the time constant $\tau$ may be varied with adjustment factors and mean-square-error calculations. Also, other optimization processes may be used to find an optimized adjustment factor for these other terms.

In some embodiments alternative models may be used to fit the response data. For example, more complex equivalent circuit models could be used to estimate the response, where different mathematical expressions are used and at least one element is used to adjust the fit. Also, other analysis methods may be used to fit the data such as auto-regression moving averages, Kalman filters, neural nets, etc.

Once the curve fit is complete, the resulting exponential expression can be used to estimate the exponential response that is mostly due to the load during the in-band interval 1130. The estimate may then be subtracted from the captured response signal during the in-band interval 1130. The result can then be brought into the frequency domain for analysis.

Figure 13A:
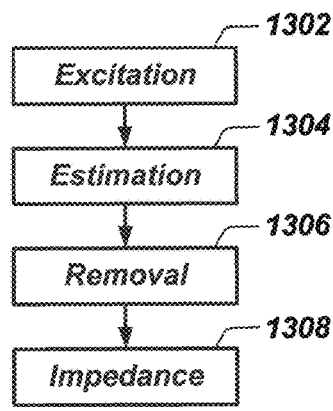
FIGS. 13A and 13B are flowcharts of measurement processes for a high-level process and a more detailed process, respectively.
Figure 13B:
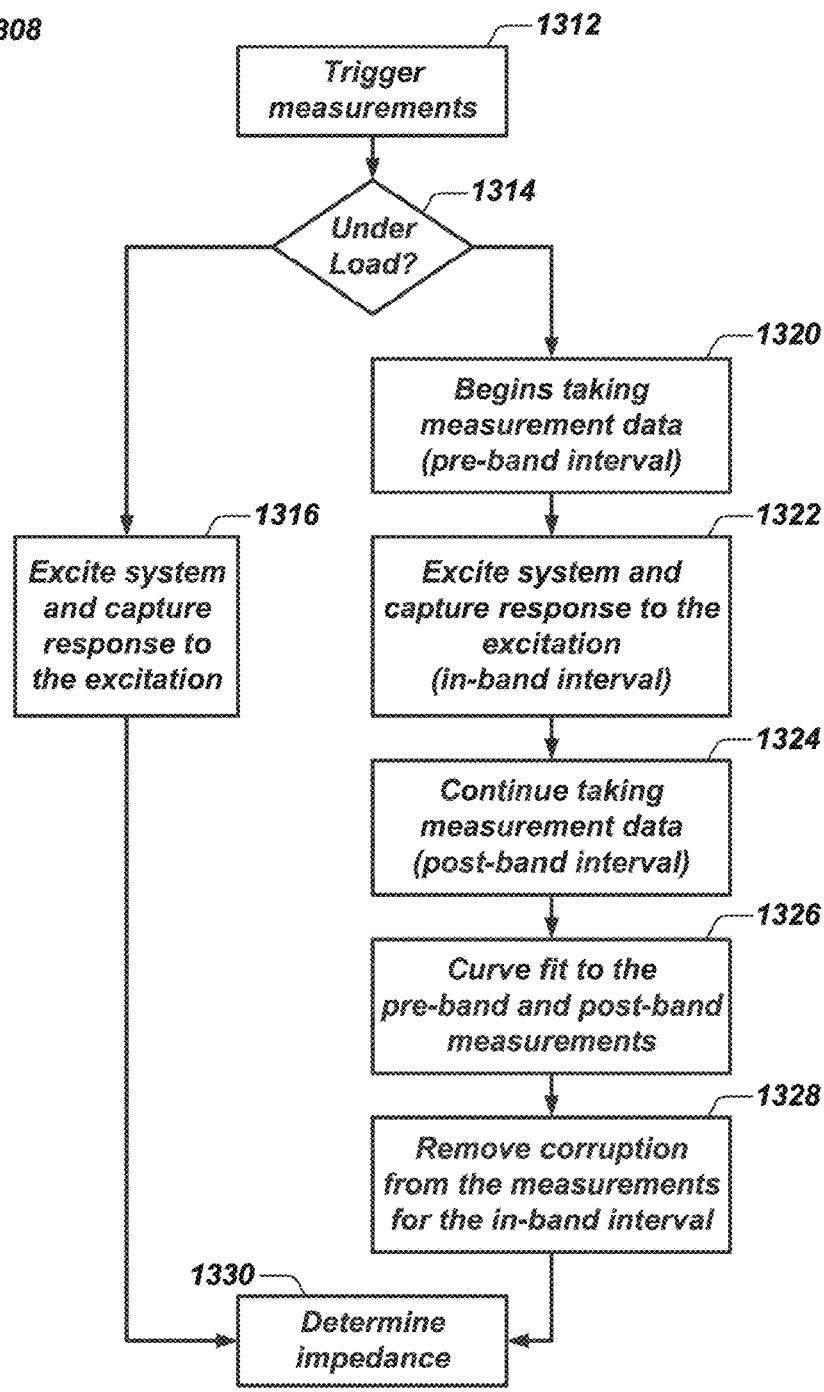

FIGS. 13A and 13B are flowcharts of measurement processes for a high-level process and a more detailed process, respectively. Reference will also be made to FIGS. 2, 11A, and 11B during the discussion of the flowcharts.

For the high-level overview of FIG. 13A, in operation 1302 the IMD 210 applies the multispectral excitation signal 235 to the battery 280. During that excitation, the IMD 210 also captures a response signal.

While most of the discussion is focused on batteries, the DUT can include any energy storage device or energy consuming device that exhibits a measurable impedance (e.g., a super-capacitor, a resistor, an RLC network), or other applications that exhibit a response to a multispectral excitation signal.

In addition, most of the discussion is focused on sum-of-sines (SOS) signals and SOS impedance analysis of responses to the SOS signals. However, other excitation and analysis methods can be used, such as, for example, sequential application of sinusoidal signals with different frequencies, non-sinusoidal excitation methods (e.g., noise, square waves, triangle waves, etc.), galvanostatic excitation methods, and potentiostatic excitation methods.

In operation 1304, a mathematical expression is created as an estimate of the DUT response to the load condition. Non-limiting examples of estimation methods include; exponential step response analysis, equivalent circuit models (e.g., lumped parameter models, etc.), data-based fits (e.g., fuzzy logic, Kalman filters, etc.), and physics-based fits (e.g., based on electrochemical knowledge, etc.).

In operation 1306, the response to the load condition is removed from the measurement time record, which includes the response to the combination of the load condition and the signal excitation. As non-limiting examples, the load condition may be steady (i.e., constant current, constant power, etc.) or it could be variable (e.g., step change from charge to discharge, etc.). Non-limiting examples of removal methods include; post-measurement (capture the response with load and then remove the bias estimation after measurement completion), real time (if the load response is well known or well modeled, real-time estimation and elimination of the load can be conducted as the excitation signal is conducted), real time with correction (real time elimination of the load response with a correction factor applied after the completion of the measurement to remove any excess corruption).

In operation 1308, impedance of the DUT is calculated based on the known excitation signal and captured response signal. Impedance calculation methods include; SOS analysis, other sinusoidal analysis (Fourier analysis, etc.), non-sinusoidal analysis (fuzzy logic, Kalman filters, etc.), galvanostatic analysis, and potentiostatic analysis.

FIG. 13B illustrates details of the overview method of FIG. 13A. Many of these details may be directed to the non-limiting example of exponential curve fitting to a SOS excitation signal as illustrated in FIGS. 11A, 11B, and 12.

At operation 1312, an impedance measurement is triggered. Measurements may be initiated for many reasons, such as, for example; regular diagnostic checks, detection of unsafe conditions, thermal management, cell balancing, detection of a favorable load condition for the type of analysis being performed, as well as other triggers for energy storage and non-energy storage applications. Note that as part of the triggering mechanism, the excitation signal is also appropriately adjusted based on known or anticipated load levels and durations.

Before or after the trigger 1312, decision block 1314 determines whether the DUT is under load. If not, in operation block 1316 the DUT is excited and the response is captured for analysis. As discussed earlier, as part of this operation a bias condition may be captured and removed with the assumption the bias is relatively constant (e.g., a fixed bias voltage) with a buck voltage. After the response is captured, operation block 1330 determines the impedance of the DUT as discussed below.

If the DUT is under load, operation block 1320 indicates the pre-band interval 1120 samples are captured. These samples may include such parameters as voltage, current, temperature, etc. The type of load condition the DUT is exposed to may be different (e.g., (constant, pulse, variable, noisy, etc.). In addition, the direction of the load may be different (e.g., charge, discharge, etc.). The magnitude of the load may impact the level of the excitation signal and if the magnitude during the sampling window will be within a known range, the magnitude may be compensated for with a buck voltage as discussed above.

In operation block 1322, a multispectral excitation signal 235 is applied to the DUT and, at the same time, the response of the DUT is captured. The response during this in-band interval will include the response to the load condition and the excitation signal 235. As discussed with reference to operation block 1306, the excitation signal 235 can be a variety of different signals.

Operation block 1324 indicates the post-band interval 1120 samples are captured after removal of the excitation signal 235. These samples may include such parameters as voltage, current, temperature, etc. The point at which measurement taking begins (operation block 1320) and ends (operation block 1324) to create the sampling window 1150 can be varied. For example, the data acquisition system 240 may be continually sampling the captured signal data 246, and the samples received by the computing system 220 are discarded or analyzed for other purposes (e.g., recognizing a desirable load condition). In such cases, the beginning of the pre-band interval and end of the post-band interval could be defined as points where the samples that are being continuously taken are saved and/or used specifically for the impedance analysis according to embodiments of the present disclosure. In other embodiments, the computing system 220 may trigger the data acquisition system 240 to begin taking samples and stop taking samples at specific times to create the sampling window 1150. In any case, the computing system 220 generates timing indicators for the sampling start time, the sampling end time, as well as the start and end times of the stimulus signal such that it can easily determine the various intervals (e.g., 1120, 1130, 1140, and 1150) as well as other useful timing information for impedance analysis.

At operation block 1326 the process performs a curve fit of the pre-band and post-band measurements to a mathematical expression. As a non-limiting example, the mathematical expression may be an exponential expression modeling a step response to an equivalent circuit model (e.g., lumped parameter models, etc.) of the DUT. While the pre-band measurements, the post-band measurements, or a combination thereof are used to perform the curve fit, the resulting curve also includes the time period during the sampling window (i.e., the excitation time period).

At operation block 1328 corruption of the in-band samples due to the load condition is removed. To perform this removal of in-band corruption, the mathematical expression is analyzed at the same point in time as the point that each of the in-band samples were captured to arrive at a set of in-band corruption elements. Then, the corresponding in-band corruption elements may be subtracted from the in-band samples to arrive at adjusted samples for a measurement time record during the in-band interval.

Finally, at operation block 1330, whether from a loaded or unloaded condition, the measurement time record may be analyzed using an appropriate analysis technique relative to the excitation signal to determine the impedance of the DUT. As a non-limiting example, for an SOS signal the measurement time record including the adjusted samples may be converted to a frequency domain representation, calibrated if needed, and the frequency domain representation may be analyzed with an SOS analysis process to determine impedance of the DUT.

Note that these flowcharts represent one embodiment of the present disclosure, where the load response is removed at the completion of the measurement. Variations to timing of the process elements, such as real-time mitigation, are not shown here but can be performed.

Moreover, curve fitting of the mathematical expression may include different combinations of out-of-band samples including pre-band samples and post-band samples. Thus, some embodiments may fit the mathematical expression to only pre-band samples with no need for post-band samples and some embodiments may fit the mathematical expression to only post-band samples with no need for pre-band samples. In addition, there may be out-of-band samples between excitation time periods within the sampling window such that in some embodiments the curve fitting could be performed on out-of-band samples in the middle of the sample window and the resulting curve can be used to remove the corruption from in-band samples at the beginning, the end, or both ends of the sampling window.

Determining an impedance spectrum relies on an assumption of steady-state sinusoidal excitation. With a TCTC-based excitation signal (i.e., a type of SOS) and analysis approach, it may be possible to disregard up to about 40% of the response signal samples to meet the assumption of steady-state sinusoidal excitation. The in-band samples, however, must still be adjusted to remove the corruption from the load as well. Thus, a valid no-load spectrum may be obtained even though the samples used for the analysis include less than a full period of the lowest frequency of sample data.

Furthermore, the corrected spectrum under load may better meet the assumption of steady-state conditions when using the TCTC excitation method. Research has shown that discarding the initial samples of the response signal (e.g., up to 40% of the beginning of the response signal) after removing the load corruption can still yield a valid spectrum. Accordingly, if TCTC is used as the excitation signal, a block could be added between steps 1328 and 1330 in FIG. 13B where a portion at the beginning of the TCTC response signal is disregarded (e.g., truncated) to better meet the steady-state assumption. Thus, a valid no-load spectrum may be obtained even though the samples used for the analysis include less than a full period of the lowest frequency of sample data.

Additionally, if it is determined that there is no load on the DUT at operation block 1314, out-of-band samples could still be acquired to verify the presence of no load at predetermined times or prior to executing a measurement at operation block 1316. If, however, the out-of-band samples indicate an exponential response (e.g., a decaying exponential due to a discharge condition), the DUT may be experiencing internal leakage due to developing an internal short. This could be used to signal warnings that the DUT has some safety and/or stability issues. Note that out-of-band measurements for assessing internal leakage could be performed at any time.

Moreover, if it is determined that there is no load on the DUT at operation block 1314, the process could still proceed down to operation block 1316 by collecting in-band samples under no-load conditions. If the resulting impedance spectrum determined at block 1330 reveals any corruption (e.g., at the low-frequency end with a change in the Warburg tail angle as shown in FIG. 8B), the corruption would likely be due to the DUT rather than a load since this is a no-load condition. This also could be an indication that the DUT may be experiencing internal leakage due to developing an internal short. Data anomalies in the impedance spectrum could be used to signal warnings that the DUT has some safety and/or stability issues. Furthermore, the detection of safety and/or stability issues (through out-of-band sampling and/or corrupted impedance spectrum measurements under no-load conditions) could be communicated to a battery management system (BMS) to adjust power levels or shutdown (depending on the severity and frequency of events) for more effective operation and control.

In addition, the various operations in the process flow may be performed by different computing systems. For example, as discussed above with reference to FIG. 2, the computing system may include a local computing system and a remote computing system and operations of the process may be distributed between these systems.

In such systems and as a non-liming example, the local computing system may focus on processes such as application of the multispectral excitation signal, control of the data acquisition system 240, and the timing associated with these processes. The remote computing system may focus on determination of the type of stimulus signal to use as well as generation of the stimulus signal to be sent to the local computing system. The remote computing system may also perform the corruption removal and impedance analysis processes. As a non-limiting example, such distributed systems may be used in systems where an embedded microcontroller and data acquisition system can perform functions near the battery, but may not have the computing power or accuracy to perform some of the other elements of the process.

Figure 14A:
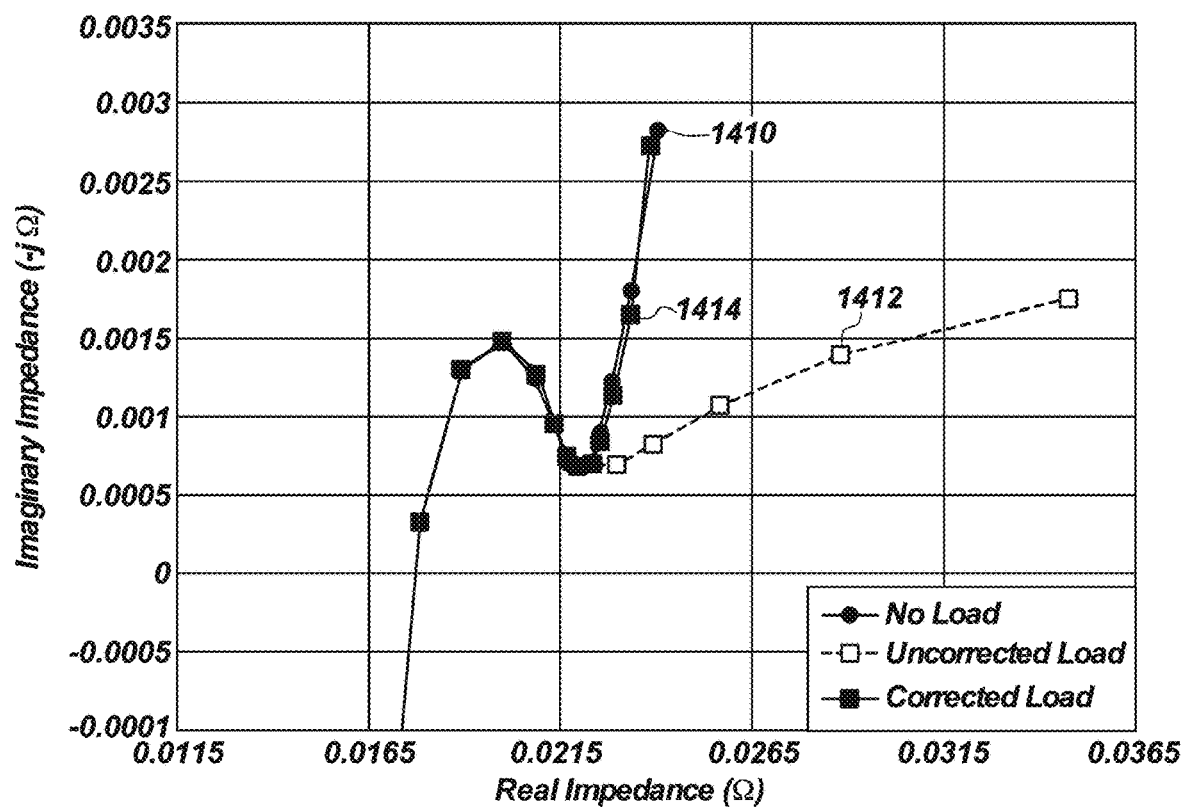
FIGS. 14A and 14B illustrate corrupted and corrected impedance spectra Nyquist curves for a 500 mA discharge load and a 3 A discharge load, respectively.
Figure 14B:
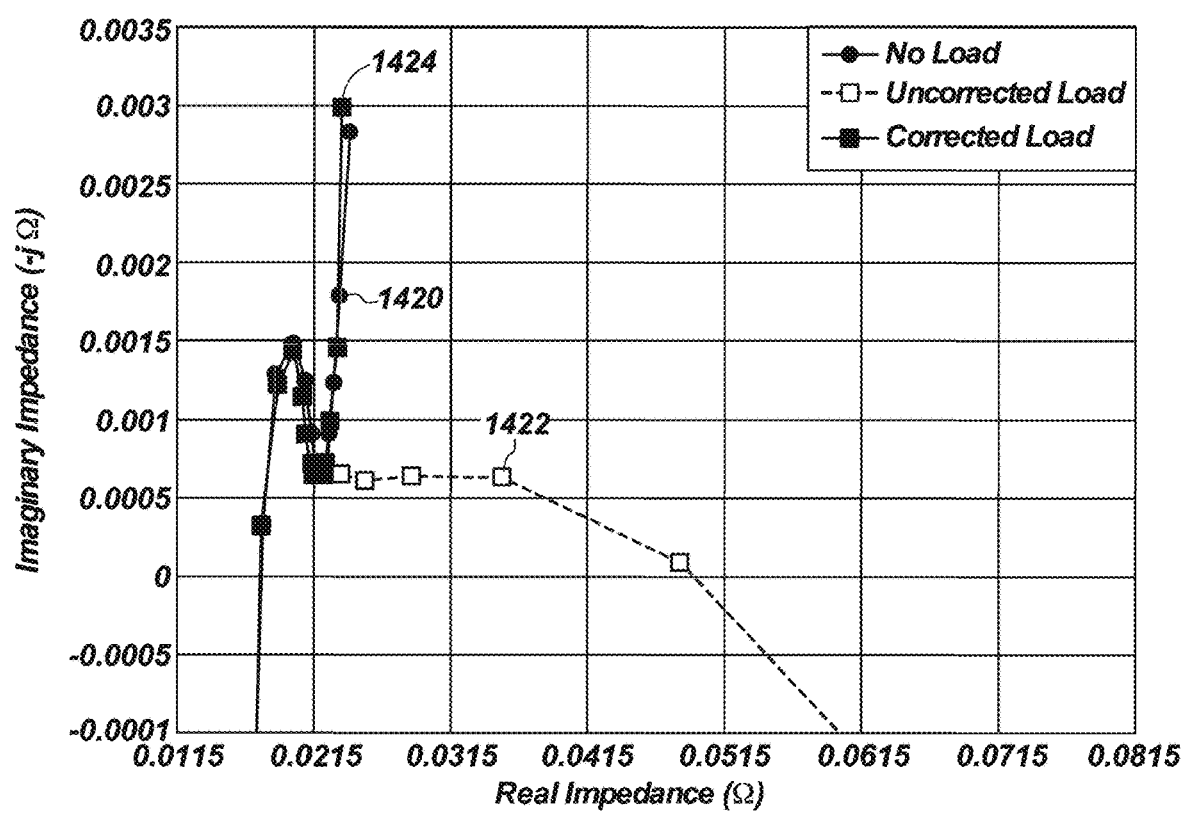

FIGS. 14A through 14B illustrate measurement and analysis results for an embodiment of the present invention illustrating the effectiveness and accuracy of the process of FIG. 13B. FIGS. 14A and 14B illustrate corrupted and corrected impedance spectra Nyquist curves for a 500 mA discharge load and a 3 A discharge load, respectively.

In FIG. 14A, a corrupted impedance spectrum 1412 and a corrected impedance spectrum 1414 are shown along with an unloaded impedance spectrum 1410 (i.e., a no-load condition). For the corrupted impedance spectrum 1412, li-ion cells were placed under discharge load currents at about 500 mA with a superimposed HCSD excitation signal. The impedance under no load conditions was measured immediately prior to the discharge pulse.

The corrupted impedance spectrum 1412 shows similar characteristics to the Engine-Off pulse response illustrated in FIG. 4A. Once the exponential response from the load current is removed, however, the corrected impedance spectrum 1414 is nearly identical to the unloaded impedance spectrum 1410 captured under equilibrium conditions.

In FIG. 14B, a corrupted impedance spectrum 1422 and a corrected impedance spectrum 1424 are shown along with an unloaded impedance spectrum 1420 (i.e., a no-load condition). For the corrupted impedance spectrum 1422, li-ion cells were placed under discharge load currents at about 3 A with a superimposed HCSD excitation signal. The impedance under no load conditions was measured immediately prior to the discharge pulse.

The corrupted impedance spectrum 1422 shows similar characteristics to the Launch pulse response illustrated in FIG. 4B. Once the exponential response from the load current is removed, however, the corrected impedance spectrum 1424 is nearly identical to the unloaded impedance spectrum 1420 captured under equilibrium conditions.

Figure 15A:
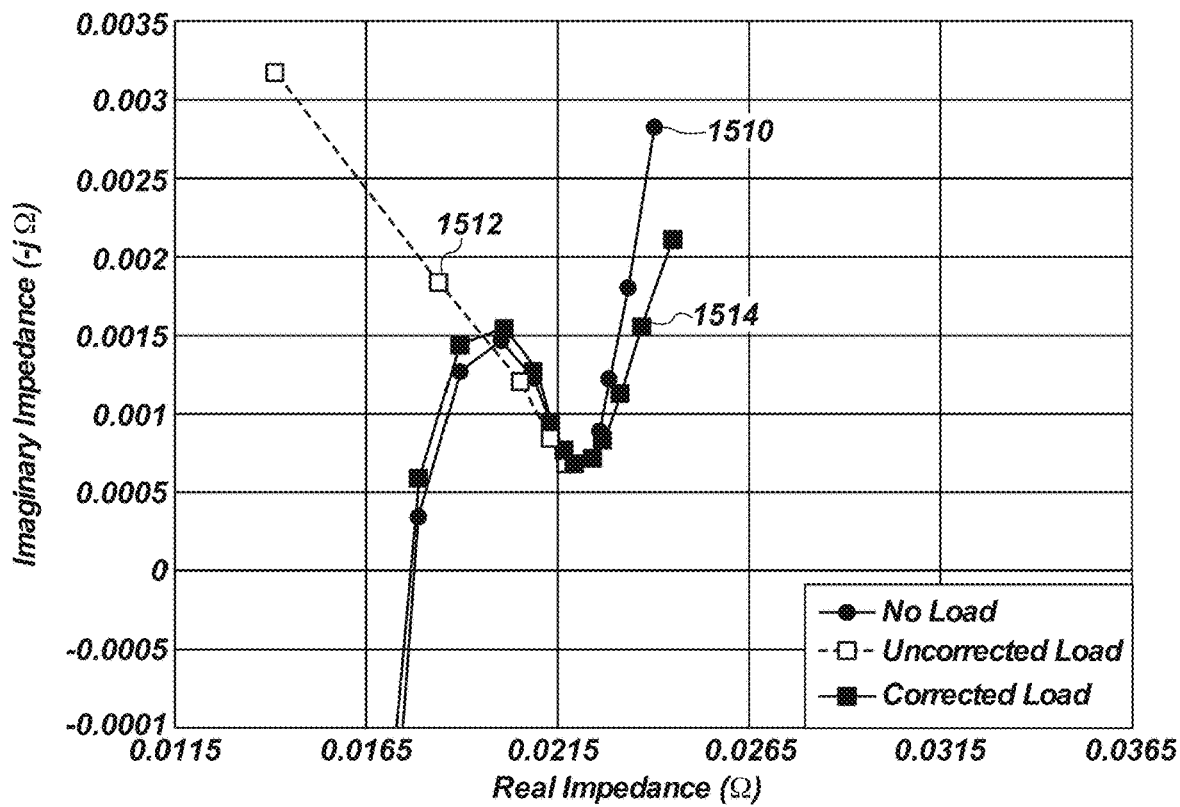
FIGS. 15A and 15B illustrate corrupted and corrected impedance spectra Nyquist curves for a 500 mA charge load and a 3 A charge load, respectively.
Figure 15B:
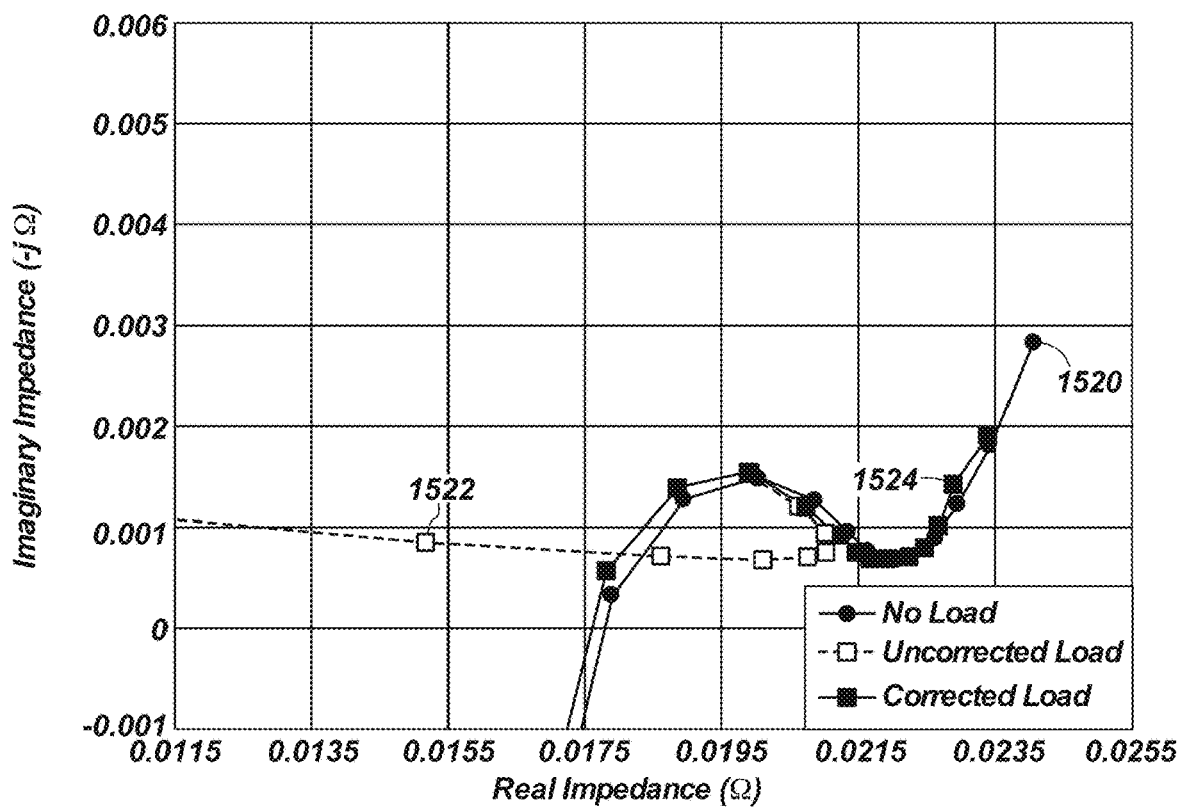

FIGS. 15A and 15B illustrate corrupted and corrected impedance spectra Nyquist curves for a 500 mA charge load and a 3 A charge load, respectively. In FIG. 15A, a corrupted impedance spectrum 1512 and a corrected impedance spectrum 1514 are shown along with an unloaded impedance spectrum 1510 (i.e., a no-load condition). For the corrupted impedance spectrum 1512, li-ion cells were placed under charge load currents at about 500 mA with a superimposed HCSD excitation signal. The impedance under no load conditions was measured immediately prior to the charge pulse.

The corrupted impedance spectrum 1512 shows similar characteristics to the Cruise pulse response illustrated in FIG. 5A, including the semicircle loop. Once the exponential response from the load current is removed, however, the corrected impedance spectrum 1514 closely matches the unloaded impedance spectrum 1510 captured under equilibrium conditions. There is some minor deviation at the Warburg tail still. The corruption detection may be improved by detecting the charge pulse and inverting the SOS signal to a negative SOS signal to reduce any transient effects from opposing currents.

In FIG. 15B, a corrupted impedance spectrum 1522, a corrected impedance spectrum 1524 are shown along with an unloaded impedance spectrum 1520 (i.e., a no-load condition). For the corrupted impedance spectrum 1512, li-ion cells were placed under charge load currents at about 3 A with a superimposed HCSD excitation signal. The impedance under no load conditions was measured immediately prior to the charge pulse.

The corrupted impedance spectrum 1522 shows similar characteristics to the Regen pulse response illustrated in FIG. 5B, including the semicircle loop. Once the exponential response from the load current is removed, however, the corrected impedance spectrum 1524 closely matches the unloaded impedance spectrum 1520 captured under equilibrium conditions. There is some minor deviation at the Warburg tail still. The corruption detection may be improved by detecting the charge pulse and inverting the SOS signal to a negative SOS signal to reduce any transient effects from opposing currents.

Figure 16A:
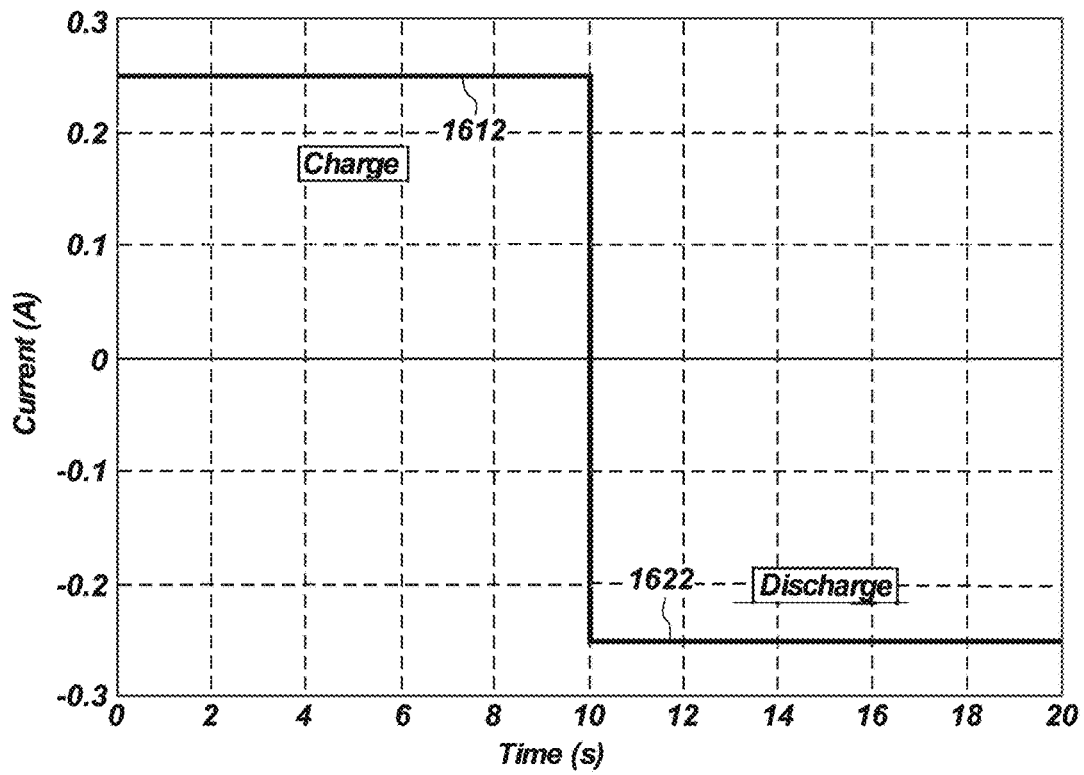
FIG. 16A illustrates a scenario with a variable load condition where a charge load condition is immediately followed by a discharge load condition.

FIG. 16A illustrates a scenario with a variable load condition where a charge load condition 1612 is immediately followed by a discharge load condition 1622. In this case, there is a charge/discharge profile, but other scenarios could include charge to rest, discharge to rest, rest to charge, rest to discharge, etc. Note that the transition between the variable loads (i.e., when the load switches from charge to discharge) must be known so that a different exponential fit (or other suitable mathematical expression) can be used for the charge load condition 1612 and the discharge load condition 1622. This transition time can typically be known a priori or determined from other sources (e.g., battery management system data).

Figure 16B:
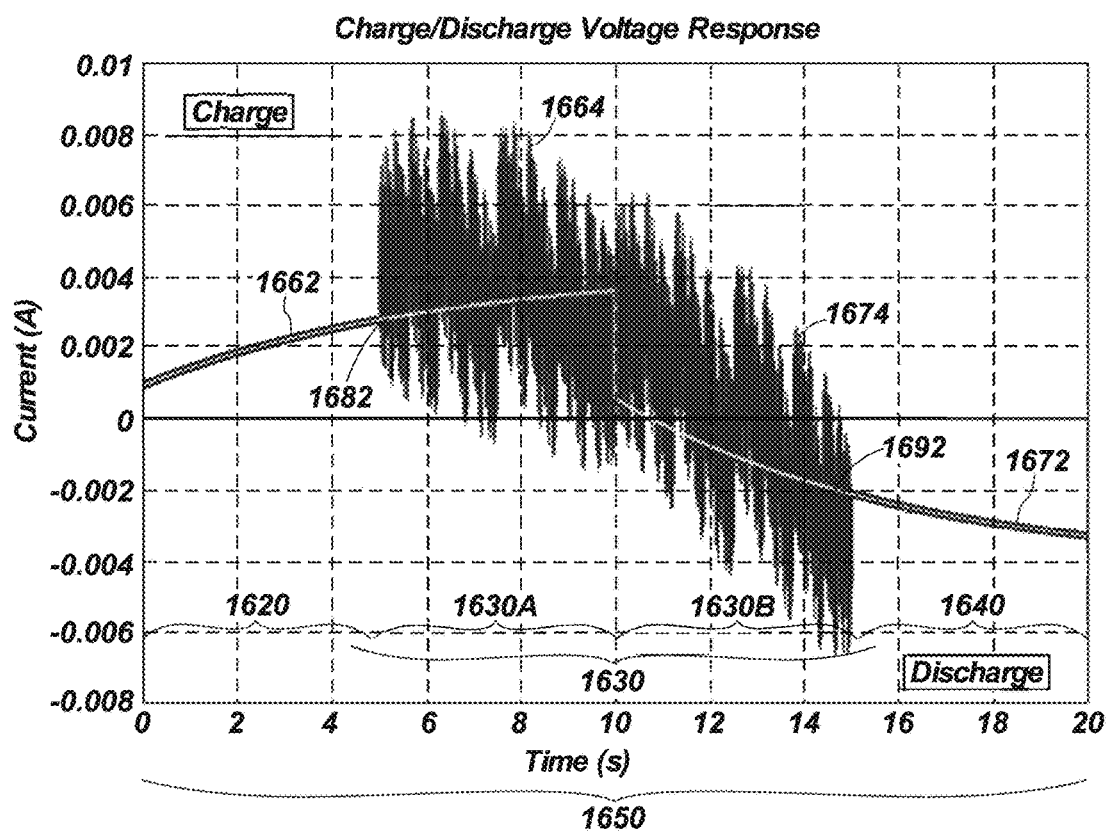
FIG. 16B shows a response of the battery to an excitation signal during the variable load condition of FIG. 16A.

FIG. 16B shows a response of the battery to an excitation signal during the variable load condition of FIG. 16A. As with FIGS. 11A and 11B, FIG. 16B includes a measurement time record over a sampling window 1650. Within the sampling window 1650, an in-band interval 1630 shows an excitation time period. In a first portion 1630A of in-band interval 1630, the battery response 1664 in the measurement time record includes a response to the charge load condition and a response to the multispectral excitation signal. In a second portion 1630B of in-band interval 1630, the battery response 1674 in the measurement time record includes a response to the discharge load condition and a response to the multispectral excitation signal. Immediately before the in-band interval 1630 is a pre-band interval 1620 showing the battery response 1662 to the charge load condition before the multispectral excitation signal is applied to the battery. Similarly, immediately after the in-band interval 1630 is a post-band interval 1640 showing the battery response 1672 to the discharge load condition after the multispectral excitation signal is removed from the battery.

In this scenario, the load condition changes from a charging load condition to a discharging load condition during the in-band interval 1630. Other scenarios, not shown, may include charge to discharge, discharge to rest, charge to rest, discharge to rest to charge, charge to rest to discharge, etc. Moreover, the multispectral excitation signal may be at various times relative to the load conditions. FIG. 16B shows a pre-band interval, a stimulus interval (i.e., the in-band interval) and a post-band interval. As non-liming examples, the timing may include other combinations, such as, for example: a stimulus interval followed by a post-band interval, but no pre-band interval; a pre-band interval followed by a stimulus interval, but no post-band interval, and a stimulus interval followed by a mid-band interval with a load condition only, followed by another stimulus interval.

Different curve fitting mechanisms may be used in such scenarios to identify the load response and remove it prior to the impedance calculation. Note that the pulse transition may add transient errors in addition to the bias corruption and these transient errors may also need to be removed in the corruption removal algorithm.

In the case of FIGS. 16A and 16B, the response is corrupted by both a charge load condition and a discharge load condition, so the exponential curve fit to remove the corruption is more complicated. In this example, Equation 1 can be used to estimate the response due to the charge load condition and repeated to estimate the response due to the discharge load condition.

Figure 17A:
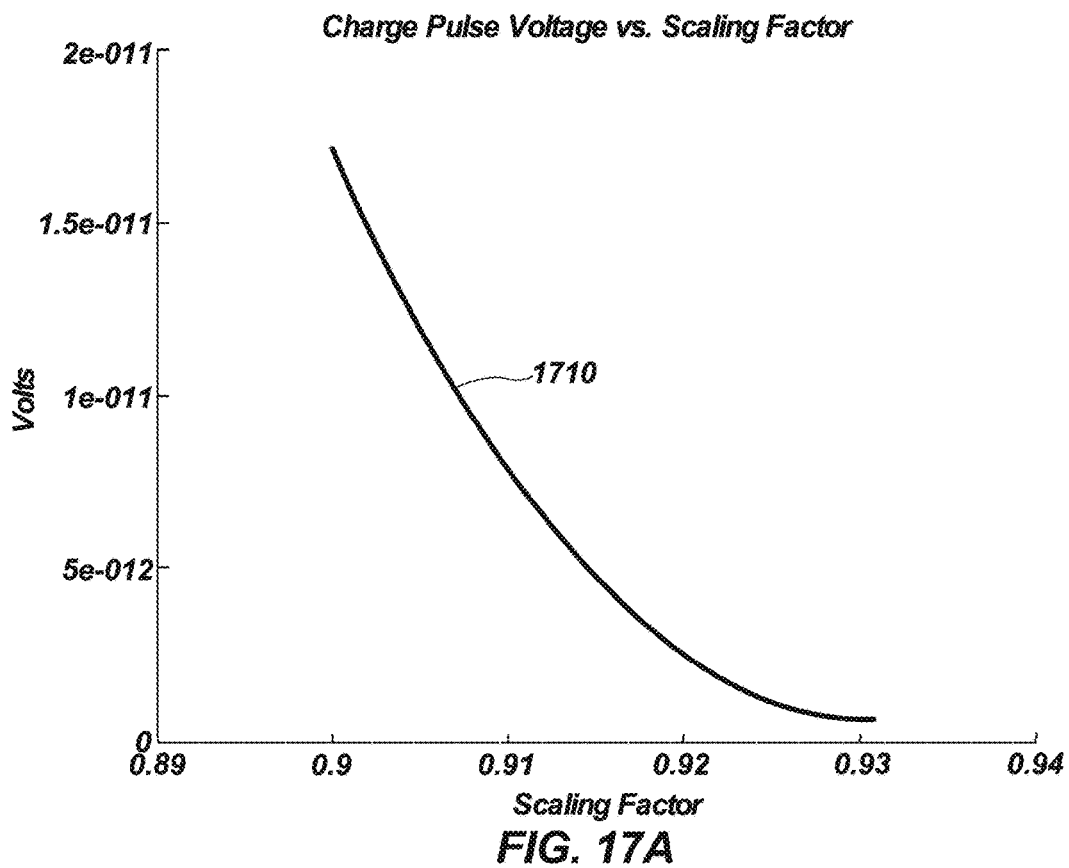
FIGS. 17A and 17B illustrate optimization curves using mean-square-error calculations on exponential expressions for the charge load condition and the discharge load conditions of FIGS. 16A and 16B, respectively.

For the charge load condition, the steady-state value (XSS) can be estimated from the measurements in the pre-band interval between the initial measurement and just before the start of the excitation signal. A single point or an average of points can be taken to fit the exponential. Since this is not the final steady state value, an adjustment factor is included and a mean-square-error optimization analysis is performed (as shown in FIG. 17A). A good initial guess could be that the final XSS value is double the value measured just before the start of the excitation (i.e., the transition between charge and discharge occurs halfway between the excitation signal). The actual XSS value will be determined based on a local minimum in the error analysis.

Figure 17B:
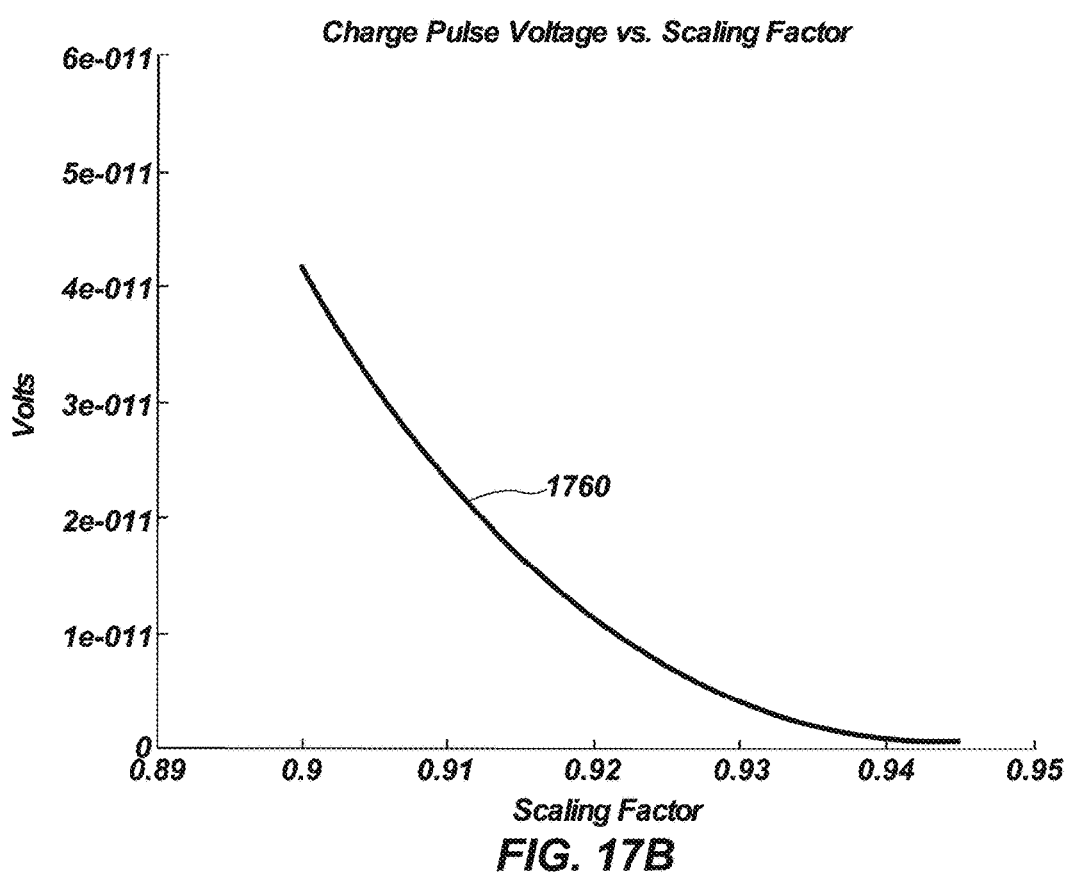

For the discharge load condition, the steady-state value (XSS) can be estimated between the initial measurement just after the excitation signal ends and at the end of the post-band interval. A single point or an average of points can be taken to fit the exponential. Since this is not the final steady state value, an adjustment factor is included and a mean-square-error optimization analysis is performed (as shown in FIG. 17B). The actual XSS value will be determined based on a local minimum in the error analysis.

Once all the parameters are determined, the resulting curve fits are shown in FIG. 16B as curve 1682 and curve 1692. Curve 1682 is during the pre-band interval 1620 and the first portion 1630A of the in-band interval. Similarly, curve 1692 is during the post-band interval 1640 and the second portion 1630B of the in-band interval. The data reflect the known transition time between charge and discharge. Curves 1682 and 1692 can be used to estimate the corruption contribution (i.e., from the load conditions), which can then be subtracted from the excitation signal to determine the impedance without the load corruption.

When the pulse transition is known a priori, the IMD 210 can plan appropriately for the transition and determine an appropriate time for the sampling window 1650. Data captured prior to and after the SOS measurements (i.e., data from the pre-band intervals and post-band intervals) should be long enough for adequate curve fitting (e.g., equal to an SOS full period or longer).

As another method, the process may use an SOS fit during a load condition that has a transition but capture sufficient data prior to and after the impedance measurements (e.g., equal to an SOS full period or longer) and have good fitting parameters such that a first exponential expression 1662 can be fit to the charging load condition using only the samples from the pre-band interval and a second exponential expression 1672 can be fit to the discharging load condition using only the samples from the post-band interval.

FIGS. 17A and 17B illustrates optimization curves using mean-square-error calculations on exponential expressions for the charge load condition and the discharge load conditions of FIG. 16B. As discussed above with reference to FIG. 12, a scaling factor is used on the XSS term of equation 1. Thus, curve 1710 illustrates the mean-square-error calculations for the curve fit during the charge load condition (curve 1682 in FIG. 16B) with a local minimum near a scaling factor of 0.93. Similarly, curve 1760 illustrates the mean-square-error calculations for the curve fit during the discharge load condition (curve 1692 in FIG. 16B) with a local minimum near a scaling factor of 0.944.

Now, with general reference to FIGS. 18 through 39, in particular embodiments, a device 280 under a load condition (whether a charging load condition or a discharging load condition) can be excited with a multispectral excitation signal 235 having an excitation time period and the response signal of the device 280 under test can be sampled over a sample time period 1150 including an in-band interval 1130 during said excitation time period disposed between out-of-band intervals 1120 and 1140 outside of the in-band interval 1130, as above described. By way of differentiation from other embodiments, the load response between the out-of-band intervals 1120 and 1140 can be corrected by a sum-of-sines approach instead of an exponential approach to correct the load response and to obtain an estimate of the load response during the in-band interval 1130. Thus, an estimate of the load response can be made without exponential fits based on iterative error reduction.

In particular embodiments, a sum of sines can, but need not necessarily, include a plurality of frequencies with the fundamental period being the basis of integer harmonics. In the illustrative examples, the response time record to be fit was the basis of ten integer harmonic frequencies; however, the illustrative examples are not intended to preclude embodiments including an adjusted fundamental period and a greater or lesser number of integer harmonic frequencies.

In the illustrative embodiments, the out-of-band intervals 1120 and 1140 were analyzed using time cross talk compensation ("TCTC"). TCTC analysis presumes a sum-of-sines signal according to the following:

$$R(t) = DC + \sum_{i=1}^{M} A_i \sin(\omega_i t + \varphi_i) =$$

$$DC + \sum_{i=1}^{M} [A_i \cos \varphi_i \sin(\omega_i t) + A_i \sin \varphi_i \cos(\omega_i t)]$$

Where: R(t) is the system response time record
DC is any measurement offset error
$A_i$ is the amplitude response of the ith frequency
$\varphi_i$ is the phase response of the ith frequency To determine the magnitude and phase of each identified frequency, the response time record (R(t)) can be multiplied by the pseudoinverse of the cross talk compensation ("CTC") matrix based on the following:

$$\underbrace{\begin{bmatrix} R(t_1) \\ \vdots \\ R(t_N) \end{bmatrix}}_{[R]_{N \times 1}} = \underbrace{\begin{bmatrix} 1 & \sin(\omega_1 t_1) & \cos(\omega_1 t_1) & \ldots & \sin(\omega_M t_1) & \cos(\omega_M t_1) \\ \vdots & \vdots & \vdots & & \vdots & \vdots \\ 1 & \sin(\omega_1 t_N) & \cos(\omega_1 t_N) & \ldots & \sin(\omega_M t_N) & \cos(\omega_M t_N) \end{bmatrix}}_{[CTC]_{N \times (2M+1)}} \underbrace{\begin{bmatrix} DC \\ A_1 \cos \phi_1 \\ A_1 \sin \phi_1 \\ \vdots \\ A_M \cos \phi_M \\ A_M \sin \phi_M \end{bmatrix}}_{[UK]_{1 \times (2M+1)}}$$

Where R(t) comprises the cumulative measured response signal, and the CTC includes all of the identified frequencies in the sum-of-sines signal. The pseudoinverse of the CTC matrix can be applied to determine the magnitude and phase and the direct current component ("DC component") of each identified frequency. A significant advantage of the TCTC analysis method can be the use in processing of a response signal including saturation and decimation, as an example, see U.S. Pat. No. 10,436,873, herby incorporated by reference herein. This allows portions of the response signal (R(t)) to be removed while prior to determining the magnitude and phase and the DC component of each identified frequency. TCTC can be applied to a response time record including the in-band interval 1130 to determine the impedance at each identified frequency based on the excitation signal. However, as illustrated in these embodiments, TCTC can also be used to curve fit a response time record based on the out-of-band intervals 1120 and 1140 to estimate a load response within the in-band interval 1130.

In the illustrative embodiments of estimating the load response with TCTC analysis, the in-band interval 1130 can be removed from the response signal of the device 280 such that R(t) only comprises the out-of-band intervals 1120 and 1140. The CTC matrix can be built based on a sum-of-sines including a fundamental period and 9 harmonics (M=10). The pseudoinverse of the CTC matrix can be applied to determine the magnitude and phase and the DC component of each identified frequency. A corrected response signal, R(t) can be computed based on the determined magnitude and phase and DC component of each identified frequency as a fit to response signal. The estimated load response based on the (R(t)) fit can then be subtracted from the in-band interval 1130.

In particular embodiments, the estimate of the load response during the in-band interval 1130 can be made by analyzing the response signal included in the out-of-band intervals 1120 and 1140 using a sum of sines analysis including a fundamental frequency having a period of duration greater than the response signal including the in-band interval 1130 and at least a portion of each of the out-of-band intervals 1120 and 1140.

Figure 18:
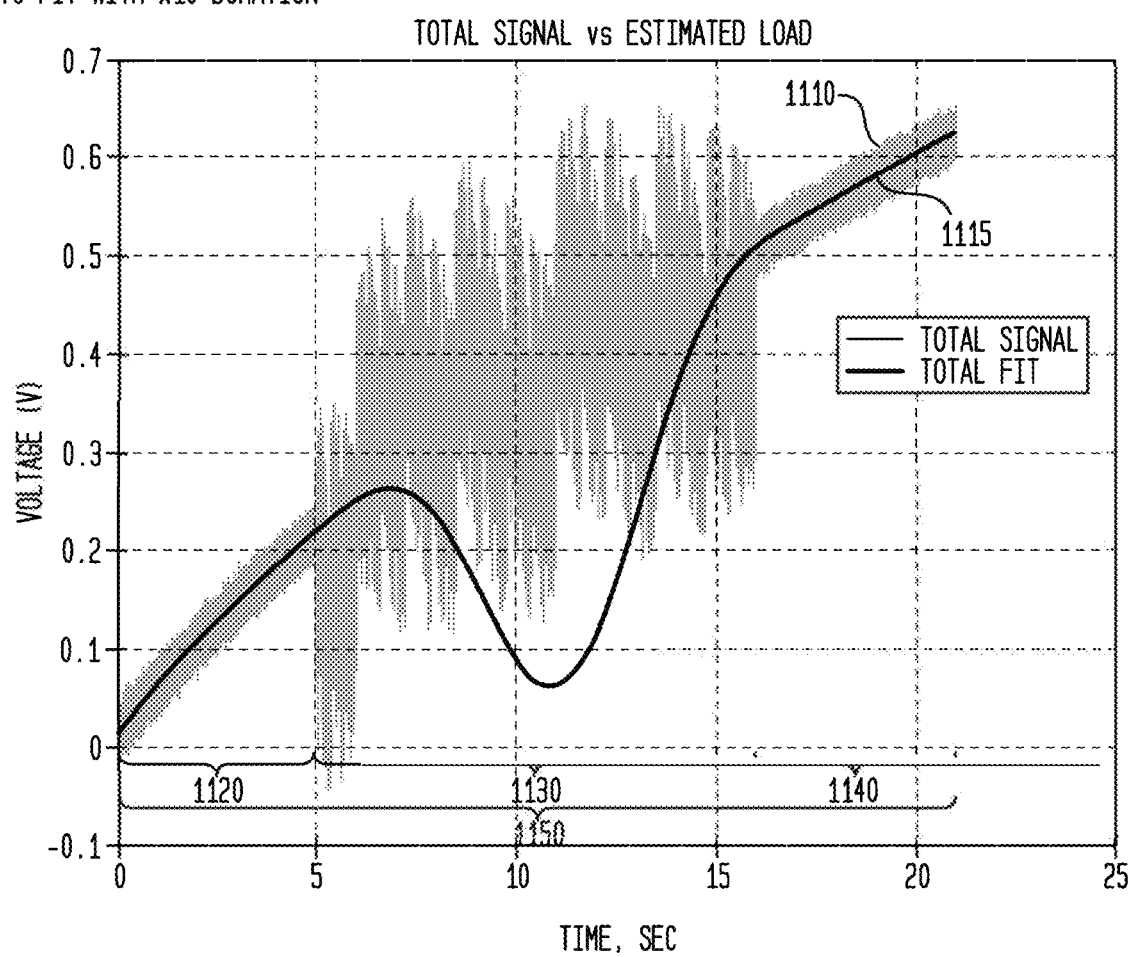
FIG. 18 illustrates voltage responses with an excitation signal applied to a battery during a charge period with a sum of sines fit to the samples from the out-of-band intervals using a fundamental frequency ten times the sampling time period of the response signal.
Figure 19:
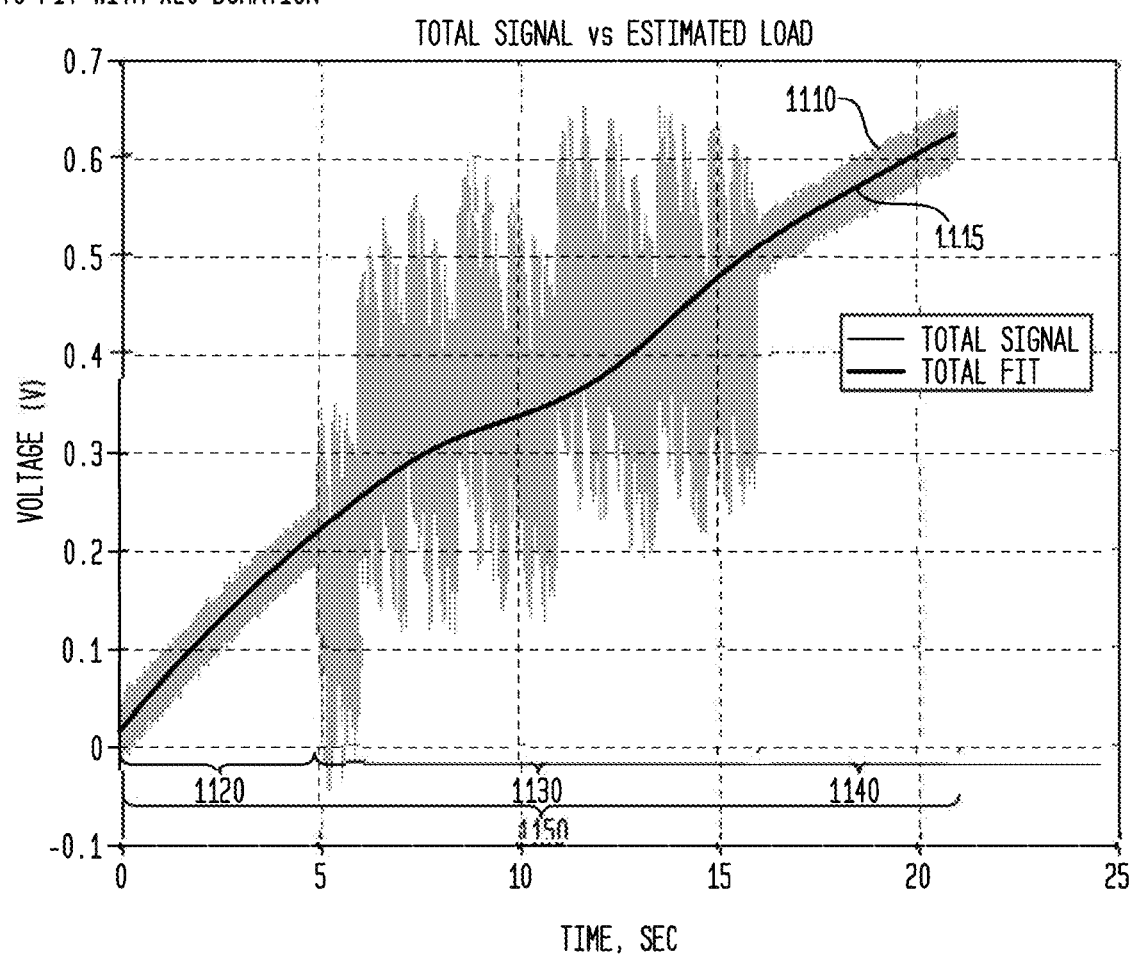
FIG. 19 illustrates voltage responses with an excitation signal applied to a battery during a charge period with a sum of sines fit to the samples from the out-of-band intervals using a fundamental frequency 20 times the sampling time period of the response signal.
Figure 20:
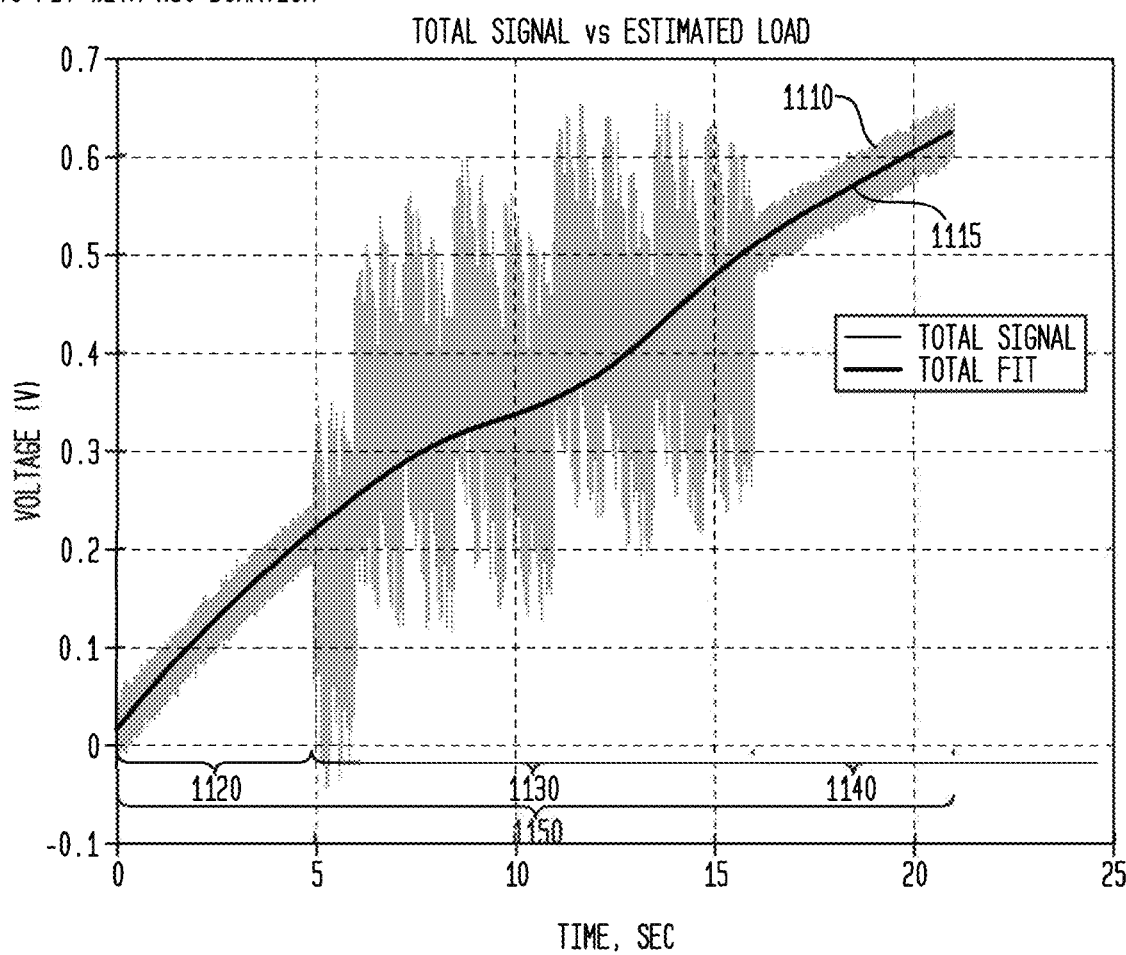
FIG. 20 illustrates voltage responses with an excitation signal applied to a battery during a charge period with a sum of sines fit to the samples from the out-of-band intervals using a fundamental frequency 80 times the sampling time period of the response signal.
Figure 21:
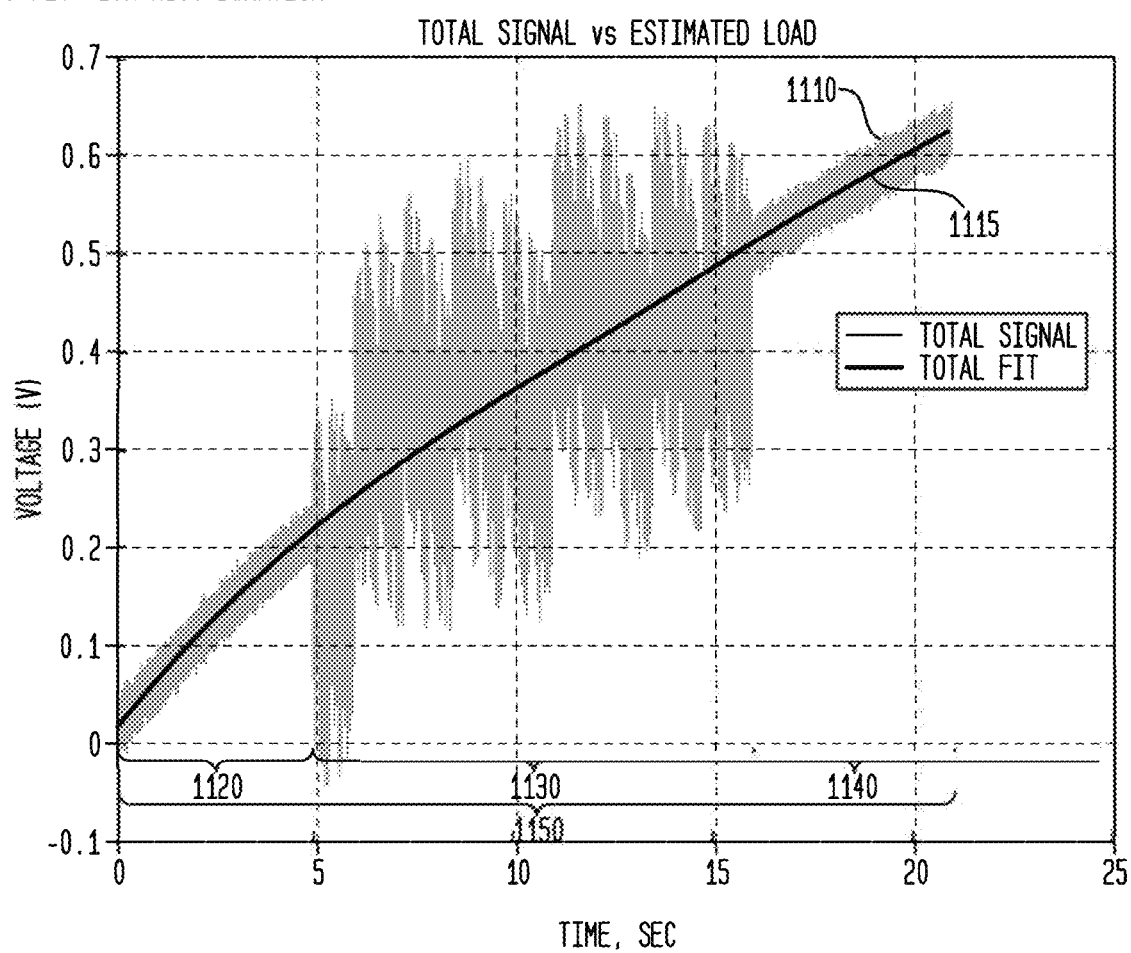
FIG. 21 illustrates voltage responses with an excitation signal applied to a battery during a charge period with a sum of sines fit to the samples from the out-of-band intervals using a fundamental frequency 800 times the sampling time period of the response signal.

Now, with primary FIGS. 18 through 21, depending on the application, the duration of the fundamental frequency can be adjusted to correct the fit of the sum of sines to the samples from the out-of-band intervals 1120 and 1140. In the example of FIG. 18, the duration of the period of the fundamental frequency was ten times the sampling time period 1150 of the response signal. In the example of FIG. 19, the duration of the period of the fundamental frequency was twenty times the sampling time period 1150 of the response signal. In the example of FIG. 20, the duration of the period of the fundamental frequency was 80 times the sampling time period of the response signal, and in the example of FIG. 21, the duration of the period of the fundamental frequency was 800 times the sampling time period of the response signal. As evidenced by the Figures, adjustment of the fundamental frequency to increase of the duration of the period of the fundamental frequency corrected the error in the computation of the estimate of the load response during the in-band interval with a direct fit.

Figure 22:
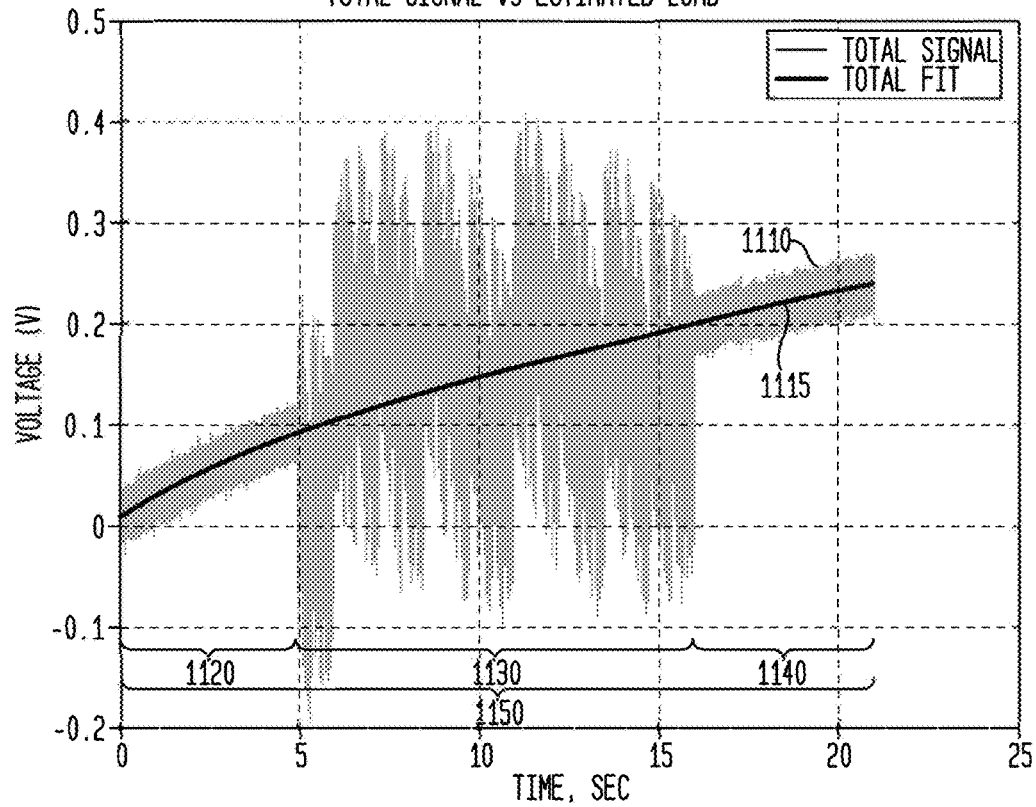
FIG. 22 illustrates voltage responses with an excitation signal applied to a battery during a charge period with a sum of sines fit to the samples of the out-of-band intervals.
Figure 23:
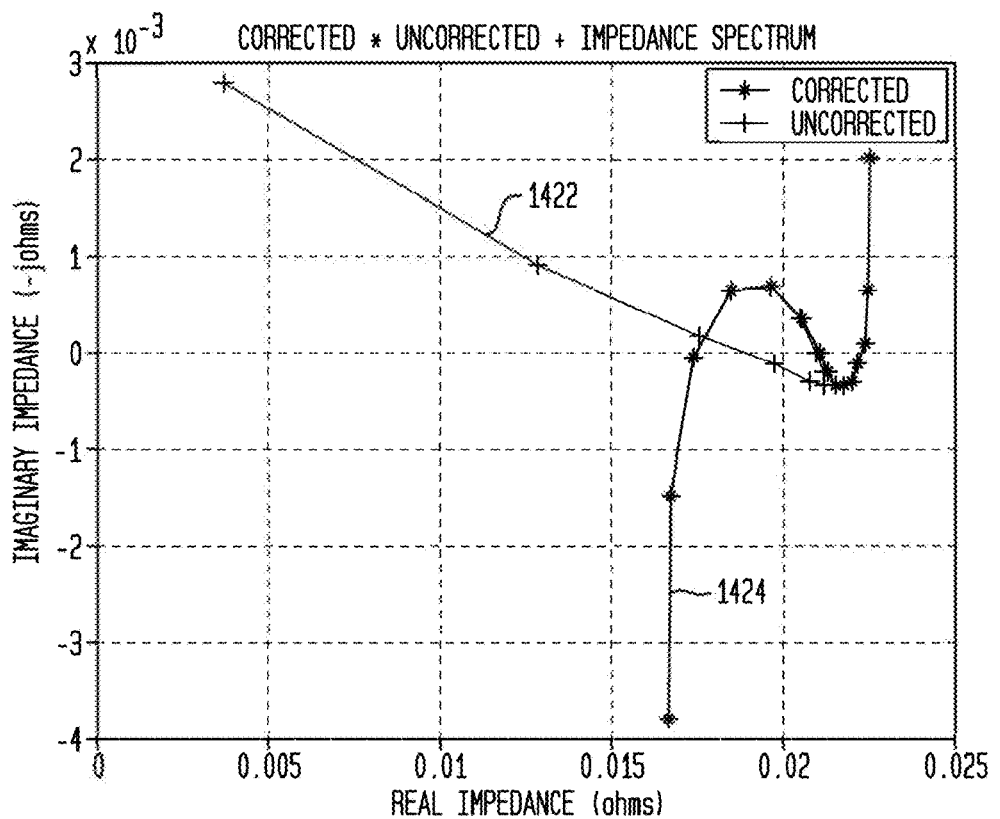
FIG. 23 depicts uncorrected and corrected impedance spectra Nyquist curves of an impedance measurement of the battery during the charge period illustrated in FIG. 22.
Figure 24:
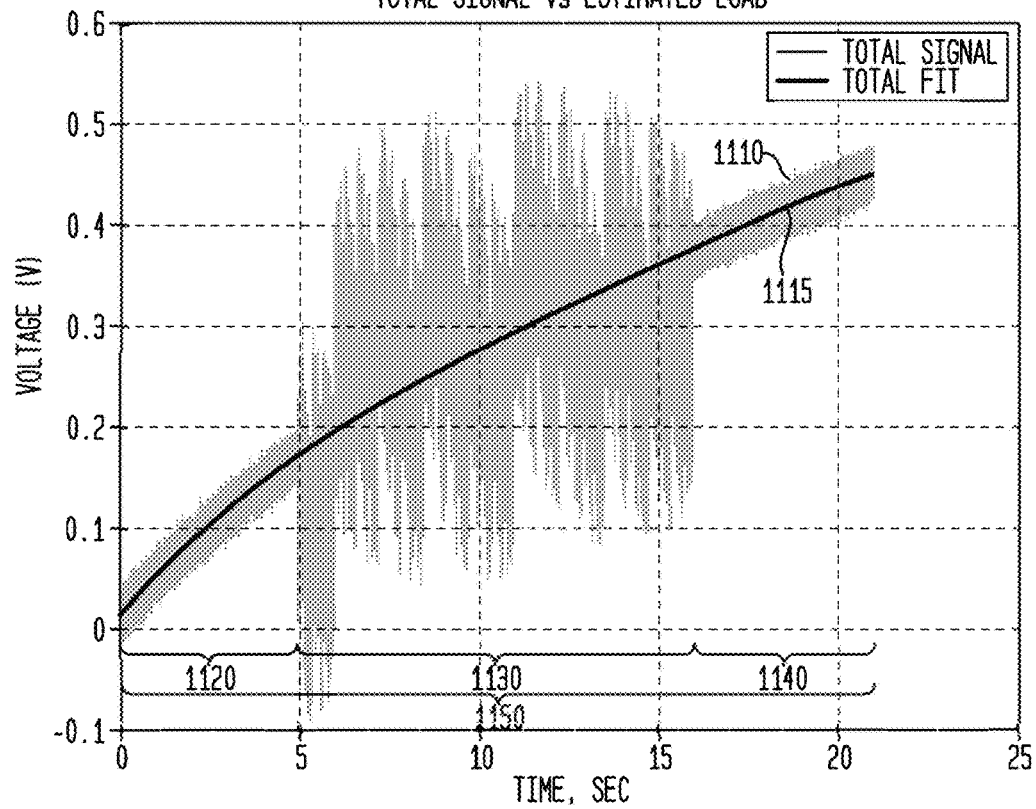
FIG. 24 illustrates voltage responses with an excitation signal applied to a battery during a charge period with a sum of sines fit to the samples of the out-of-band intervals.
Figure 25:
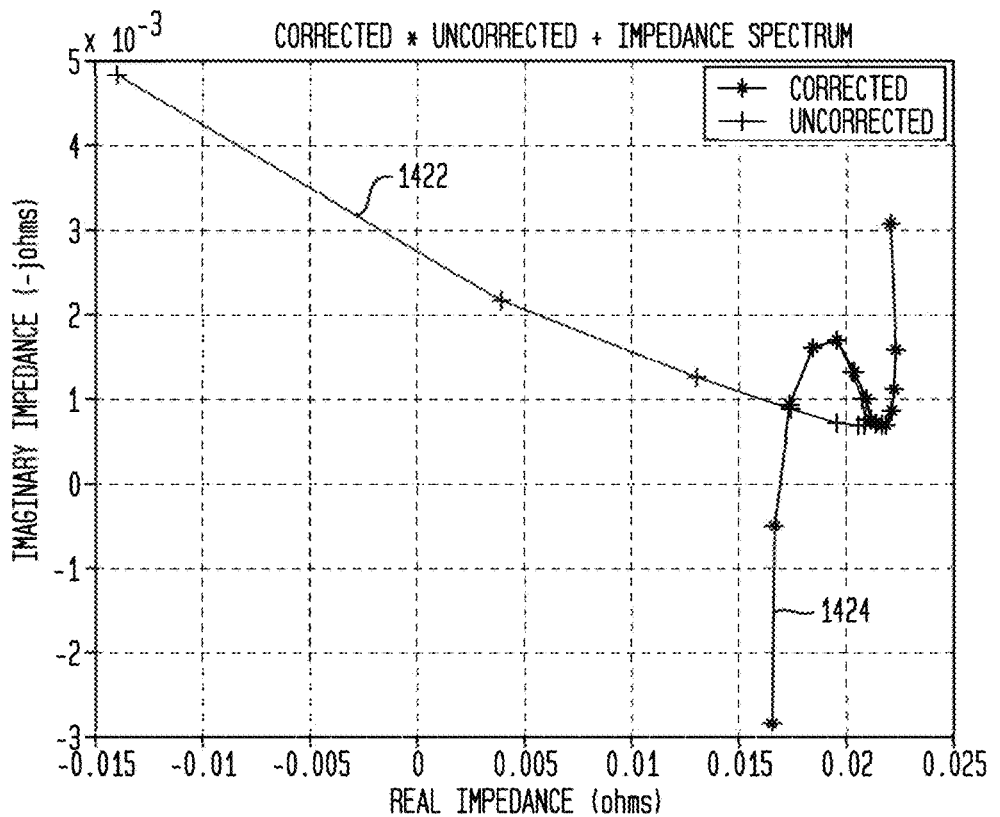
FIG. 25 depicts uncorrected and corrected impedance spectra Nyquist curves of an impedance measurement of the battery during the charge period illustrated in FIG. 24.
Figure 26:
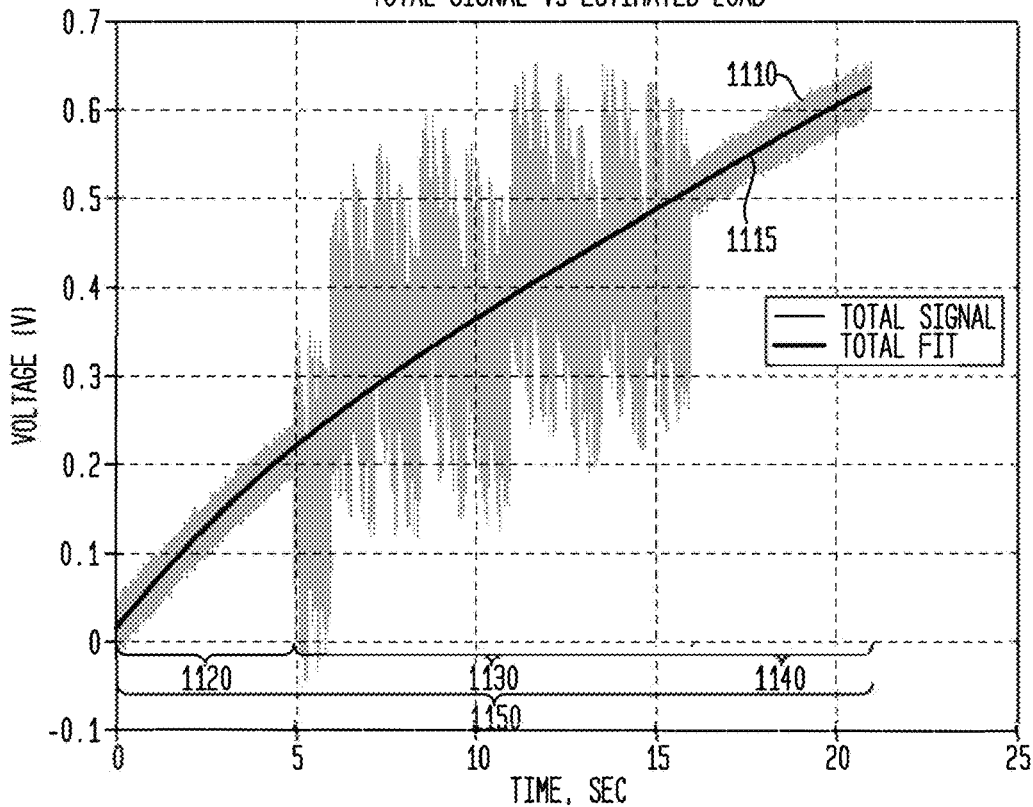
FIG. 26 illustrates voltage responses with an excitation signal applied to a battery during a charge period with a sum of sines fit to the samples of the out-of-band intervals.
Figure 27:
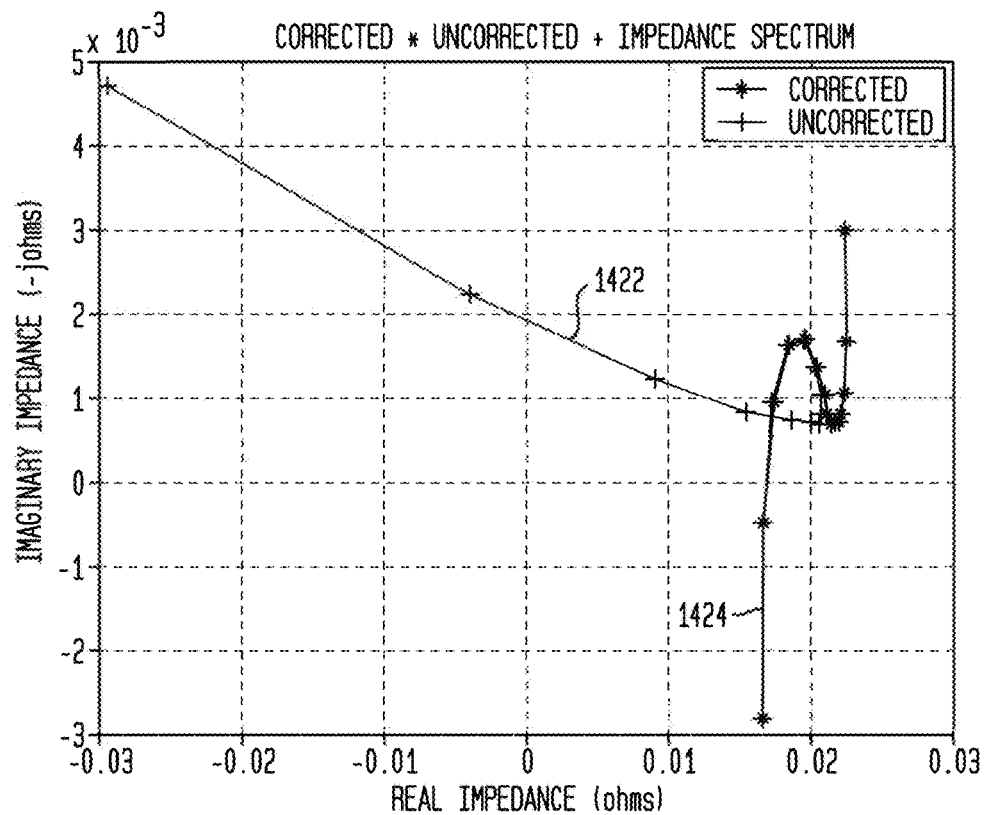
FIG. 27 depicts uncorrected and corrected impedance spectra Nyquist curves of an impedance measurement of the battery during the charge period illustrated in FIG. 26.

Now, with primary reference to FIGS. 22 through 27, which illustrate an embodiment comprising an impedance measurement of a device 280 under a charging load condition. FIGS. 22, 24 and 26 depict the response time record 1150 of the response of the device 280 under a charging condition 1A, 2A, and 3A, respectively. The response was processed as above described and FIGS. 23, 25, and 27 depict the corrected impedance measurement 1424 superimposed with the uncorrected impedance measurement 1422 for the device under test.

Figure 28:
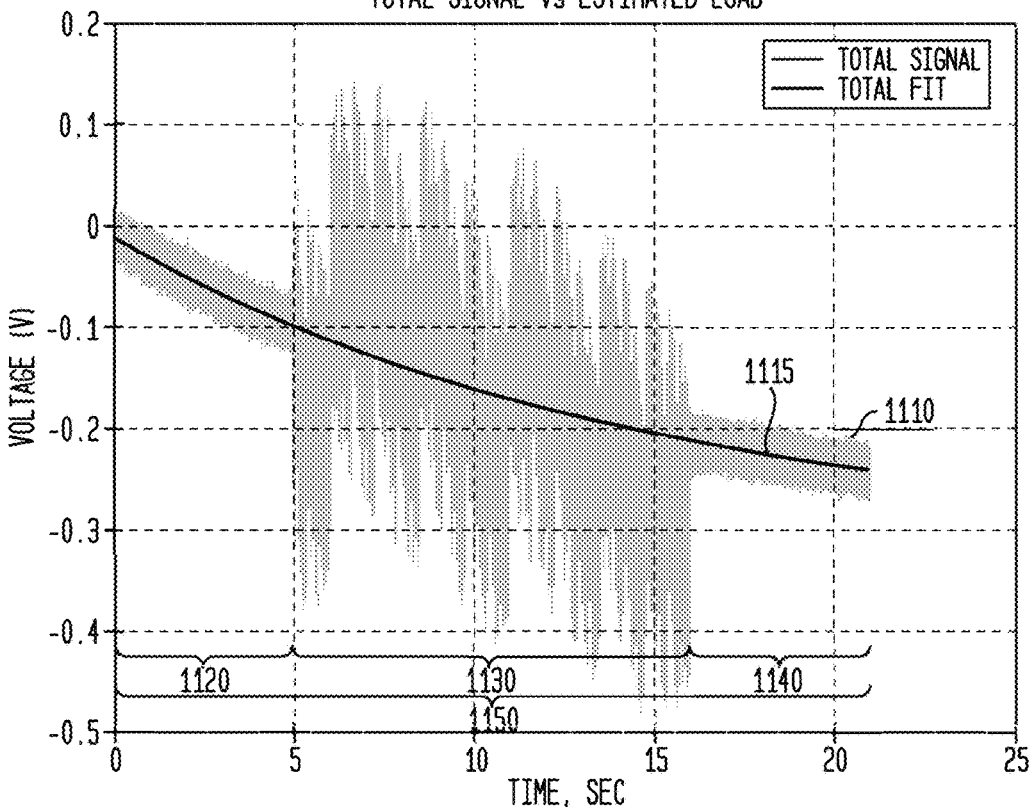
FIG. 28 illustrates voltage responses with an excitation signal applied to a battery during a discharge period with a sum of sines fit to the samples of the out-of-band intervals.
Figure 29:
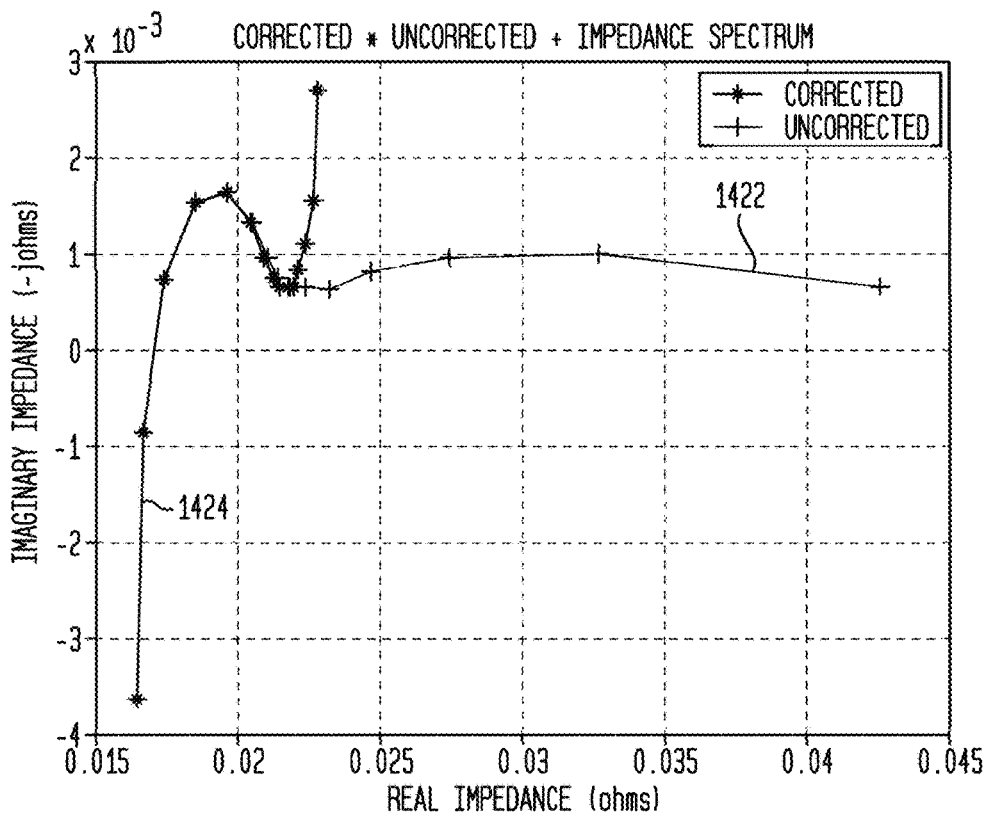
FIG. 29 depicts uncorrected and corrected impedance spectra Nyquist curves of an impedance measurement of the battery during the charge period illustrated in FIG. 28.
Figure 30:
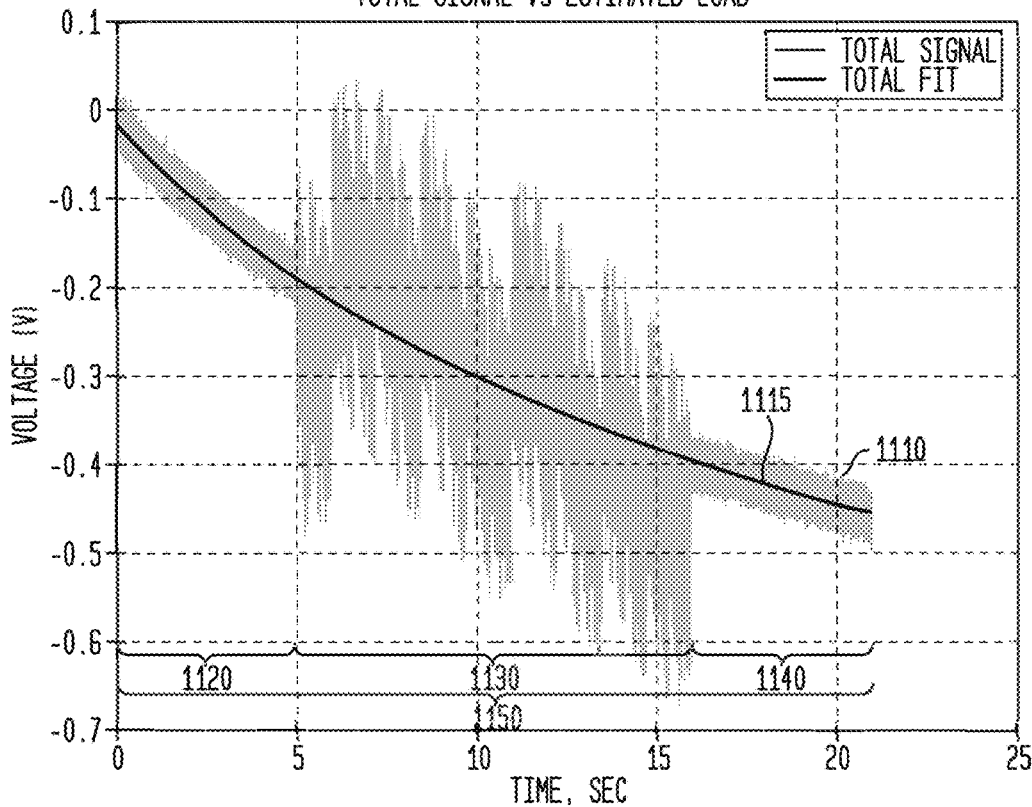
FIG. 30 illustrates voltage responses with an excitation signal applied to a battery during a discharge period with a sum of sines fit to the samples of the out-of-band intervals.
Figure 31:
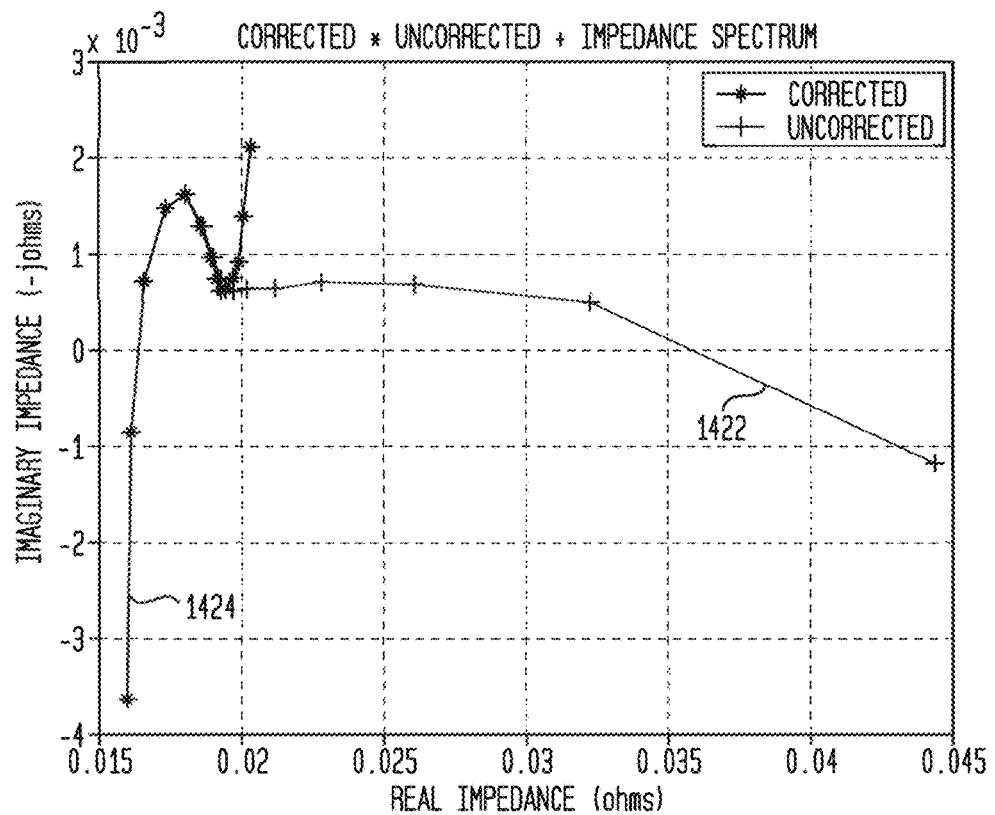
FIG. 31 depicts uncorrected and corrected impedance spectra Nyquist curves of an impedance measurement of the battery during the charge period illustrated in FIG. 30.
Figure 32:
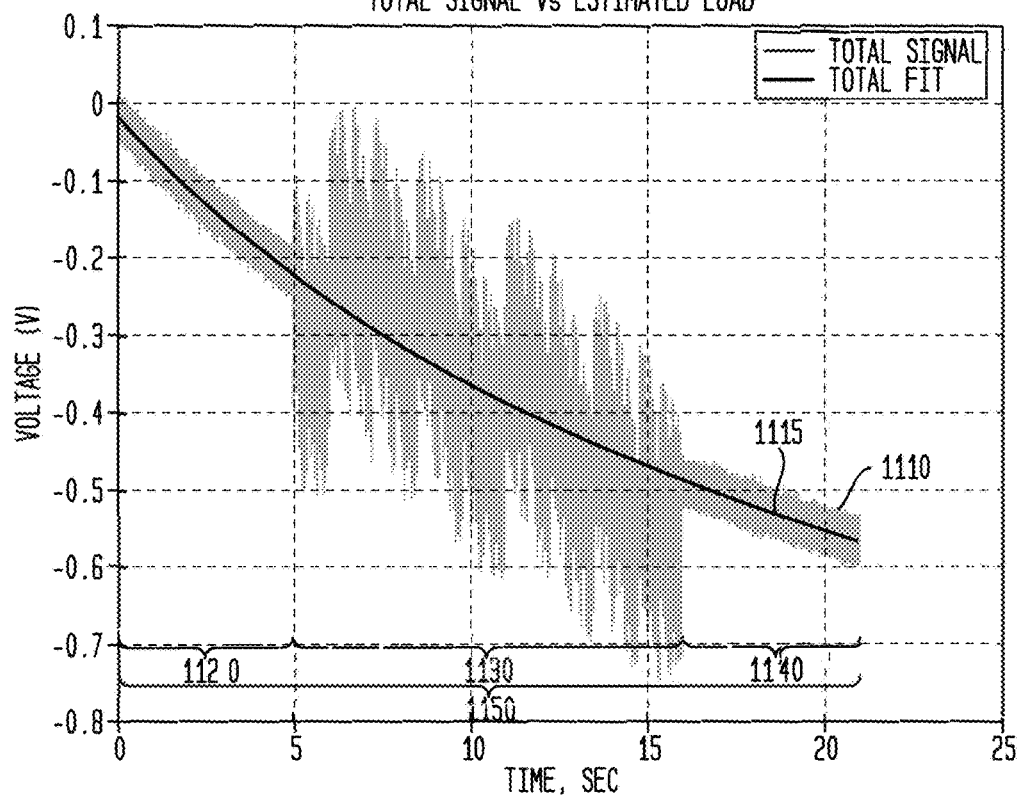
FIG. 32 illustrates voltage responses with an excitation signal applied to a battery during a discharge period with a sum of sines fit to the samples of the out-of-band intervals.
Figure 33:
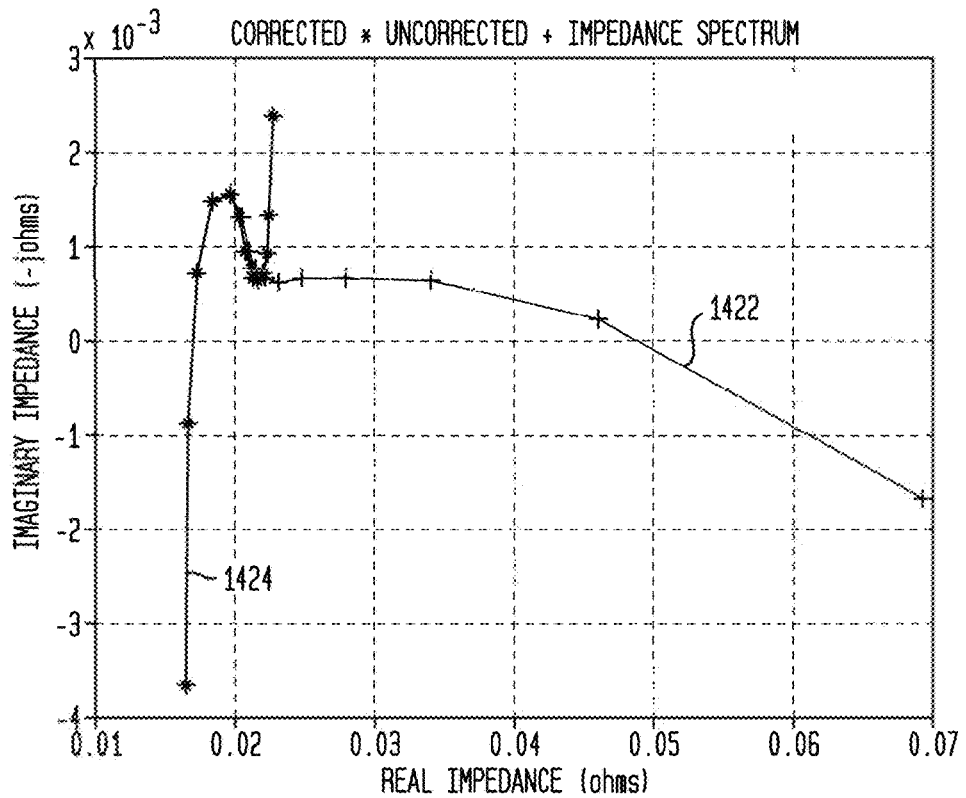
FIG. 33 depicts uncorrected and corrected impedance spectra Nyquist curves of an impedance measurement of the battery during the charge period illustrated in FIG. 32.

Now, with primary reference to FIGS. 28 through 33, which illustrate an embodiment comprising an impedance measurement of a device 280 under a discharging load condition. FIGS. 28, 30 and 32 depict the response time record 1150 of the response of the device 280 under a discharging condition 1A, 2A, and 3A, respectively. The response was processed as above described and FIGS. 29, 31, and 33 depict the corrected impedance measurement 1424 superimposed with the uncorrected impedance measurement 1422 for the device under test.

Figure 34:
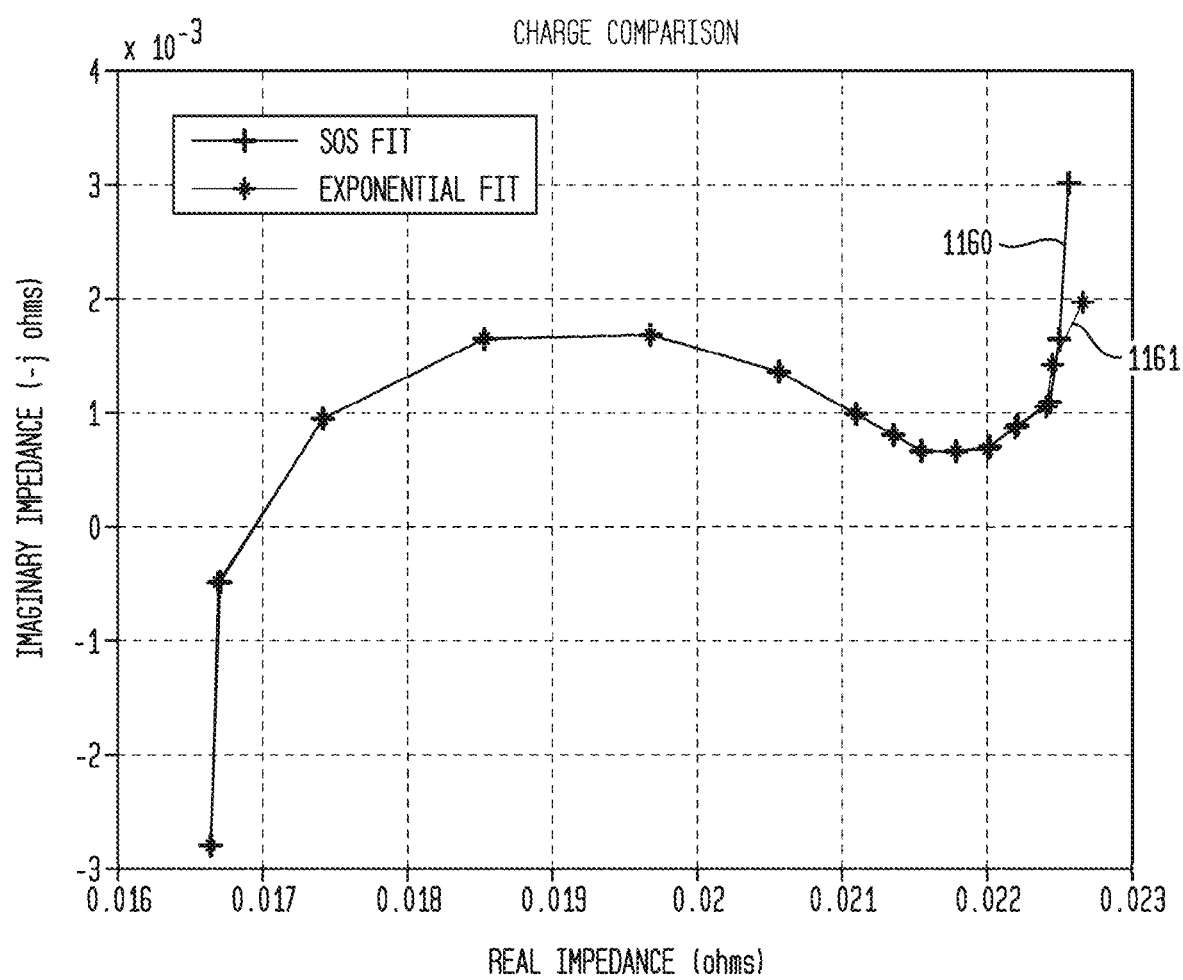
FIG. 34 depicts a comparison of impedance spectra Nyquist curves of an impedance measurement of the battery during the charge period illustrated in FIG. 22 using an SOS fit and an exponential fit.
Figure 35:
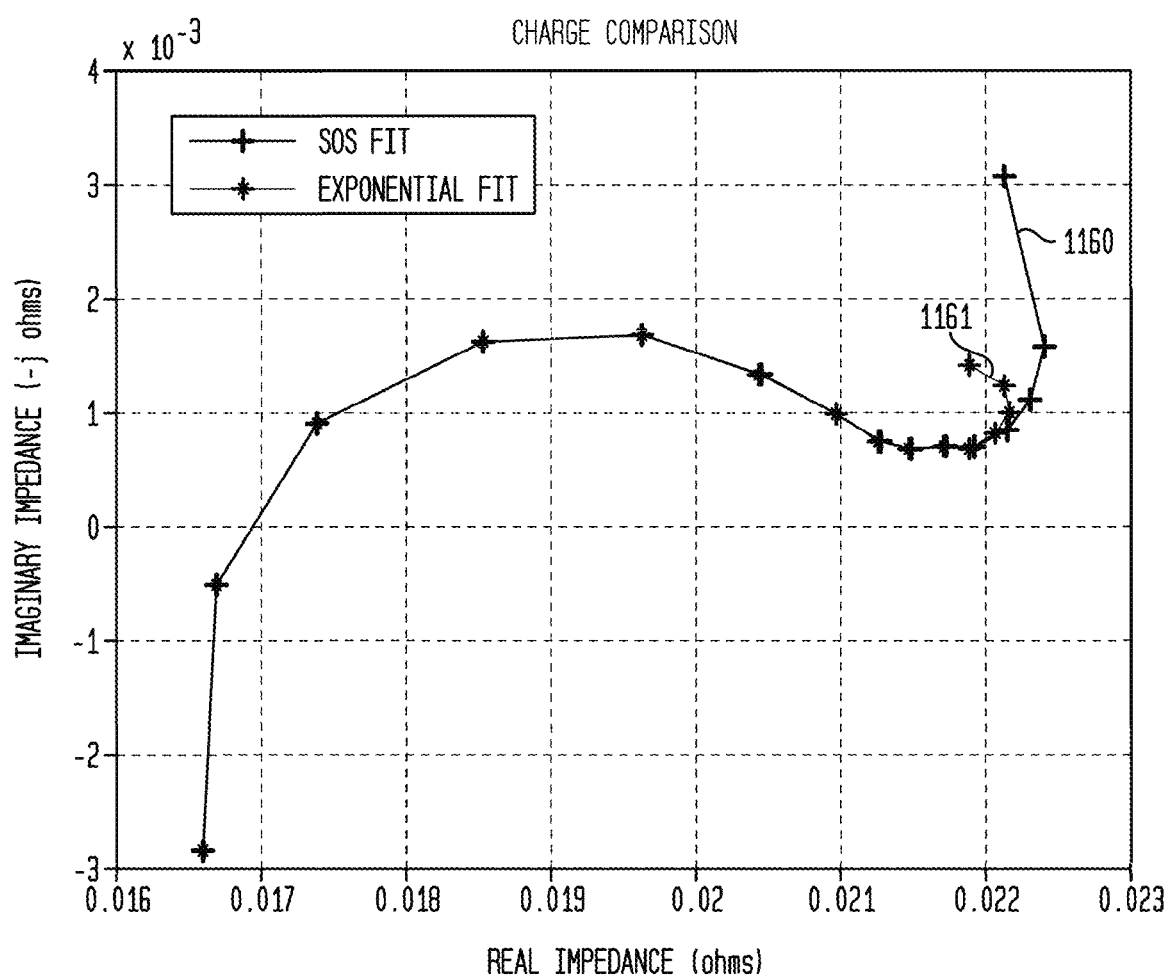
FIG. 35 depicts a comparison of impedance spectra Nyquist curves of an impedance measurement of the battery during the charge period illustrated in FIG. 24 using an SOS fit and an exponential fit.
Figure 36:
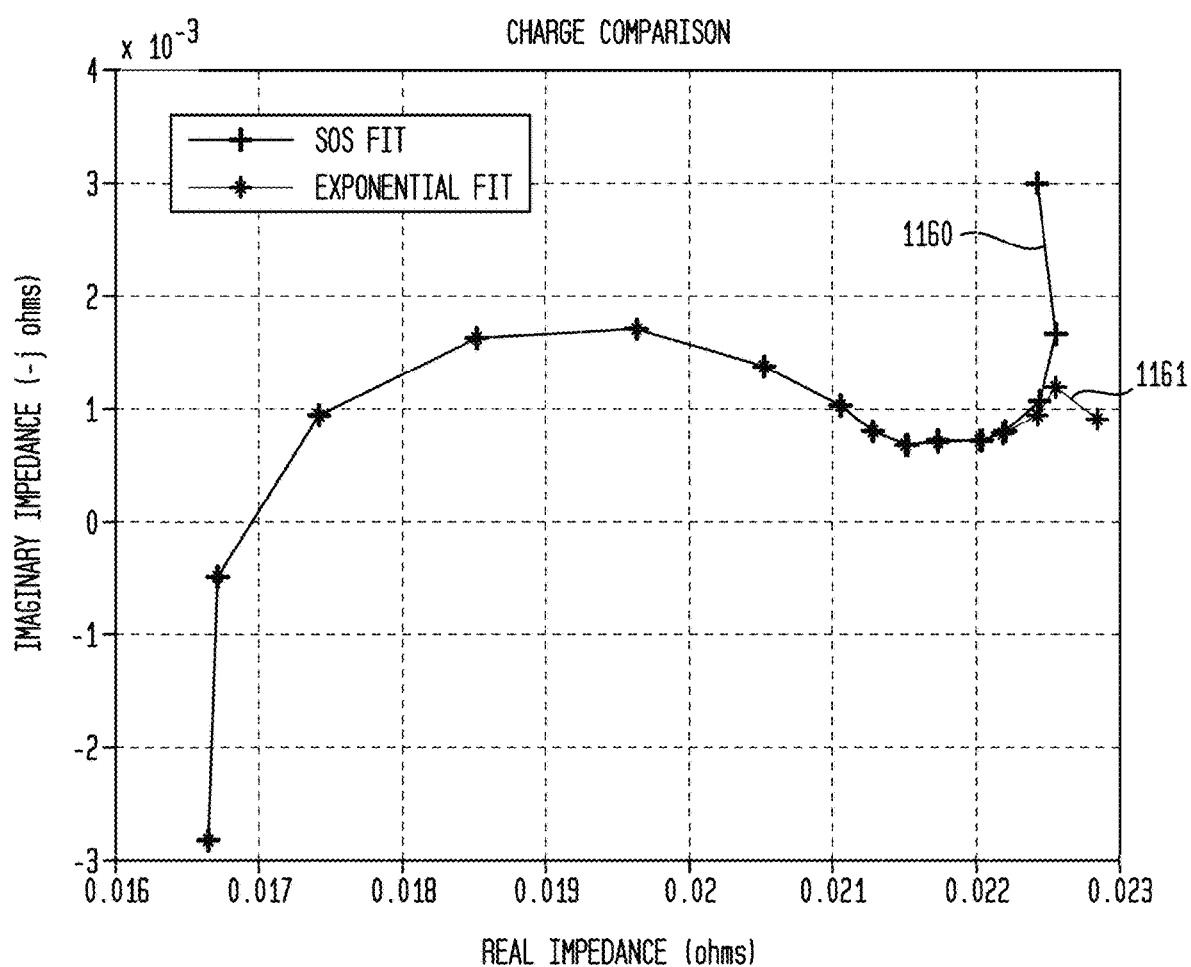
FIG. 36 depicts a comparison of impedance spectra Nyquist curves of an impedance measurement of the battery during the charge period illustrated in FIG. 26 using an SOS fit and an exponential fit.
Figure 37:
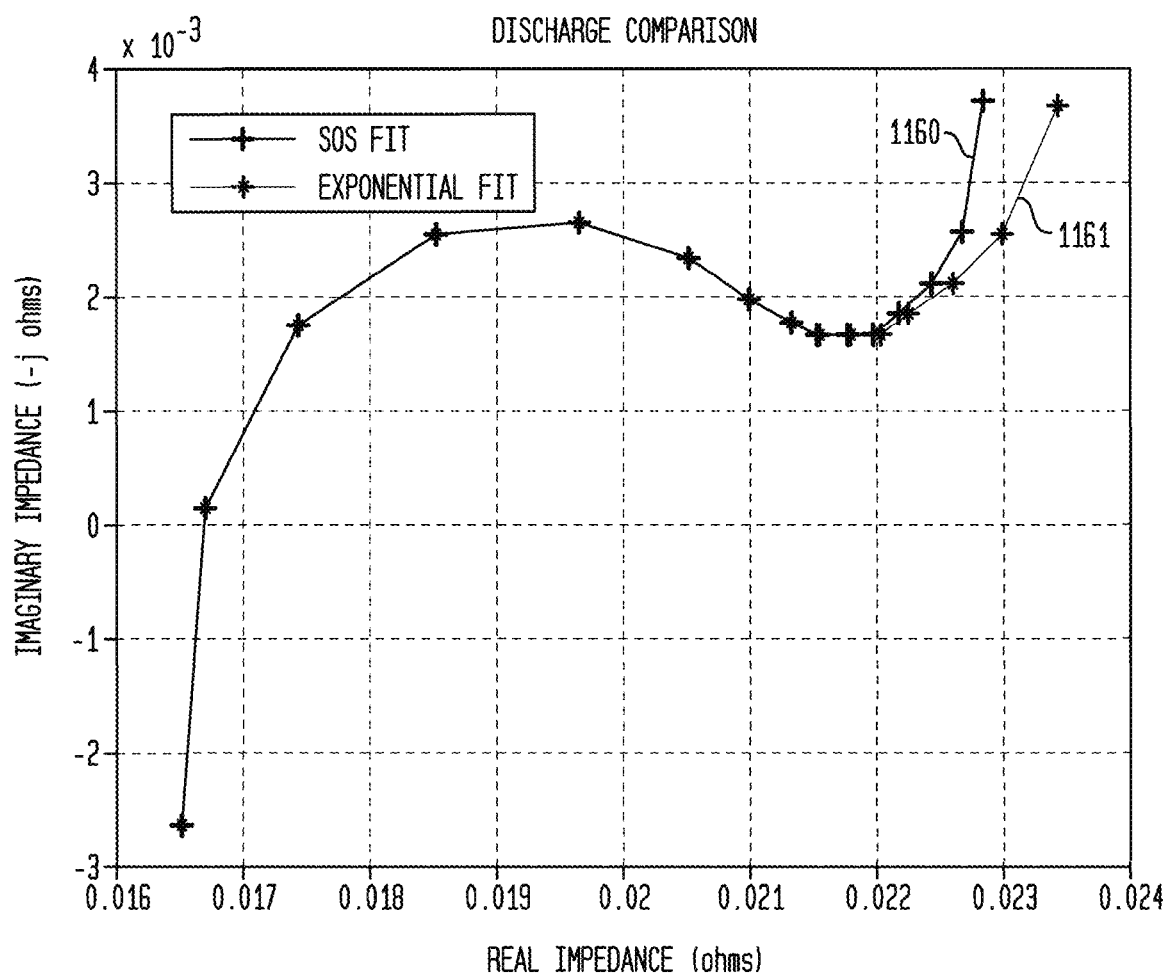
FIG. 37 depicts a comparison of impedance spectra Nyquist curves of an impedance measurement of the battery during the discharge period illustrated in FIG. 28 using an SOS fit and an exponential fit.
Figure 38:
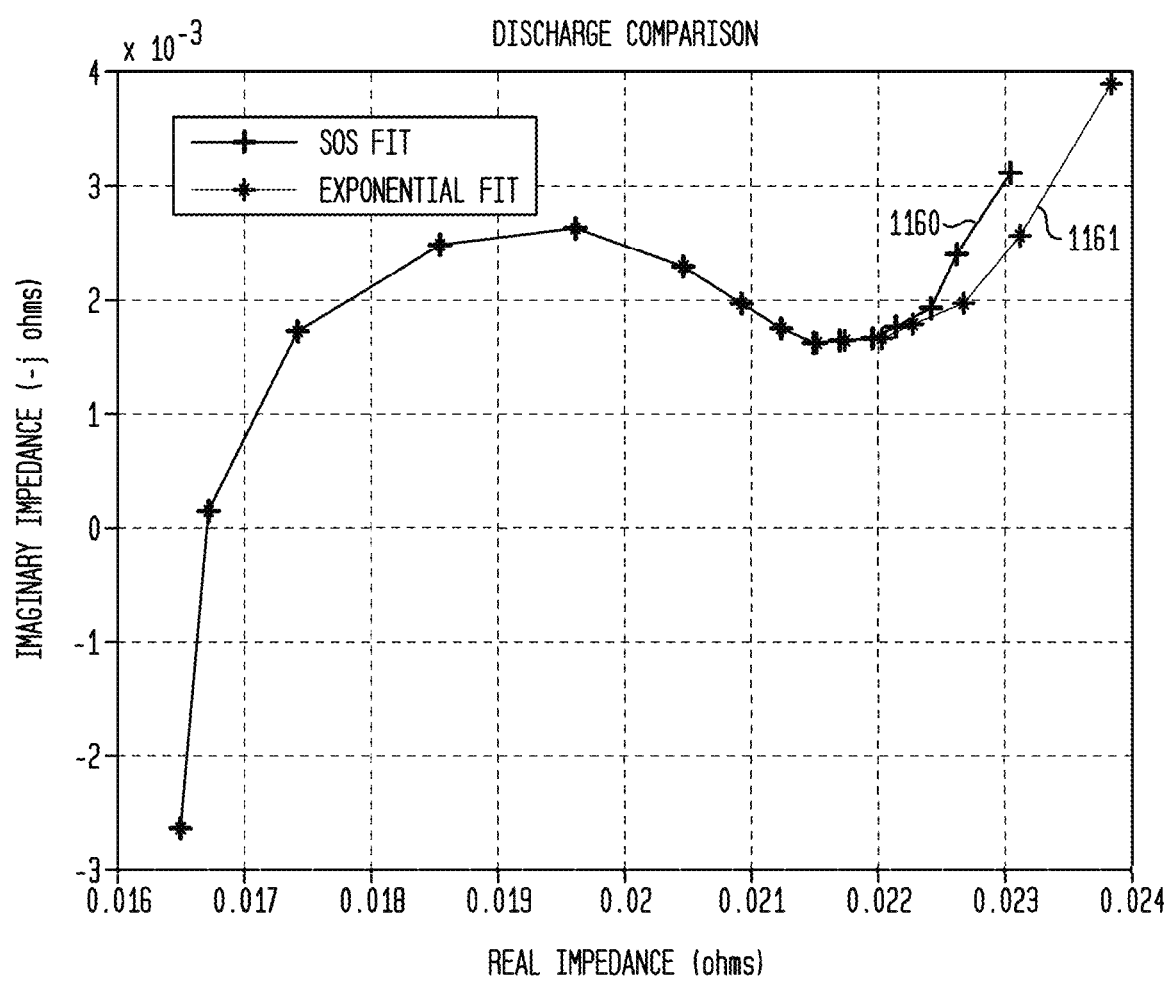
FIG. 38 depicts a comparison of impedance spectra Nyquist curves of an impedance measurement of the battery during the discharge period illustrated in FIG. 30 using an SOS fit and an exponential fit.
Figure 39:
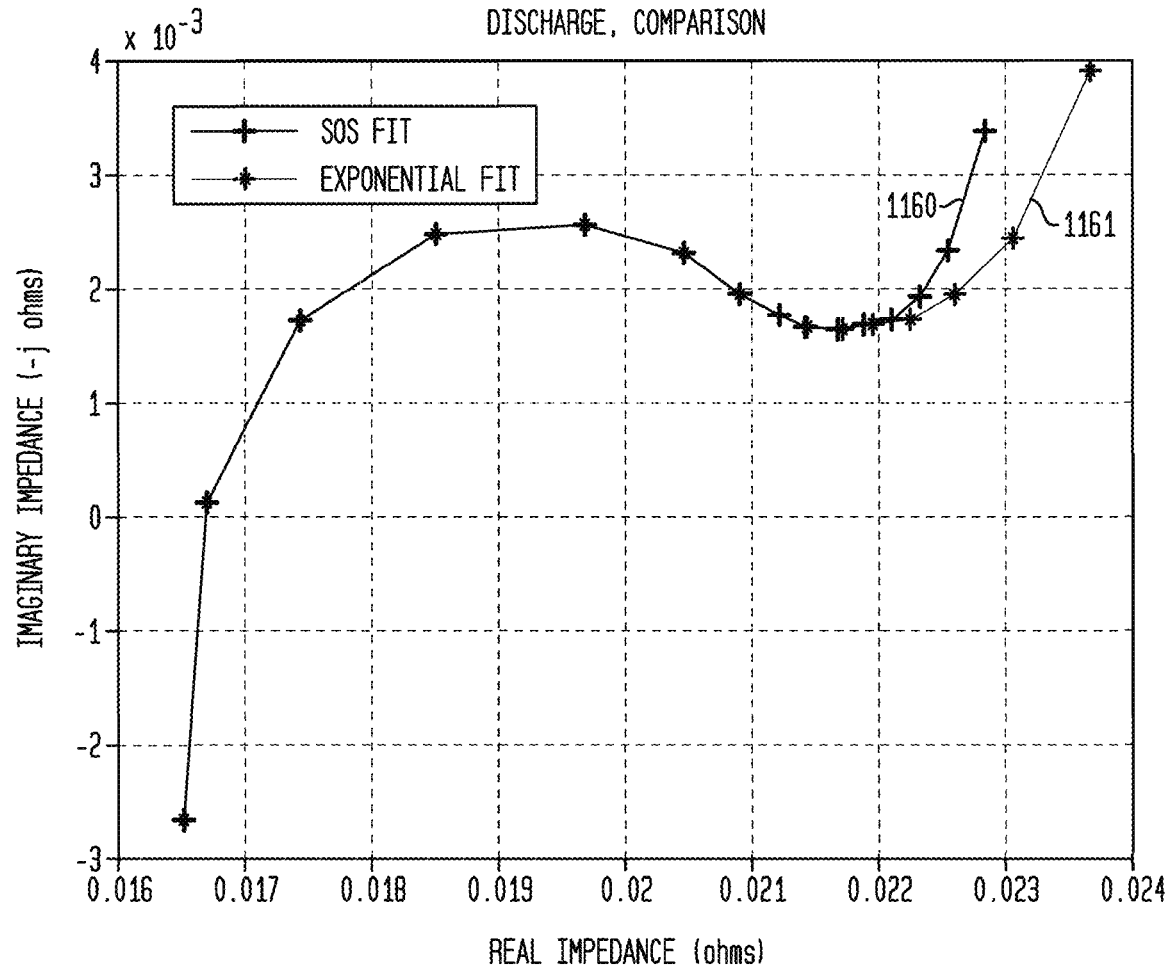
FIG. 39 depicts a comparison of impedance spectra Nyquist curves of an impedance measurement of the battery during the charge period illustrated in FIG. 32 using an SOS fit and an exponential fit.
Figure 40:
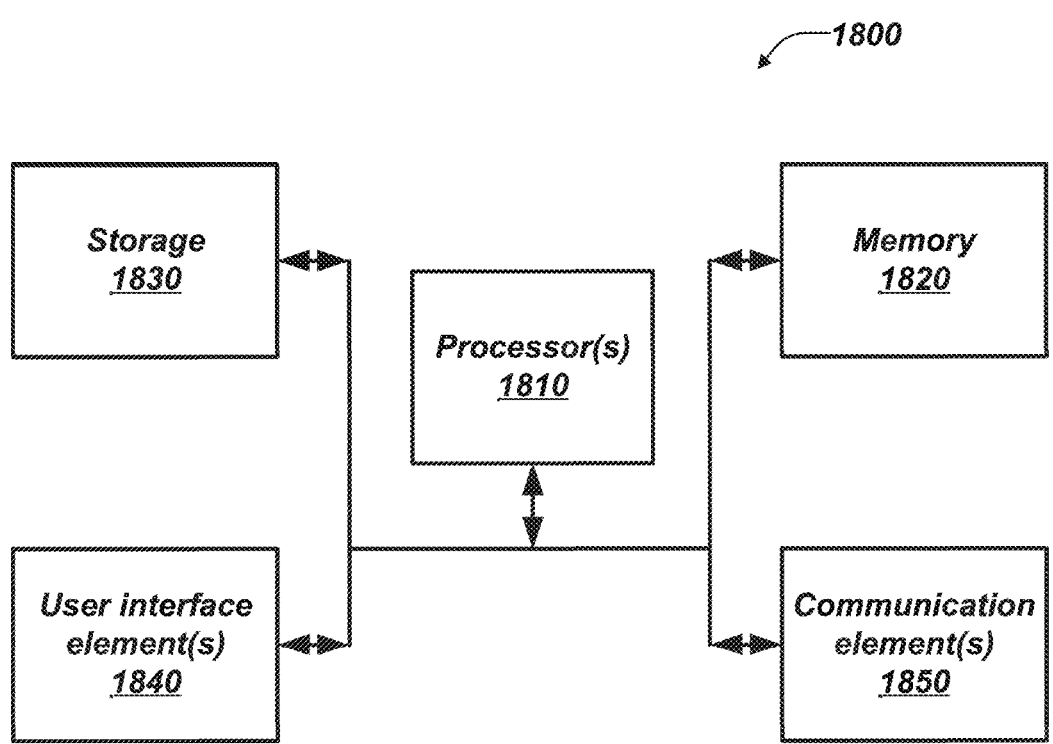
FIG. 40 is a simplified block diagram of a computing system.

Now, with primary reference to FIGS. 34 through 39, which illustrate the difference between the corrected response from the TCTC-based sinusoidal approach 1160 and the iterative error reduction based on exponential fits 1161. FIGS. 34, 35 and 36 show a comparison of the corrected response from the TCTC-based sinusoidal approach 1160 and the iterative error reduction based on exponential fits 1161 from the charging load condition depicted in FIGS. 22, 24 and 26, respectively. FIGS. 37, 38 and 39 show a comparison of the corrected response from the TCTC-based sinusoidal approach ("SOS Fit") 1160 and the iterative error reduction based on exponential fits 1161 ("Exponential Fit") from the discharging load condition depicted in FIGS. 28, 30, and 32 respectively. In all cases, the curve fits are virtually identical at the high and mid-frequency regions. While some deviation may occur at the lowest frequencies due to variations in fitting, these results demonstrate that the TCTC-based method can be effective in estimating the load response which can be subtracted from the from the response during the in-band interval 1130 to allow analysis and determination of an impedance of a device 3 under test.

FIG. 18 illustrates a computing system 1800 for practicing embodiments of the present disclosure. As non-limiting examples, the computing system 1800 may be a microcontroller embedded in a system, a user-type computer, a file server, a compute server, a notebook computer, a tablet, a handheld device, a mobile device, or other similar computer system for executing software. Computer, computing system, and server may be used interchangeably herein to indicate a system for practicing embodiments of the present disclosure. The computing system 1800 is configured for executing software programs containing computing instructions and includes one or more processors 1810, memory 1820, storage 1830, user interface elements 1840, and one or more communication elements 1850.

The one or more processors 1810 may be configured for executing a wide variety of operating systems and applications including computing instructions for carrying out embodiments of the present disclosure.

The memory 1820 may be used to hold computing instructions, data structures, and other information for performing a wide variety of tasks including performing embodiments of the present disclosure. By way of example, and not limitation, the memory 1820 may include Synchronous Random Access Memory (SRAM), Dynamic RAM (DRAM), Read-Only Memory (ROM), flash memory, and the like.

The memory 1820 may include other types of memory devices, including volatile storage devices or non-volatile storage devices, configured to store information. Examples of other types of memory 1820 include nano RAM or (NRAM), nanocrystal wire-based memory, silicon-oxide based sub-10 nanometer process memory, graphene memory, Silicon-Oxide-Nitride-Oxide-Silicon (SONOS), Resistive random-access memory (RRAM), programmable metallization cell (PMC), conductive-bridging RAM (CBRAM), magneto-resistive RAM (MRAM), phase change RAM (PCRAM), phase change memory, or other solid-state storage media.

The storage 1830 may be used for storing relatively large amounts of non-volatile information for use in the computing system 1800 and may be configured as one or more storage devices. By way of example, and not limitation, these storage devices may include computer-readable media (CRM). This CRM may include, but is not limited to, magnetic and optical storage devices such as disk drives, magnetic tapes, optical storage drives such as CDs (compact disks), DVDs (digital versatile discs or digital video discs), and other equivalent storage devices.

Information related to the computing system 1800 may be presented to, and received from, a user with one or more user interface elements 1840. As non-limiting examples, the user interface elements 1840 may include elements such as displays, keyboards, mice, joysticks, haptic devices, microphones, speakers, cameras, and touchscreens. A display on the computing system may be configured to present a graphical user interface (GUI) with information about the embodiments of the present disclosure.

The communication elements 1850 may be configured for communicating with other devices or communication networks. As non-limiting examples, the communication elements 1850 may include elements for communicating on wired and wireless communication media, such as for example, serial ports, parallel ports, Ethernet connections, universal serial bus (USB) connections IEEE 1394 ("firewire") connections, lightning connections, thunderbolt connections, Bluetooth wireless connections, 802.1 a/b/g/n type wireless connections, cellular phone connections, TCP/IP, FTP, HTTP, and other suitable communication interfaces and protocols.

Software processes illustrated herein are intended to illustrate representative processes that may be performed by the systems illustrated herein. Unless specified otherwise, the order in which the process acts are described is not intended to be construed as a limitation, and acts described as occurring sequentially may occur in a different sequence, or in one or more parallel process streams. It will be appreciated by those of ordinary skill in the art that many steps and processes may occur in addition to those outlined in flow charts. Furthermore, the processes may be implemented in any suitable hardware, software, firmware, or combinations thereof.

By way of non-limiting example, computing instructions for performing the processes may be stored on the storage 1840, transferred to the memory 1820 for execution, and executed by the processors 1810. The processors 1810, when executing computing instructions configured for performing the processes, constitutes structure for performing the processes and can be considered a special-purpose computer when so configured. In addition, some or all portions of the processes may be performed by hardware specifically configured for carrying out the processes.

Many of the functional units described in this specification may be labeled as modules, threads, or other segregations of programming code, in order to more particularly emphasize their implementation independence. Modules may be at least partially implemented in hardware, in one form or another. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented using software, stored on a physical storage device 1830 (e.g., a computer readable storage medium), in memory 1820, or a combination thereof for execution by various types of processors.

An identified module of executable code may, for instance, comprise one or more physical or logical blocks of computer instructions, which may, for instance, be organized as a thread, object, procedure, or function. Nevertheless, the executables of an identified module need not be physically located together but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several storage devices 1830 or memory 1820 devices. Similarly, operational data may be identified and illustrated herein within modules and may be embodied in any suitable form and organized within any suitable type of data structure. The operational data may be collected as a single data set or may be distributed over different locations including over different storage devices, and may exist, at least partially, merely as electronic signals on a system or network. Where a module or portions of a module are implemented in software, the software portions are stored on one or more physical devices, which are referred to herein as computer readable media.

In some embodiments, the software portions are stored in a non-transitory state such that the software portions, or representations thereof, persist in the same physical location for a period of time. Additionally, in some embodiments, the software portions are stored on one or more non-transitory storage devices, which include hardware elements capable of storing non-transitory states and/or signals representative of the software portions, even though other portions of the non-transitory storage devices may be capable of altering and/or transmitting the signals. One example of a non-transitory storage device includes a read-only memory (ROM) that can store signals and/or states representative of the software portions for a period of time. However, the ability to store the signals and/or states is not diminished by further functionality of transmitting signals that are the same as or representative of the stored signals and/or states. For example, a processor may access the ROM to obtain signals that are representative of the stored signals and/or states in order to execute the corresponding software instructions.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed by the disclosure.

What is claimed is:

1. A method of measuring impedance using an impedance measurement device, comprising:
    exciting a device under a load condition with a multi-spectral excitation signal having an excitation time period;
    sampling a response of said device over a sample time period including an in-band interval during said excitation time period disposed between out-of-band intervals outside of the in-band interval;
    estimating a load response of said device to said load condition during said in-band interval by analyzing said response included in said out-of-band intervals using a sum of sines analysis using a fundamental frequency including a period having a duration greater than said response including said in-band and said out-of-band intervals;
    subtracting said load response during said in-band interval from said response during said in-band interval;
    analyzing said response having said load response subtracted from said response using a sum of sines analysis; and
    generating an impedance measurement of said device.

2. The method of claim 1, wherein said device comprises a battery.

3. The method of claim 2, wherein sampling said response of said battery comprises sampling said response of said battery under a charging load condition.

4. The method of claim 2, wherein sampling said response of said battery comprises sampling said response of said battery under a discharging load condition.

5. The method of claim 1, wherein exciting said device comprises applying a current signal, and wherein sampling said response of said device comprises sampling a voltage response.

6. The method of claim 1, wherein exciting said device comprises applying a voltage signal, and wherein sampling said response of said device comprises sampling a current response.

7. The method of claim 1, wherein said out-of-band intervals comprise a pre-band interval immediately before said excitation time period, and a post-band interval immediately after the excitation time period.

8. The method of claim 1, wherein said excitation time period includes two excitation time periods and said out-of-band intervals further includes an interval between said two excitation time periods.

9. The method of claim 1, wherein estimating the load response comprises:
    fitting said sum of sines analysis to samples of said response from said out-of-band intervals using said fundamental frequency including a period having a duration greater than said response including said in-band and said out-of-band intervals.

10. The method of claim 9, further comprising adjusting fundamental frequency to correct fit of said sum of sines analysis to said samples from said out-of-band intervals.

11. The method of claim 10, wherein adjusting said fundamental frequency comprises decreasing said fundamental frequency to correct said fit of said sum of sines analysis to said samples from said out-of-band intervals.

12. The method of claim 11, wherein decreasing said fundamental frequency to correct said fit comprises a multiple of a duration of said out-of-band interval immediately before said excitation time period, said multiple of said duration occurring in a range of about 4 times and about 1000 times.

13. The method of claim 11, further comprising using said fit corrected by adjustment of said fundamental frequency for analyzing said sum of sines analysis at time points corresponding to said samples from said in-band interval.

14. The method of claim 9, further comprising including one or more integer harmonic frequencies of said fundamental frequency.

15. The method of claim 14, wherein said one or more integer harmonic frequencies occurs in range of between about 1 and about 100 integer harmonic frequencies.

16. The method of claim 14, further comprising using said fit corrected by including said one or more integer harmonic frequencies for analyzing said sum of sines analysis at time points corresponding to said samples from said in-band interval.

17. The method of claim 9, wherein said fitting comprises:
    discarding said in-band interval; and
    using time cross talk compensation analysis to fit said response time record during said in-band interval and out-of-band intervals.

18. The method of claim 17, wherein said estimating said impedance of said device comprises analyzing said response using an impedance spectrum algorithm.

19. The method of claim 18, wherein said impedance spectrum algorithm includes one or more of TCTC, HOST, HSCD, FST, and GFST.

* * * * *